US012598747B2

(12) United States Patent
Chae et al.

(10) Patent No.: US 12,598,747 B2
(45) Date of Patent: Apr. 7, 2026

(54) FABRICATING THREE-DIMENSIONAL SEMICONDUCTOR STRUCTURES

(71) Applicant: Tokyo Electron Limited, Tokyo (JP)

(72) Inventors: Soo Doo Chae, Albany, NY (US); Lior Huli, Albany, NY (US); Steven Gueci, Albany, NY (US); Hojin Kim, Albany, NY (US); Henan Zhang, Albany, NY (US); Na Young Bae, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 804 days.

(21) Appl. No.: 17/978,674

(22) Filed: Nov. 1, 2022

(65) Prior Publication Data

US 2024/0147719 A1     May 2, 2024

(51) Int. Cl.
*H10B 43/27*     (2023.01)
*G03F 7/20*     (2006.01)
*G03F 7/32*     (2006.01)
*G03F 7/38*     (2006.01)

(52) U.S. Cl.
CPC .............. *H10B 43/27* (2023.02); *G03F 7/20* (2013.01); *G03F 7/32* (2013.01); *G03F 7/38* (2013.01)

(58) Field of Classification Search
CPC ... H10B 43/27; G03F 7/20; G03F 7/32; G03F 7/38
See application file for complete search history.

(56) References Cited

U.S. PATENT DOCUMENTS

2016/0377982 A1     12/2016   deVilliers
2017/0077138 A1*     3/2017   Hong .................... H10B 43/50

2020/0341377 A1     10/2020   Ogihara et al.
2022/0066317 A1      3/2022   Fulford et al.
2022/0115399 A1      4/2022   Chae et al.

FOREIGN PATENT DOCUMENTS

JP       2019-032349     *   2/2019

OTHER PUBLICATIONS

English translation of JP Publication 2019-032349, Feb. 2019.*
PCT International Search Report and Written Opinion of the International Searching Authority, PCT/US2023/034844, dated Jan. 31, 2024, 11 pages.

* cited by examiner

*Primary Examiner* — Brittany L Raymond
(74) *Attorney, Agent, or Firm* — Slater Matsil, LLP

(57)     ABSTRACT

In certain embodiments, a method includes forming, on a substrate by spin-on deposition, a layer stack of alternating layers of first and second carbon-containing materials. The layers of the first carbon-containing material include an agent-generating ingredient for generating a solubility-changing agent in response to an activation trigger. The method includes executing the activation trigger in response to which the solubility-changing agent is generated from the agent-generating ingredient in the layers of the first carbon-containing material and modifies the layers of the first carbon-containing material to be soluble in a developer. The method includes etching first openings through the layer stack, filling the first openings with a third material, etching second openings through the layer stack, removing the layers of the first carbon-containing material from the layer stack by exposing those to the developer, and replacing the layers of the first carbon-containing material with a fourth material.

20 Claims, 27 Drawing Sheets

Cross-Sectional View

Plan View

Plan View

Cross-Sectional View

Plan View

Cross-Sectional View

Plan View

Cross-Sectional View

Plan View

Cross-Sectional View

Plan View

Cross-Sectional View

Plan View

Cross-Sectional View

100

122

136

138

118

136

102

116a

122

A'

A

Plan View

106

136

138

118

136

102

116a

108c

104

Cross-Sectional View

FIGURE 1M

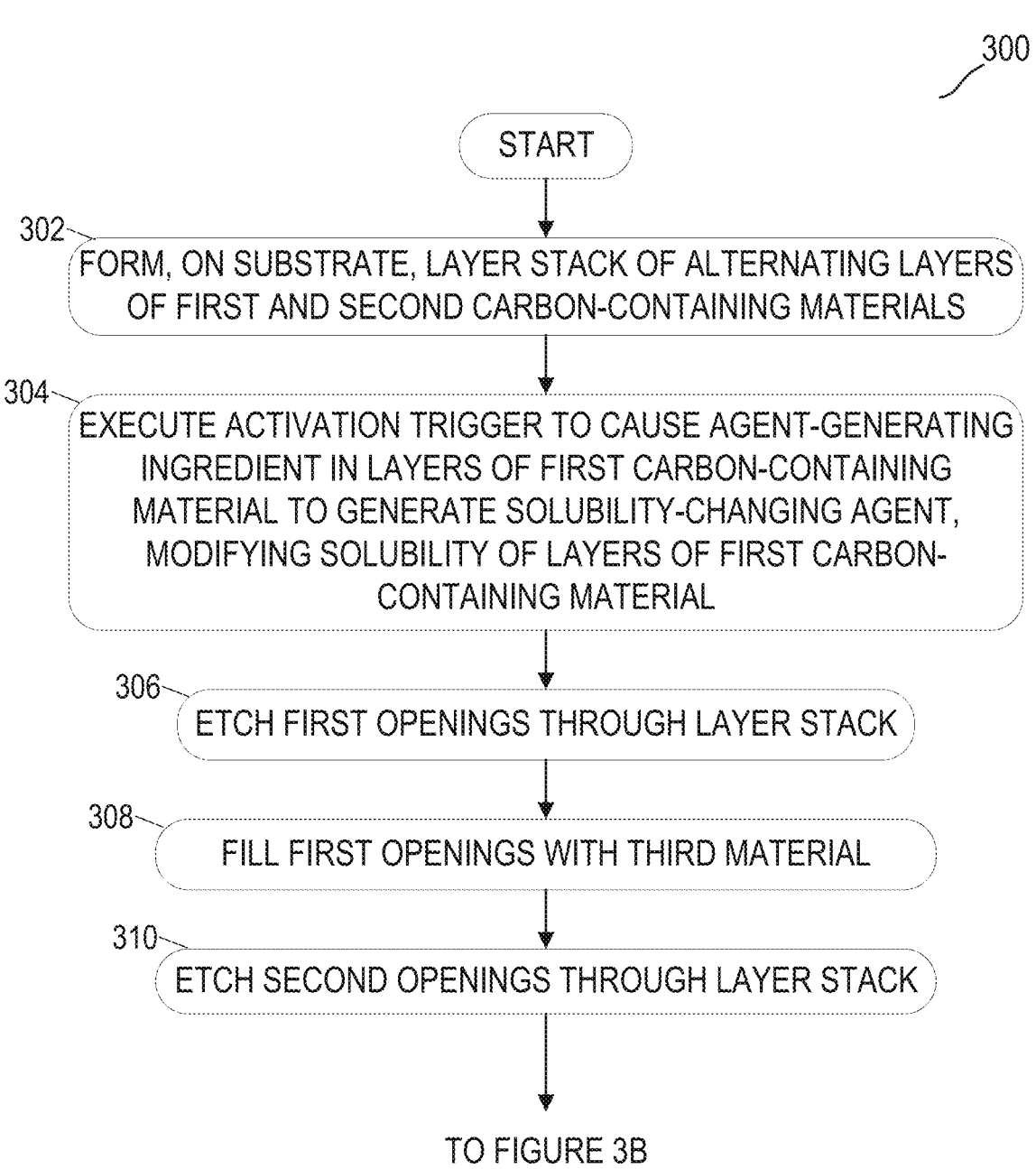

300

START

302 — FORM, ON SUBSTRATE, LAYER STACK OF ALTERNATING LAYERS OF FIRST AND SECOND CARBON-CONTAINING MATERIALS

304 — EXECUTE ACTIVATION TRIGGER TO CAUSE AGENT-GENERATING INGREDIENT IN LAYERS OF FIRST CARBON-CONTAINING MATERIAL TO GENERATE SOLUBILITY-CHANGING AGENT, MODIFYING SOLUBILITY OF LAYERS OF FIRST CARBON-CONTAINING MATERIAL

306 — ETCH FIRST OPENINGS THROUGH LAYER STACK

308 — FILL FIRST OPENINGS WITH THIRD MATERIAL

310 — ETCH SECOND OPENINGS THROUGH LAYER STACK

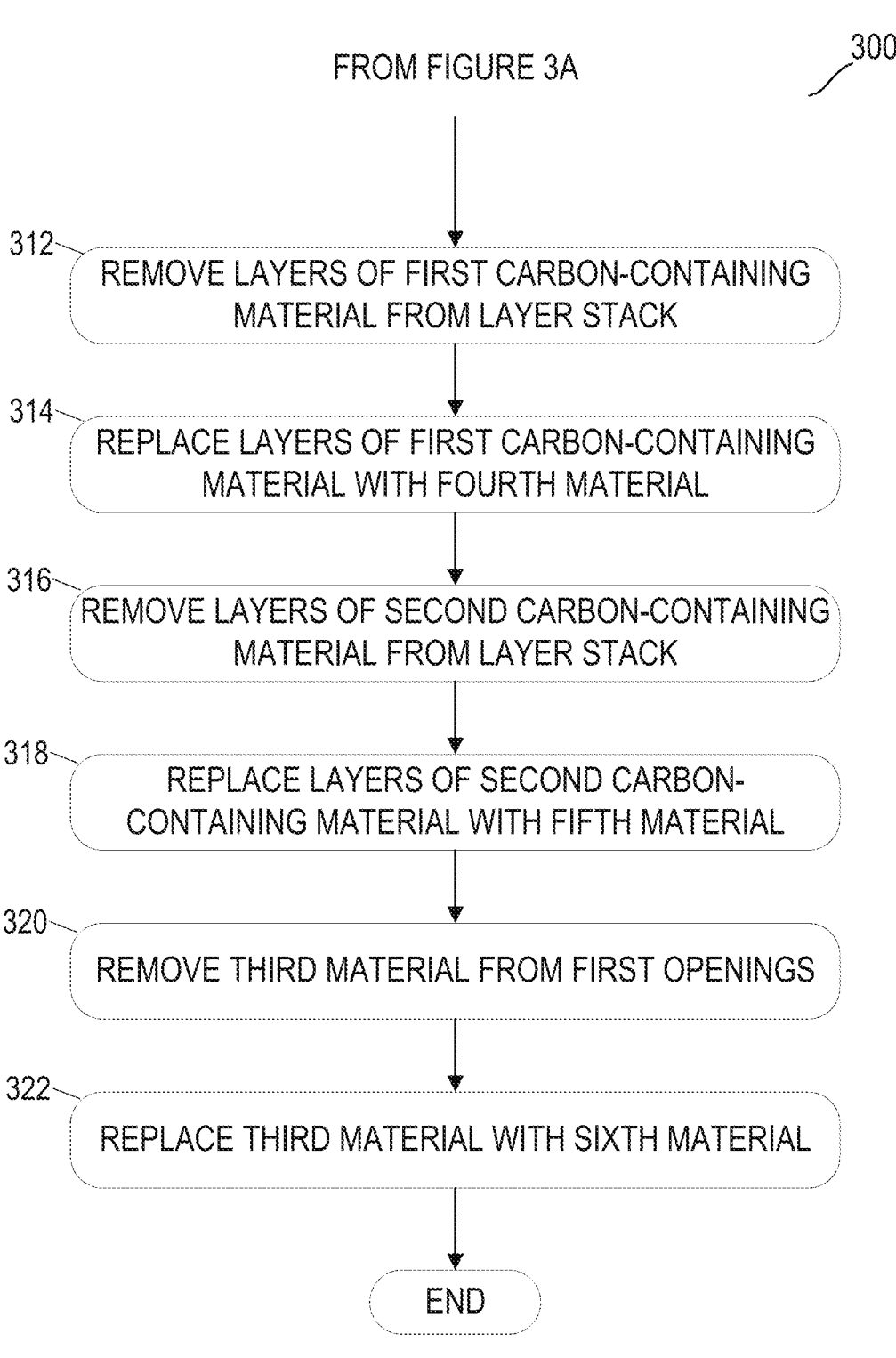

FROM FIGURE 3A

300

312 — REMOVE LAYERS OF FIRST CARBON-CONTAINING MATERIAL FROM LAYER STACK

314 — REPLACE LAYERS OF FIRST CARBON-CONTAINING MATERIAL WITH FOURTH MATERIAL

316 — REMOVE LAYERS OF SECOND CARBON-CONTAINING MATERIAL FROM LAYER STACK

318 — REPLACE LAYERS OF SECOND CARBON-CONTAINING MATERIAL WITH FIFTH MATERIAL

320 — REMOVE THIRD MATERIAL FROM FIRST OPENINGS

322 — REPLACE THIRD MATERIAL WITH SIXTH MATERIAL

END

FIGURE 3B

FABRICATING THREE-DIMENSIONAL SEMICONDUCTOR STRUCTURES

TECHNICAL FIELD

This disclosure relates generally to the field of semiconductors, and, in certain embodiments, to fabricating three-dimensional (3D) semiconductor structures.

BACKGROUND

Device formation within microelectronic workpieces typically involves a series of manufacturing techniques related to the formation, patterning, and removal of layers of material on a substrate. To meet the physical and electrical specifications of current and next generation semiconductor devices, process flows are being requested to reduce feature size while maintaining structure integrity for various patterning processes.

3D structures are becoming common formations on microelectronic workpieces to increase device density. Examples of such 3D structures for microelectronic workpieces include fin field-effect transistors (FINFETs), 3D memory structures, and/or other 3D structures. As the density requirements increase, however, improvements are needed to reduce production costs and to maintain device integrity and performance in 3D structures such as 3D memory structures.

In the case of typical two-dimensional (2D) or planar semiconductor devices, integration may be determined by the area occupied by a unit memory cell, which can be related to the level of fine patterning technology used to form those cells. The expense associated with the processing equipment used with fine patterning may, however, limit the integration for 2D or planar semiconductor devices. To overcome such a limitation, 3D semiconductor devices, including three-dimensionally-arranged memory cells, such as in 3D vertical NAND (VNAND) memory structures, have been used.

SUMMARY

In certain embodiments, a method includes forming, on a substrate by spin-on deposition, a layer stack of alternating layers of first and second carbon-containing materials. The layers of the first carbon-containing material include an agent-generating ingredient for generating a solubility-changing agent in response to an activation trigger. The method includes executing the activation trigger in response to which the solubility-changing agent is generated from the agent-generating ingredient in the layers of the first carbon-containing material and modifies the layers of the first carbon-containing material to be soluble in a developer. The method includes etching first openings through the layer stack, filling the first openings with a third material, etching second openings through the layer stack, removing the layers of the first carbon-containing material from the layer stack by exposing those to the developer, and replacing the layers of the first carbon-containing material with a fourth material.

In certain embodiments, a method includes forming, on a substrate, a layer stack of alternating first layers of a first carbon-containing material and second layers of a second carbon-containing material. The first layers and the second layers are deposited by spin-on deposition. The first layers include a photoresist material or a developable anti-reflective coating, and include a thermal acid generator (TAG).

The method includes executing a first bake of the substrate. The first bake causes the TAG to generate acid in the first layers, the acid modifying the first layers to be soluble in a developer. The method includes etching first openings through the layer stack, filling the first openings with a first fill material that includes a metal oxide material, etching second openings through the layer stack, exposing the first layers to the developer to remove the first layers from the layer stack, replacing the first layers with a third material that is an oxide or a nitride, removing the second layers from the layer stack, replacing the second layers with a fourth material, removing the first fill material from the first openings, and replacing the first fill material in the first openings with a second fill material that includes one or more of silicon dioxide, silicon nitride, and polysilicon.

In certain embodiments, a method for fabricating a 3D NAND device includes forming, on a substrate, a layer stack of alternating first layers of a first carbon-containing material and second layers of a second carbon-containing material. The first layers and the second layers are deposited by spin-on deposition. The first layers include a photoresist material or a developable anti-reflective coating, and include an agent-generating ingredient for generating a solubility-changing agent in response to an activation trigger. The method includes executing the activation trigger, the solubility-changing agent being generated from the agent-generating ingredient in the first layers in response to the activation trigger, the solubility-changing agent modifying the first layers to be soluble in a developer. The method includes etching channel holes through the layer stack, filling the channel holes with a third material, and etching slits through the layer stack, the slits exposing the alternating first layers and second layers of the layer stack. The method includes removing the first layers from the layer stack by exposing the first layers to the developer and replacing the first layers with a fourth material that includes an oxide or a nitride. The method includes removing the second layers from the layer stack by exposing the second layers to an etch chemistry and replacing the second layers with a fifth material that is a metal-containing material.

Different or additional features, variations, and embodiments also can be implemented, and related systems and methods can be used as well.

BRIEF DESCRIPTION OF THE DRAWINGS

For a more complete understanding of this disclosure, and advantages thereof, reference is made to the following descriptions taken in conjunction with the accompanying drawings, in which:

FIGS. 1A-1M illustrate cross-sectional and plan views of an example semiconductor structure during an example process for forming a 3D semiconductor structure, according to certain embodiments;

FIG. 3A-3B illustrates a flow diagram of an example method for forming 3D semiconductor structures, according to certain embodiments;

DETAILED DESCRIPTION OF ILLUSTRATIVE EMBODIMENTS

Figure 1A:
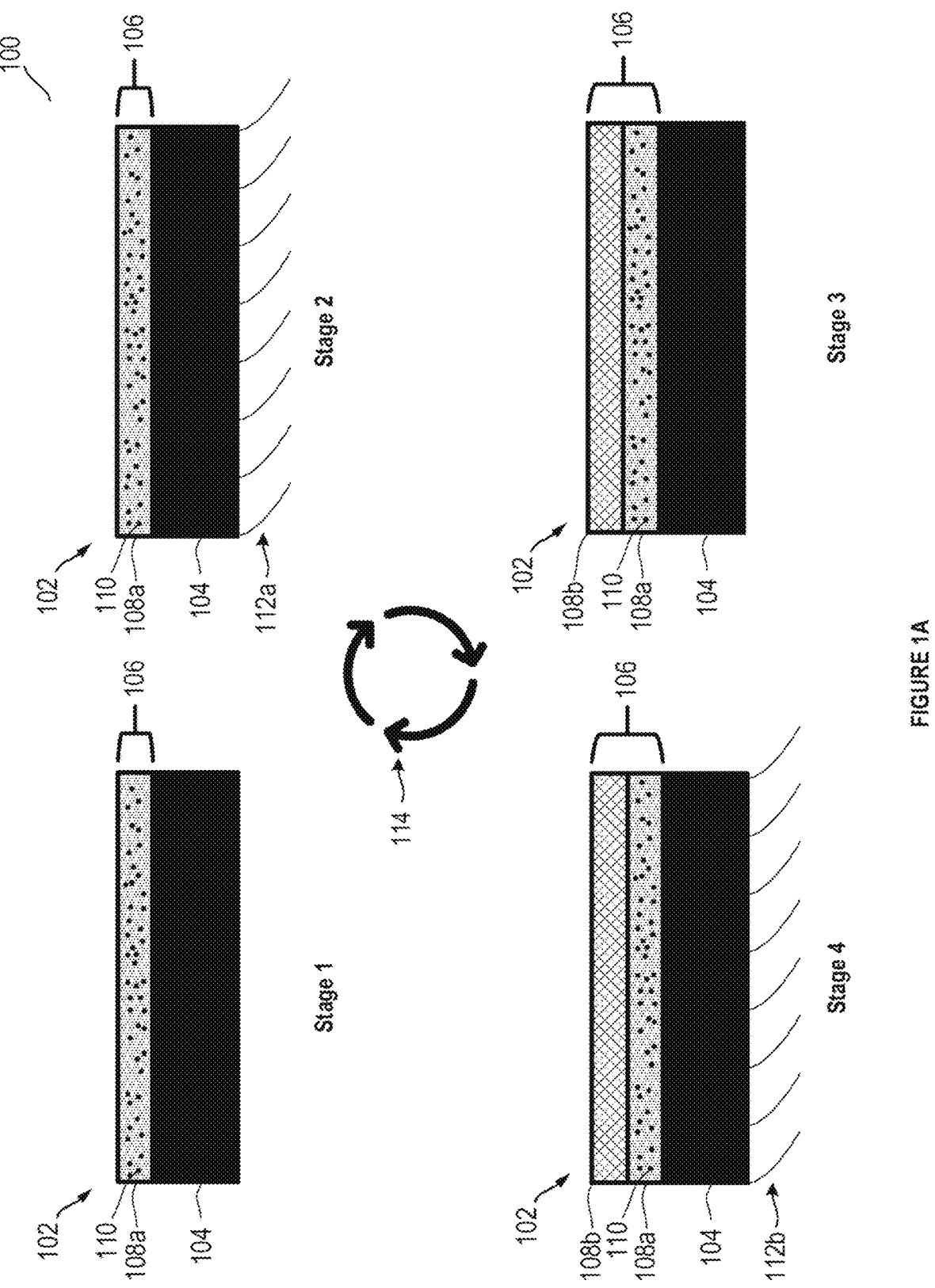

To increase density and lower cost-per-bit for memory devices, 3D memory structures have been formed using current processes. For example, 3D VNAND memory cells have been developed using 3D stacked structures. Fabricating such 3D semiconductor structures may include forming stacked films of alternating materials, such as an oxide-nitride-oxide-nitride (ONON) alternating stack or an oxide-polysilicon-oxide-polysilicon (OPOP) stack. These stacks can include as many as 200 layers or more, and sometimes greater than 300 layers. Additionally, stack height is expected to grow in the future.

Unlike planar NAND (e.g., 2D NAND), however, 3D VNAND stacked films may create stresses to the wafer, which may cause wafer bowing and/or other defects. As layer stack height (including additional layers in the layer stack) for 3D VNAND devices continues to increase, a corresponding manufacturing cost increases as well. For example, to create the stacked films of these 3D semiconductor devices, the plasma processes used to deposit the layers of the stacked film may be performed repeatedly, such as once for each layer of the stack. Repeatedly performing these processes is expensive, both in manufacturing time and cost of materials/equipment. Furthermore, repeatedly performing these plasma deposition processes greatly stresses the wafer, which can result in defects such as wafer bowing. These stresses and bowing may impact the ability to achieve precise lithography overlay during fabrication of the 3D semiconductor structure, and ultimately can detrimentally affect device performance.

According to certain conventional techniques, a layer stack may be formed by repeatedly depositing layers in an alternating arrangement using a chemical vapor deposition (CVD) process, a plasma-enhanced PVD (PECVD) process, a physical vapor deposition (PVD) process, or a plasma-enhanced PVD (PEPVD) process. These deposition processes are expensive, both in terms of time (e.g., low throughput) and money (e.g., for materials, equipment (including wear and tear), and other items). Furthermore, each instance of performing the deposition process stresses the semiconductor structure being formed, such as producing high internal stress, which over time can introduce defects, such as bowing of the structure.

Additionally, the etch processes for forming various openings in the layer stack, such as holes (e.g., channel holes) and slits (e.g., for lines) can be difficult, time consuming, and otherwise problematic.

Certain embodiments of this disclosure include processes to reduce manufacturing costs of 3D semiconductor structures, such as 3D memory devices, as well as reduce overlay and internal stress concerns. Techniques herein include using spin-on films and sacrificial coatings. Spin-on films may create a low-stress wafer and may facilitate high throughput in fabricating such 3D semiconductor structures, and may have a relatively low cost of deposition. Certain embodiments may be particularly useful for 3D VNAND devices or other 3D semiconductor structures.

In certain embodiments, the spin-on materials used may include spin-on carbon (SOC), silicon oxycarbide (SiOC), organic dielectric layer (ODL), organic planarization layer (OPL), silicon oxycarbonitride (SiOCN), silicon carbide (SiC), photoresist, bottom anti-reflective coating (BARC), developable BARC (DBARC), epoxy, among others. Some of these examples may overlap in type.

In general, certain embodiments of this disclosure include forming an initial layer stack of sacrificial materials using spin-on deposition processes, and then removing and replacing those sacrificial materials through various processes to achieve the desired layer stack for a 3D semiconductor structure. Rather than the expensive and stress-inducing processes associated with directly building an initial layer stack having the desired layers, the sacrificial materials of the initial layer stack are deposited using spin-on techniques, which may be relatively quick and less stress-inducing. Furthermore, the deposited desired layers that replace the sacrificial layers each may be deposited in a single deposition step, such as using an ALD or other CVD process.

In addition to spin-coating, certain embodiments use carbon-based layers for the layer stack, which may be etched more efficiently when forming openings (e.g., channel holes and/or slits for gates) in the layer stack and when removing the layers (as sacrificial layers) for replacement with another material. In certain embodiments, one layer is a carbon-based layer that includes an agent-generating ingredient that can be activated in response to an activation trigger to cause a solubility-changing agent to be generated, the solubility-changing agent causing the solubility of the layer to be changed such that the layer is developable in a solvent. The other type of layer in the layer stack might not be soluble in the developer, which may allow selectively to be achieved for selectively removing and replacing one type of layer in the layer stack at a time. In certain embodiments, the agent-generating ingredient is a thermal-acid generator (TAG) or a photoacid generator (PAG), and the solubility-changing agent is an acid.

Different or additional features, variations, and embodiments also can be implemented, and related systems and methods can be used as well. Other advantages and implementations can also be achieved while still taking advantage of the structures and process techniques described herein.

FIGS. 1A-1M and 2A-F illustrate cross-sectional views, and in some cases plan views, of example processes for forming 3D semiconductor structures according to certain embodiments. For each of these figures, it should be understood that the illustrated example may show a portion of a semiconductor structure undergoing processing and that the illustrated structure may extend into and out of the page and/or to the left, right, top, and/or bottom of the illustrated portion. Throughout this disclosure a semiconductor structures also may refer to, or be referred to as, a device, a semiconductor device, a wafer, a workpiece, or the like. In certain embodiments, the illustrated processes are for forming semiconductor structures into a 3D memory structure, such as a 3D VNAND structure.

FIGS. 1A-1M illustrate cross-sectional and plan views of an example semiconductor structure 102 during an example process 100 for forming a 3D semiconductor structure, according to certain embodiments.

FIG. 1A illustrates cross-sectional views of an example process for forming a layer stack 106 on a substrate 104. The layer stack 106 being formed may include alternating layers 108*a* and 108*b*, which may be referred to generally as layers 108. Layer stack 106 also may be referred to as a wafer stack or a multilayer stack.

At stage 1, and particularly in a first pass of stage 1, a layer 108*a* may be deposited over substrate 104. Substrate 104 may include any substrate material(s) suitable for use in forming a 3D semiconductor structure, such as a 3D memory device. For example, substrate 104 may be or include silicon.

Layer 108*a* may be a layer to undergo a solubility change when exposed to a solubility-changing agent (e.g., acid) for subsequent removal in a development step. Layer 108*a* may be a carbon-containing layer, the solubility of which can be modified for development, at a later portion of process 100, in a developer. Layer 108*a* may be a multicomponent material that, as deposited, includes two or more components. Layer 108*a* may include a carbon-containing component and an agent-generating ingredient 110 for generating a solubility-changing agent in response to an activation trigger. In certain embodiments, layer 108*a* includes a solvent to facilitate deposition (e.g., using a spin-coating deposition technique). For example, the solvent may allow the material of layer 108*a* to be spun to form a thin layer on an underlying layer.

A carbon-containing component of layer 108*a* may include a polymer or another suitable type of organic material of which the solubility can be modified using a solubility-changing agent (e.g., acid) generated from an agent-generating ingredient 110 of layer 108*a*. The carbon-containing component (e.g., the polymer) is designed to change its structure when exposed to the solubility-changing agent (e.g., acid).

Agent-generating ingredient 110 may include any suitable material that, in response to a suitable agent-activation trigger (e.g., heat or radiation), generates a solubility-changing agent (e.g., an acid). Example agent-generating ingredients 110 may include a thermal-acid generator (TAG) that is configured to generate or otherwise release acid in response to heat or a photoacid generator (PAG) that is configured to generate or otherwise release acid in response to ultraviolet (UV) light exposure, such as actinic radiation. The generated solubility-changing agent (e.g., acid) may induce further chemical reactions in layer 108*a* that modify layer 108*a* to be soluble in a developer. For example, the generated agent may be a substance that is configured to change the solubility of a material in which the agent is disposed in response to a suitable trigger (e.g., heat), and thus may be referred to as a solubility-changing agent.

For purposes of the example process 100 of FIGS. 1A-1M, agent-generating ingredient 110 will be described as a TAG. The disclosure describes another example in which agent-generating ingredient 110 is a PAG with reference to FIGS. 2A-2F.

In certain embodiments, layer 108*a* includes a photoresist material with an embedded agent-generating ingredient 110 (e.g., a TAG or a PAG). For example, the photoresist material may be a chemically-amplified resist (CAR). The photoresist material of layer 108*a* may be appropriate for the type of solubility-changing agent and developer to be used, so that layer 108*a* can undergo a solubility change and be removed using a developer. The photoresist material of layer 108*a* may be a positive photoresist or a negative photoresist.

As another particular example, layer 108*a* may include a developable anti-reflective coating (ARC), such as a developable bottom ARC (DBARC) having an agent-generating ingredient 110.

At stage 2, a first bake 112*a* of semiconductor structure 102 may be performed to cause a crosslinking reaction (e.g., a polymer crosslinking reaction) to occur in layer 108*a*. For example, polymer chains of layer 108*a* may be crosslinked via bond formation induced by heat. In certain embodiments, the crosslinking may include C—C bond formation or S—S bond formation among others. As just one particular example, layer 108*a* may include hydroxystyrene that may undergo crosslinking in response to adequate heat.

This crosslinking reaction may cause layer 108*a* to harden or otherwise strengthen, which may render layer 108*a* more able to handle the stress of additional layers 108 as layer stack 106 increases in height.

In certain embodiments, bake 112*a* may be performed by heating semiconductor structure 102 in a process chamber at a temperature between 50° C. to 250° C., for example between 140° C. to 150° C. in certain embodiments, in vacuum or under a gas flow. In certain embodiments, bake 112*a* is performed at a lower temperature than a bake that may be performed in a subsequent process step to cause agent-generating ingredient 110 of layers 108*a* to generate a solubility-changing agent and modify a solubility of layers 108*a* (see, e.g., FIGS. 1C and 1D), such as at an approximately 20° C.-40° C. lower temperature. In a particular example, semiconductor structure 102 is baked for 1 to 3 minutes. The bake conditions of bake 112*a* may be selected to promote the crosslinking of layer 108*a*. This disclosure contemplates executing bake 112*a* in any suitable manner.

At stage 3, a layer 108*b* may be deposited over layer 108*a*. Layer 108*b* may be a carbon-containing layer. Layer 108*b* may be a multicomponent material that, as deposited, includes two or more components. For example, layer 108*b* may include a carbon-containing component. A carbon-containing component of layer 108*b* may include a polymer or another suitable type of carbon-containing material. As another example, layer 108*b* may include a solvent to facilitate deposition (e.g., using a spin-coating deposition technique). For example, the solvent may allow the material of layer 108*b* to be spun to form a thin layer on an underlying layer.

In certain embodiments, the materials used for layer 108*b* may be organic materials that are not developable in the developer that will be used to remove layers 108*a* in a later processing step. The materials used for layer 108*b* may lack an agent-generating ingredient (e.g., like agent-generating ingredient 110) that is capable to generating an agent to cause layer 108*b* to become soluble in the developer that will be used to remove layers 108*a* in the later processing step. As particular examples, the materials used for layer 108*b* may include spin-on carbon (SOC), silicon oxycarbide (SiOC), organic dielectric layer (ODL), organic planarization layer (OPL), silicon oxycarbonitride (SiOCN), silicon carbide (SiC), photoresist, ARC, BARC, epoxy, among others. Some of these examples may overlap in type.

At stage 4, a bake 112*b* of semiconductor structure 102 may be performed to cause a crosslinking reaction (e.g., a polymer crosslinking reaction) to occur in layer 108*b*. For example, polymer chains of layer 108*b* may be crosslinked via bond formation induced by heat. In certain embodiments, the crosslinking may include C—C bond formation or S—S bond formation among others. As just one particular example, layer 108*b* may include hydroxystyrene that may undergo crosslinking in response to adequate heat.

This crosslinking reaction may cause layer 108*b* to harden or otherwise strengthen, which may render layer 108*b* more able to handle the stress of additional layers 108 as layer stack 106 increases in height. In certain embodiments, the crosslinking reaction may render layer 108*b* insoluble in a developer that will be used to remove layers 108*a* in a subsequent processing step; however, in certain embodiments, layer 108*b* already may be insoluble in such a developer.

In certain embodiments, similar to bake 112*a*, bake 112*b* may be performed by heating semiconductor structure 102 in a process chamber at a temperature between 50° C. to 250° C., for example between 140° C. to 150° C. in certain embodiments, in vacuum or under a gas flow. In certain embodiments, bake 112*b* is performed at a lower temperature than a bake that may be performed in a subsequent process step to cause agent-generating ingredient 110 of layers 108*a* to generate a solubility-changing agent and modify a solubility of layers 108*a* (see, e.g., FIGS. 1C and 1D), such as at an approximately 20° C.-40° C. lower temperature. In a particular example, semiconductor structure 102 is baked for 1 to 3 minutes. The bake conditions of bake 112*b* may be selected to promote the crosslinking of layer 108*b*. This disclosure contemplates executing bake 112*b* in any suitable manner.

Bakes 112*a* and 112*b* may be optimized for causing crosslinking of the respective materials of layers 108*a* and 108*b*. Bakes 112*a* and 112*b* may be performed according to the same or different conditions, depending on what is appropriate for a given implementation. Bakes 112*a* and 112*b* may be referred to collectively as bake(s) 112 throughout this disclosure.

Stages 1-4 may be performed to build a layer stack 106 of alternating layers 108*a* and 108*b*. For example, stages 1-4 may be repeated a suitable number of times, as illustrated by circular arrows 114, to build a layer stack 106 having a target number of layers 108. An example layer stack 106 that may include multiple alternating layers 108*a* and 108*b* is illustrated and described in connection with FIG. 1B.

Although stages 1-4 are illustrated, additional stages may be performed or stages 1-4 may be combined in any suitable manner. In certain embodiments, bake 112 could be performed after each layer 108 is deposited, or after more than two layers 108 are deposited. Furthermore, to the extent multiple bakes 112 are performed, temperatures of the multiple bakes 112 may be the same or different, as may be appropriate for a given implementation. Furthermore, although a first instance of layer 108*a* is described as being deposited prior to a first instance of layer 108*b*, a first instance of layer 108*b* could be deposited prior to a first instance of layer 108*a*.

In certain embodiments, during the stack-formation process of FIG. 1A, layers 108*a* and 108*b* may be deposited on semiconductor structure 102 in any suitable manner. For example, a layer 108 may be deposited by spin-coating, spray-coating, dip-coating, or roll-coating. As a particular example, a layer 108 may be deposited on semiconductor structure 102 using a spin-on deposition technique, which also may be referred to as spin-coating.

In certain embodiments, spin-on deposition (which also may be referred to as spin-coating) includes depositing a particular material (e.g., the material of a layer 108 being deposited) on an underlying layer (e.g., substrate 104 for the first layer 108 or an underlying layer 108 for subsequent layers 108 of layer stack 106). Structure 102 is then rotated (if not already rotating, possibly at a relatively low velocity) at a relatively high velocity so that centrifugal force causes deposited material to move toward edges of the substrate, thereby coating the substrate. Excess material is typically spun off the substrate. In certain embodiments, the spin-on deposition technique includes dispensing liquid chemicals onto semiconductor structure 102 (e.g., on a top surface of substrate 104 or a layer of layer stack 106) using a coating module with a liquid delivery system that may dispense one or more types of liquid chemicals. The dispense volume can be between 0.2 ml to 10 ml, for example 0.5 ml to 2 ml. The substrate (e.g., structure 102) may be secured to a rotating chuck that supports the substrate. The rotating speed during liquid dispense can be between 50 rpm to 3000 rpm, for example 1000 rpm to 2000 rpm. The system may also include an anneal module that may bake or apply light radiation to the substrate after the chemicals have been dispensed. It should be understood that this example spin-on deposition technique and associated values are provided as examples only.

Layers 108 of layer stack 106 may be deposited using a spin-on deposition tool, for example, a particular example of which is described below with reference to FIG. 8. In certain embodiments, forming a layer 108 using a spin-on coating deposition process includes depositing the layer 108 using a spin-coating process and potentially baking and/or curing the deposited layer 108 following deposition. In certain embodiments, layers 108 may be deposited in a deposition module (e.g., a spin-coating module) of a larger track system. An example track system is described in greater detail below with reference to FIGS. 6-7. In certain embodiments, a same tool may be used to perform the deposition, bake, and cure; however, this disclosure contemplates using multiple tools. The bake may be a low-temperature bake step.

Figure 1B:
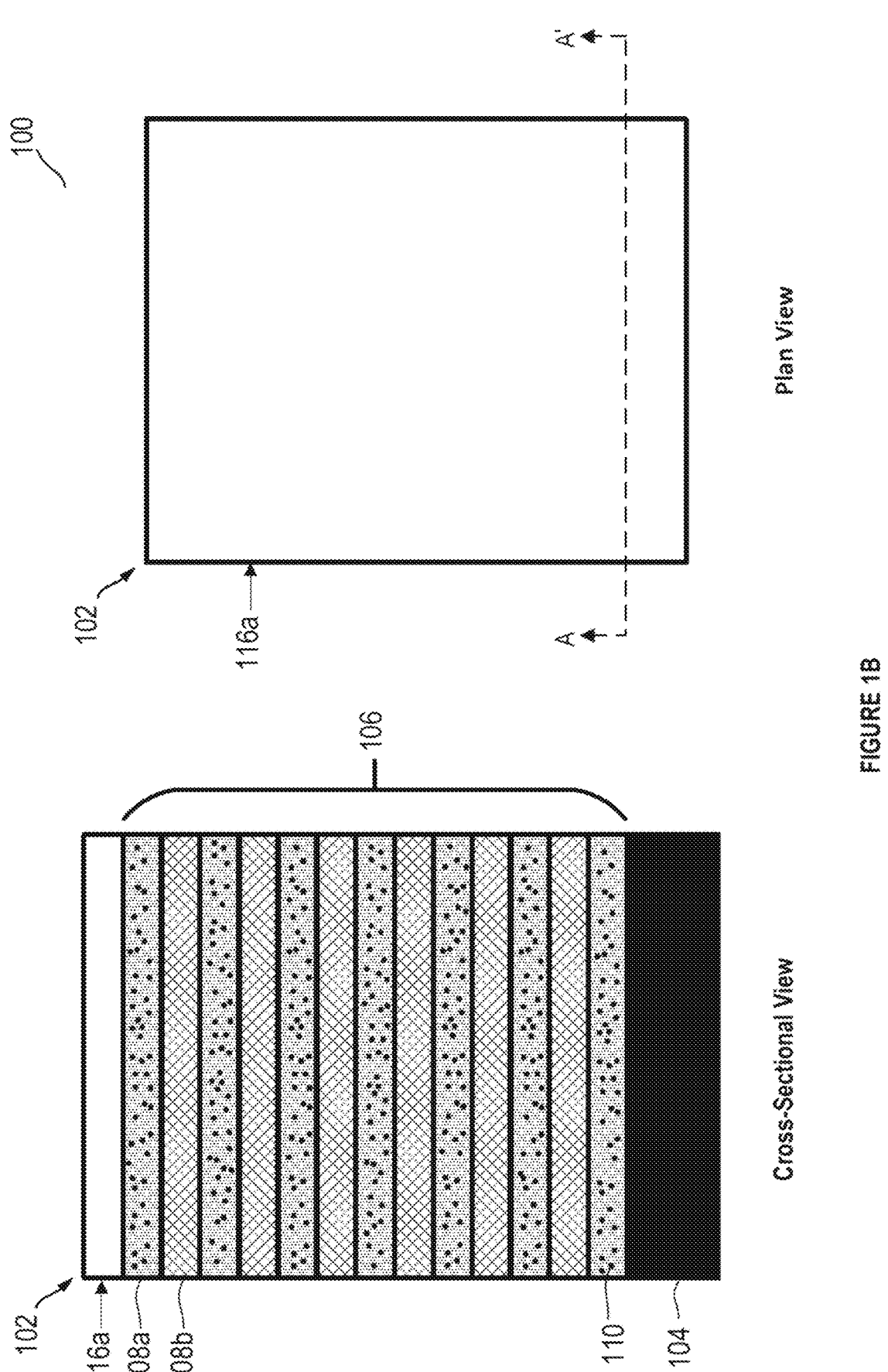

As shown in FIG. 1B, after multiple iterations of the stages illustrated in FIG. 1A, structure 102 includes layer stack 106 formed on substrate 104, with layer stack 106 including multiple alternating layers 108*a* and 108*b*. The cross-sectional view of structure 102 of FIG. 1B is taken along a cross-section A-A' of the plan view of semiconductor structure 102. A similar cross-section A-A' is used in FIGS. 1C-1M.

Layer stack 106 may include alternating layers 108*a* and 108*b*, which may be referred to collectively as layers 108. Layer stack 106 also may be referred to as a wafer stack or a multilayer stack. Layers 108 may be formed using spin-on deposition techniques. In certain embodiments, the spin-on materials used may include SOC, SiOC, ODL, OPL, SOH, SiOCN, SiC, photoresist, ARC, BARC, DBARC, epoxy, among others. In a particular example, layers 108*a* are photoresist or DBARC and include an agent-generating ingredient for generating a solubility-changing agent in response to an activation trigger, and layers 108*b* are SOC or epoxy. Thus, in a particular example, layer stack 106 is formed by depositing, by spin-on deposition, alternating layers 108 of photoresist or DBARC (e.g., as layers 108*a*) and SOC or epoxy (e.g., as layers 108*b*).

Although layer stack 106 is shown to include a particular number of layers 108, layer stack 106 may include any suitable number of layers, including as few as two layers 108 and upwards of one-hundred layers 108, two-hundred layers 108, three-hundred layers 108, four-hundred layers 108, five-hundred layers 108, or more (potentially hundreds more). The number of layers 108 expected to be a part of layer stack 106 likely will continue to increase over time, increasing the deposition process instances. As just one example, layers 108 may be about 5 nm to about 175 nm thick, and the thicknesses of these layers may be the same or may vary in any suitable combination.

Due at least in part to the potential increased speed of spin-on deposition relative to CVD, PECVD, PVD, or PEPVD deposition, forming layer stack 106 using spin-on deposition may allow layer stack 106 to be formed with a greater number of layers 108 with reduced impact on overall processing time relative to a process that uses CVD, PECVD, PVD, or PEPVD deposition to directly deposit the layers of the desired layer stack. Additionally or alternatively, due at least in part to the lower cost of spin-on deposition relative to CVD, PECVD, PVD, or PEPVD deposition, forming layer stack 106 using spin-on deposition may allow layer stack 106 to be formed at a reduced cost relative to a process that uses CVD, PECVD, PVD, or PEPVD deposition. Additionally or alternatively, due at least in part to the potentially less stress-inducing characteristics of spin-on deposition relative to CVD, PECVD, PVD, or PEPVD deposition, forming layer stack 106 using spin-on deposition may allow layer stack 106 to be formed with a greater number of layers 108 with reduced stress on structure 102 relative to a process that uses CVD, PECVD, PVD, or PEPVD deposition, which may reduce defects in structure 102, including potentially bowing and problems resulting from bowing.

After a predetermined number of alternating layers 108a and 108b have been deposited as layer stack 106, a masking layer 116a may be deposited on top of layer stack 106. Masking layer 116a may be used as an etch mask for subsequent etch steps. In certain embodiments, masking layer 116a is resistant to etching in a subsequent etching process for forming openings in layer stack 106. Masking layer 116a may include a material suitable for use in the etch process to be performed, considering selectivity of the etch process being performed. In certain embodiments, masking layer 116a is silicon, SiN (e.g., $Si_3N_4$), or a metal hardmask, but masking layer 116a may include any suitable material for use as an etch mask layer. In certain embodiments, masking layer 116a is deposited using an ALD or other CVD deposition process. Throughout FIGS. 1B-1M, masking layers may be referred to generally as masking layers 116. Masking layers 116 may take any suitable form according to the context in which the masking layer 116 is used. Although shown in FIG. 1B, in certain embodiments, one or more of masking layers 116 may be deposited after the deprotection process described below with reference to FIGS. 1C and 1D.

Figure 1C:
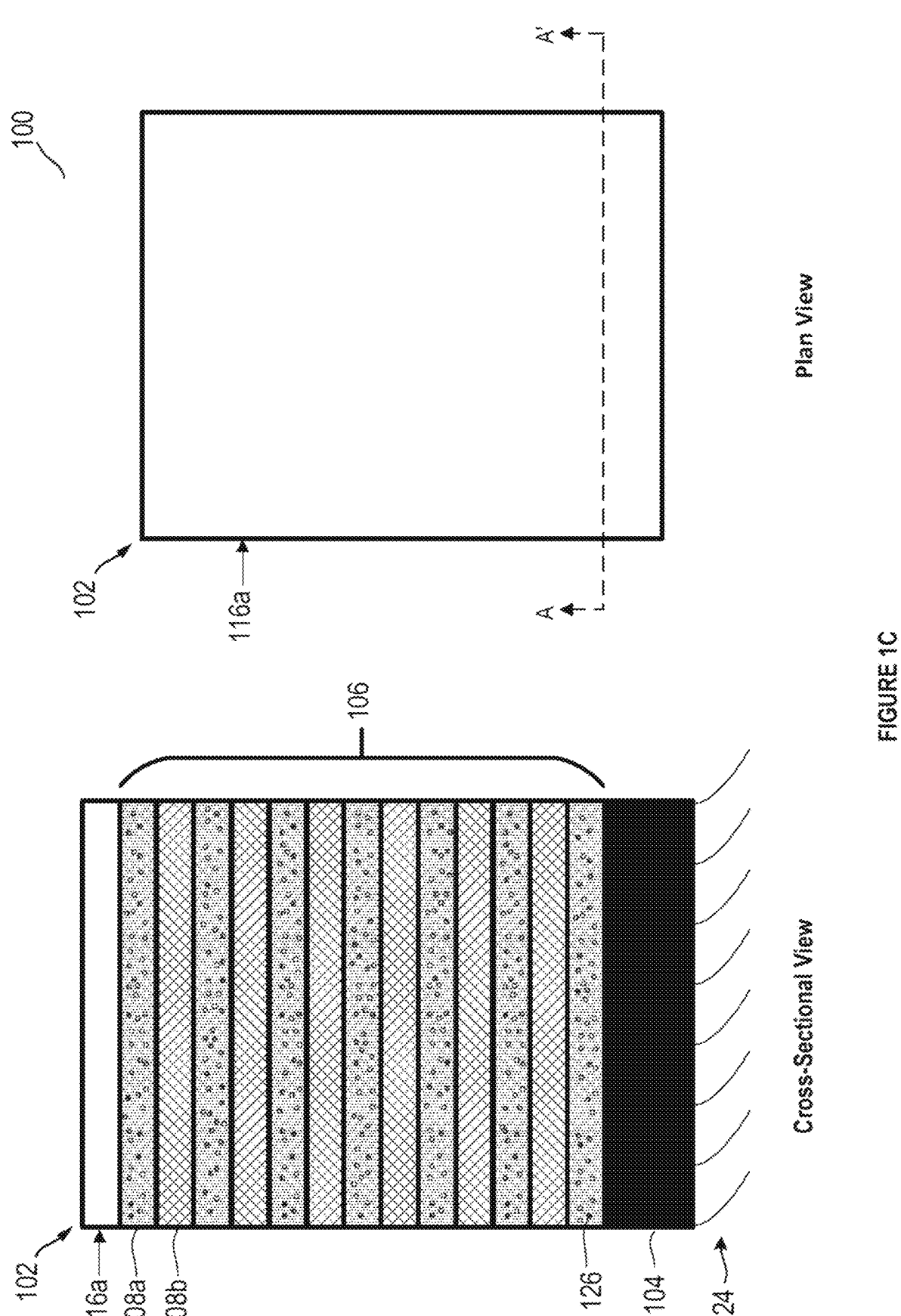
Figure 1D:
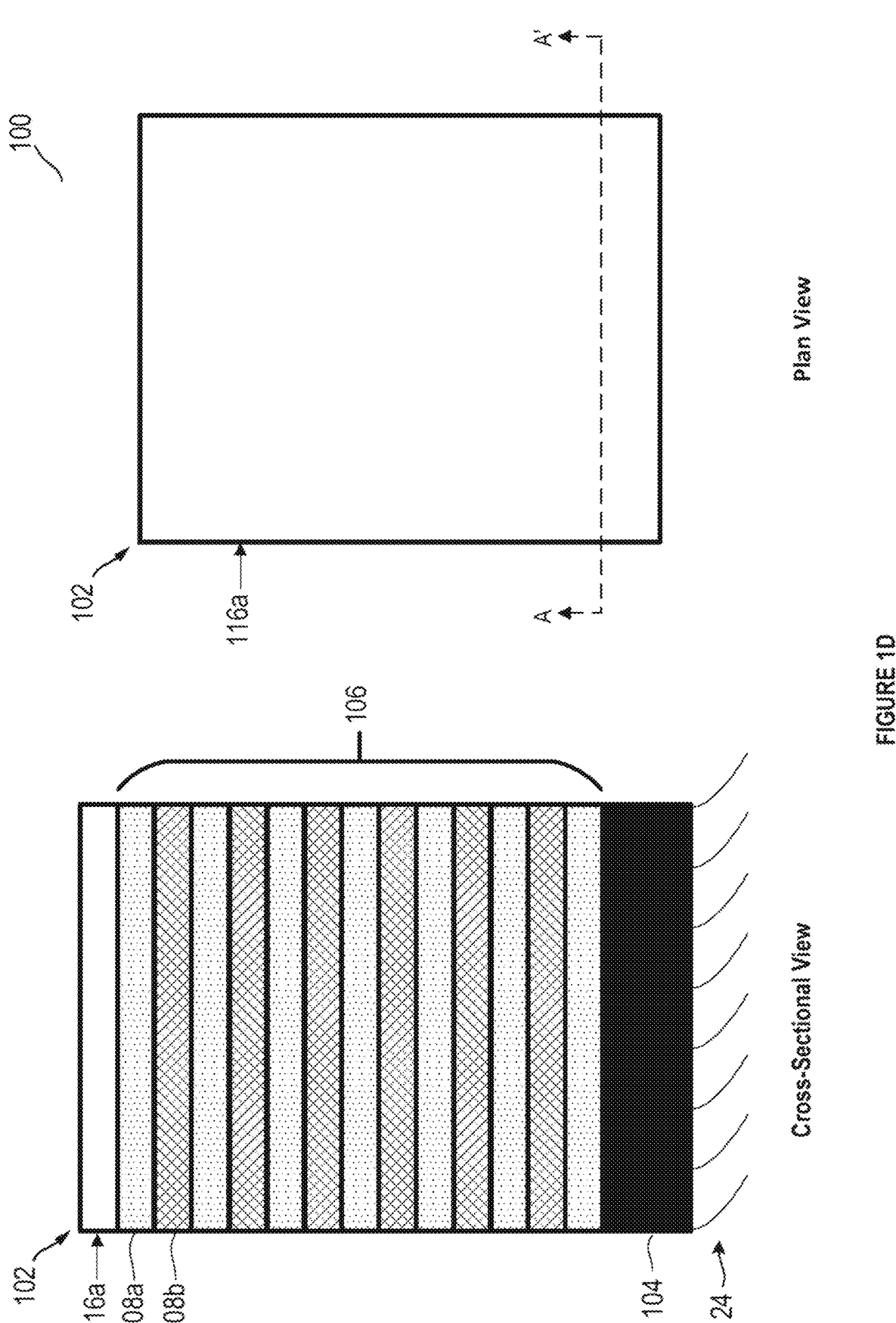

As shown in FIGS. 1C-1D, the activation trigger for causing agent-generating ingredient 110 of layers 108a to generate a solubility-changing agent may be executed. As described above, for purposes of the example process 100 of FIGS. 1A-1M, agent-generating ingredient 110 is described as a TAG. Thus, in the example of FIGS. 1C-1D, the activation trigger for causing agent-generating ingredient 110 to generate a solubility-changing agent is executing a bake 124 of semiconductor structure 102.

As illustrated in FIG. 1C, in response to bake 124, agent-generating ingredient 110 may generate or otherwise release solubility-changing agent 126 in layers 108a, which may be referred to as activating solubility-changing agent 126. Solubility-changing agent 126 may induce further chemical reactions in layers 108a that modify layers 108a to be soluble in a developer. For example, solubility-changing agent 126 may be a substance that is configured to change the solubility of a material in which solubility-changing agent 126 is disposed in response to a suitable trigger (e.g., heat). In certain embodiments, solubility-changing agent 126 is an acid.

As illustrated in FIG. 1D, solubility-changing agent 126 may modify layer 108a (e.g., the carbon-containing material of layers 108a) to be soluble for development (e.g., removal) in a developer. Bake 124 may cause solubility-changing agent 126 to react with other substances (e.g., a polymer) of layers 108a to cause layers 108a to become soluble for development in the developer. For example, bake 124 may cause a solubility-changing agent to convert one or more of the pendant groups of another substance (e.g., a polymer) of the exposed regions to cause the exposed regions to become soluble for development in the developer. This process also may be referred to as a deprotection reaction that causes the exposed regions to become deprotected (e.g., soluble) in a given developer.

In certain embodiments, bake 124 may be performed by heating semiconductor structure 102 in a process chamber at a temperature between 50° C. to 250° C., for example between 180° C. to 200° C. in certain embodiments, in vacuum or under a gas flow. In certain embodiments, bake 124 is performed at a higher temperature than bake 112, such as at an approximately 20° C.-40° C. higher temperature. In a particular example, semiconductor structure 102 is baked for 1 to 3 minutes. The bake conditions of bake 124 may be selected to promote generation of solubility-changing agent 126 and the modification of the solubility of layers 108a. This disclosure contemplates executing bake 124 in any suitable manner.

Although generation of solubility-changing agent 126 and modification of layers 108a to be soluble for development are shown in separate figures (FIGS. 1C-1D), in certain embodiments, generation of solubility-changing agent 126 and modification of layers 108a to be soluble for development in response to bake 124 may occur substantially simultaneously.

Figure 1E:
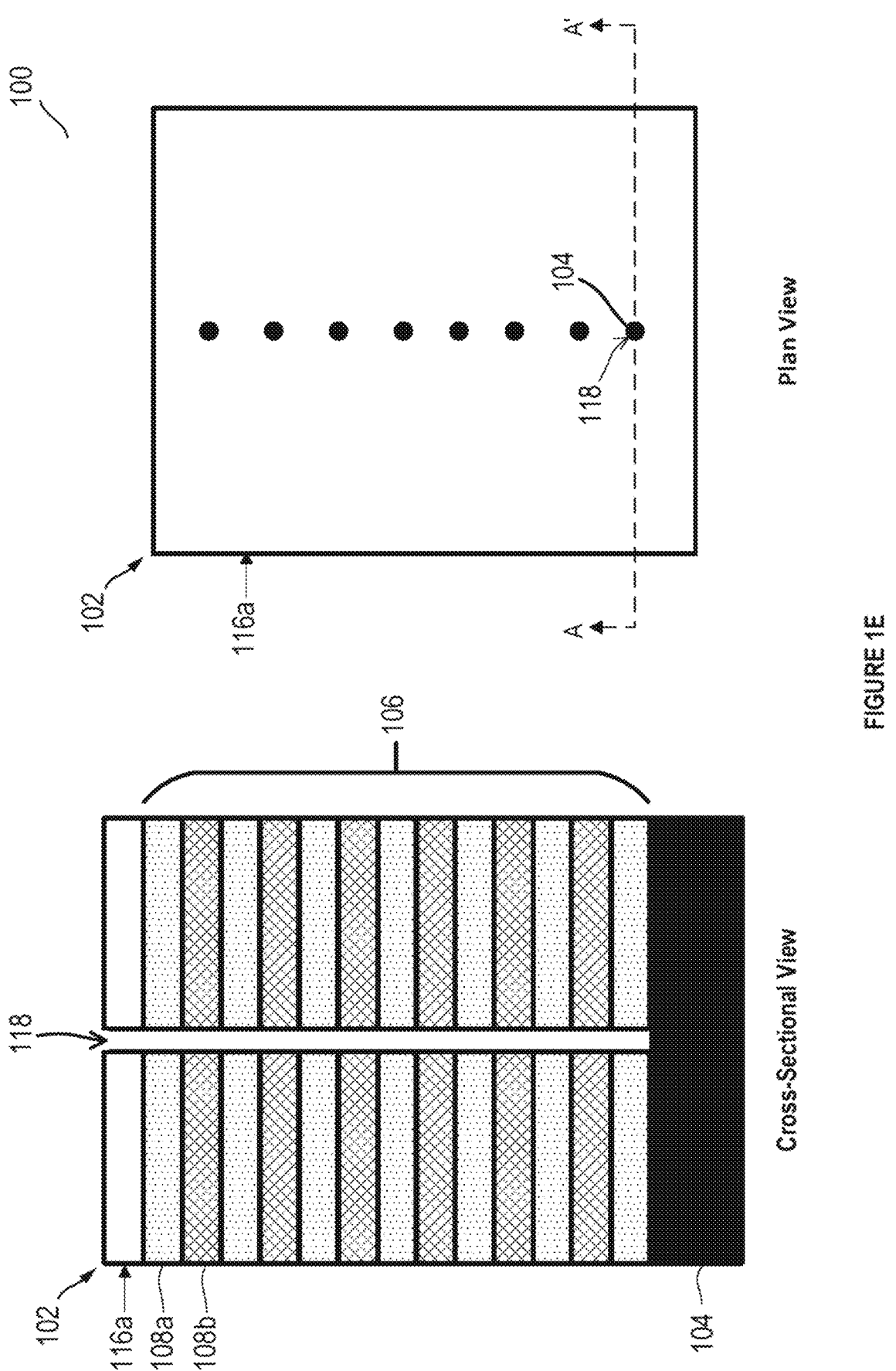

As shown in FIG. 1E, openings 118 are formed in layer stack 106 through layers 108. In the illustrated example, openings 118 are formed through layer stack 106 until a surface of substrate 104 is exposed. As can be appreciated from the plan view of FIG. 1E, multiple openings 118 may be formed in layer stack 106 in any suitable quantity. Furthermore, openings 118 may be formed in any suitable arrangement. Openings 118 may be holes, trenches, vias, or any other suitable type(s) of openings. In certain embodiments, openings 118 are channel holes for forming channels of a 3D semiconductor device under construction (e.g., of a 3D memory device, such as a 3D VNAND device). Although shown to be generally a circular cylinder as they extend through layer stack 106, openings 118 may have any suitable shape.

Openings 118 may be channel holes in which a channel for a semiconductor device, such as a 3D semiconductor device, may be formed. In certain embodiments, openings 118 can be used to form 3D memory cells, with channels for the 3D memory cells being formed in openings 118. For example, 3D VNAND memory cells may be manufactured using openings 118 formed in layer stack 106. Further, single-level cell (SLC) memories, multi-level cell (MLC) memories such as triple-level cell (TLC) and quad-level cell (QTC) memories, and/or other memory or device structures can be formed using these techniques.

To form openings 118, masking layer 116a may be patterned (e.g., using one or more lithography processes) to form openings in masking layer 116a that expose surfaces of layer stack 106 and align with the desired locations of openings 118, and then openings 118 may be etched through layers 108 of layer stack 106 using the patterned masking layer 116a as an etch mask. Lithography processes described herein can be implemented using optical lithography, dry lithography, immersion lithography, electron-beam lithography, extreme ultra-violet (EUV) lithography, and/or other lithography processes. In embodiments in which openings 118 ultimately serve as channel holes for forming channels of a device (e.g., a 3D NAND memory device), the pattern of masking layer 116a may be or include a channel pattern.

Openings 118 may be formed using any suitable type of etch process, according to particular needs. The etch processes for forming openings 118 within layer stack 106 can include one or more wet etch processes, plasma etch processes, reactive ion etching (RIE) processes, and/or other etch processes or combinations of etch processes. In certain embodiments, the etch process for forming openings 118 is an oxygen etch process, such as an oxygen RIE process. In certain embodiments, due at least in part to both layers 118a and 118b being formed of carbon-containing material, layers 118a and 118b may be easy to etch relative to layer stacks that include alternating oxide and nitride layers, or even relative to layer stacks that include alternating organic and non-organic layers, which may decrease processing time and increase process efficiency.

Figure 1F:
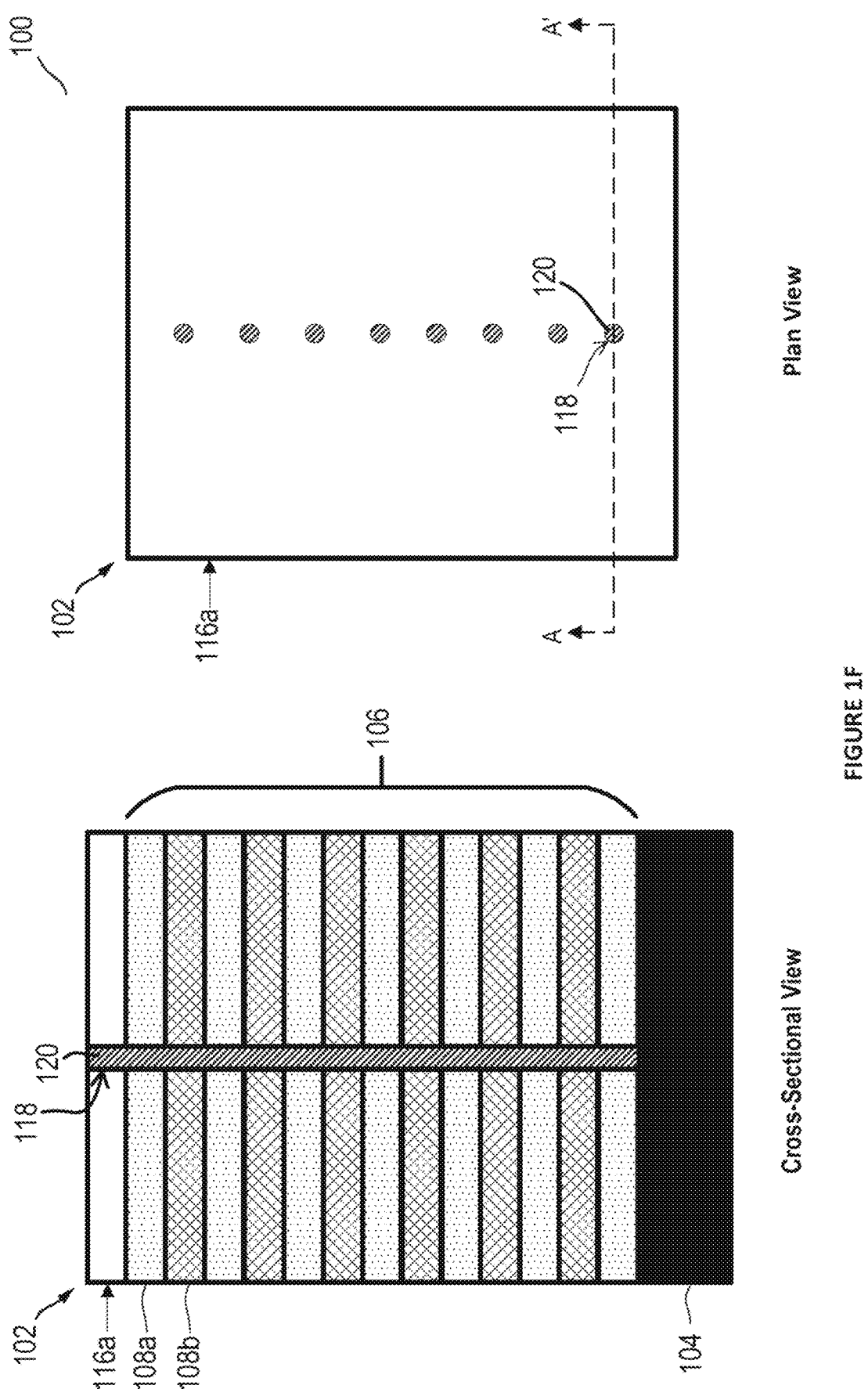

As shown in FIG. 1F, openings 118 may be filled with a fill material 120. Fill material 120 may be a sacrificial material that is replaced at a later stage of process 100. Although fill material 120 may include any material suitable to serve as a sacrificial material (or dummy material), in certain embodiments, fill material 120 is a metal oxide fill material. Fill material 120 may be deposited using any suitable type of deposition process or combination of deposition processes. For example, fill material 120 may be deposited using one or more of a CVD process (including, potentially, an ALD process), a PECVD process, a PVD process, a PEPVD process.

Figure 1G:
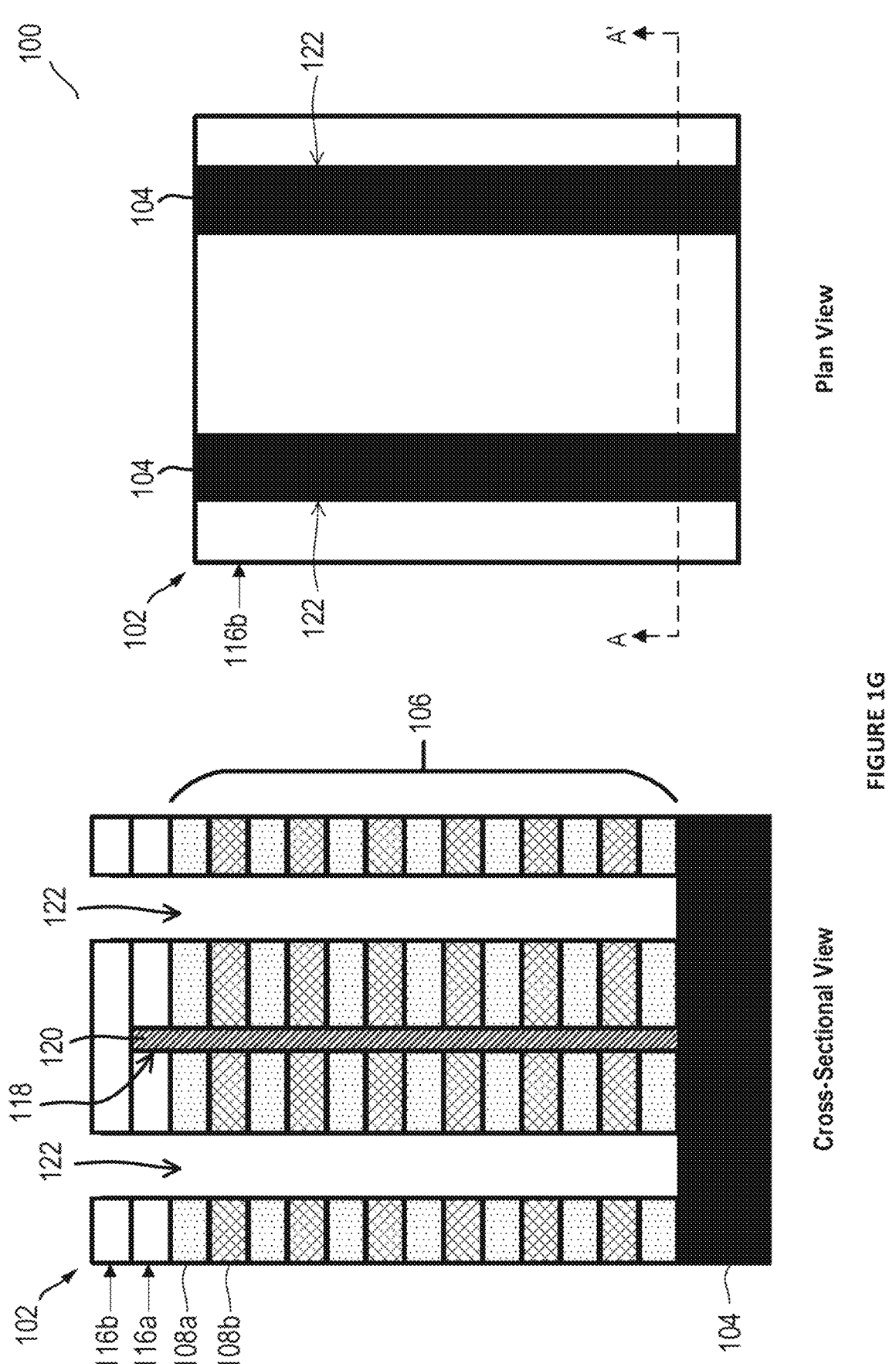

As shown in FIG. 1G, openings 122 are formed in layer stack 106 through layers 108. In the illustrated example, openings 122 are formed through layer stack 106 until a surface of substrate 104 is exposed. In the illustrated example, an opening 122 is formed on each side of a row of openings 118. Multiple openings 122 may be formed in layer stack 106 in any suitable quantity. Furthermore, openings 122 may be formed in any suitable arrangement. Openings 122 may be holes, trenches, vias, or any other suitable type(s) of openings. In certain embodiments, openings 122 are referred to as slits that ultimately will be used to deposit conductive material for one or more gates of a 3D semiconductor device under construction (e.g., of a 3D memory device, such as a 3D VNAND device). Although shown to be generally a rectangular as they extend through layer stack 106, openings 122 may have any suitable shape.

Openings 122 may be formed in any suitable manner. In certain embodiments, a masking layer 116b may be deposited on top of layer stack 106 (e.g., on top of masking layer 116a). Masking layer 116b may be used as an etch mask for subsequent etch steps. In certain embodiments, masking layer 116b is resistant to etching in a subsequent etching process for forming openings 122 in layer stack 106. Masking layer 116b may include a material suitable for use in the etch process to be performed, considering selectivity of the etch process being performed. In certain embodiments, masking layer 116b is silicon, SiN (e.g., $Si_3N_4$), or a metal hardmask, but masking layer 116b may include any suitable material for use as an etch mask layer. In certain embodiments, masking layer 116b is deposited using an ALD or other CVD deposition process.

To form openings 122, masking layer 116b may be patterned (e.g., using one or more lithography processes) to form openings in masking layer 116b that expose surfaces of masking layer 116a and/or layer stack 106 and align with the desired locations of openings 122, and then openings 122 may be etched through masking layer 116a and layers 108 of layer stack 106 using the patterned masking layer 116b as an etch mask. Masking layer 116b may protect fill material 120 from being etched during formation of openings 122. In certain embodiments, rather than depositing a new masking layer 116b on top of masking layer 116a, masking layer 116a may be removed and masking layer 116b may replace masking layer 116a. Openings 122 may be formed using a different etch mask compared to the etch mask used to form openings 118. That is, masking layer 116b and masking layer 116a may be different instances of a masking layer 116 that are patterned differently according to the desired locations of openings 118 and openings 122, respectively. In embodiments in which openings 122 ultimately serve as gate lines for forming gates of a device (e.g., a 3D NAND memory device), the pattern of masking layer 116b may be or include a gate pattern.

Openings 122 may be formed using any suitable type of etch process, according to particular needs. The etch processes for forming openings 122 within layer stack 106 can include one or more wet etch processes, plasma etch processes, RIE processes, and/or other etch processes or combinations of etch processes. In certain embodiments, the etch process for forming openings 122 is an oxygen etch process, such as an oxygen RIE process. In certain embodiments, due at least in part to both layers 118a and 118b being formed of carbon-containing material, layers 118a and 118b may be easy to etch relative to layer stacks that include alternating oxide and nitride layers, or even relative to layer stacks that include alternating organic and non-organic layers, which may decrease processing time and increase process efficiency.

Figure 1H:
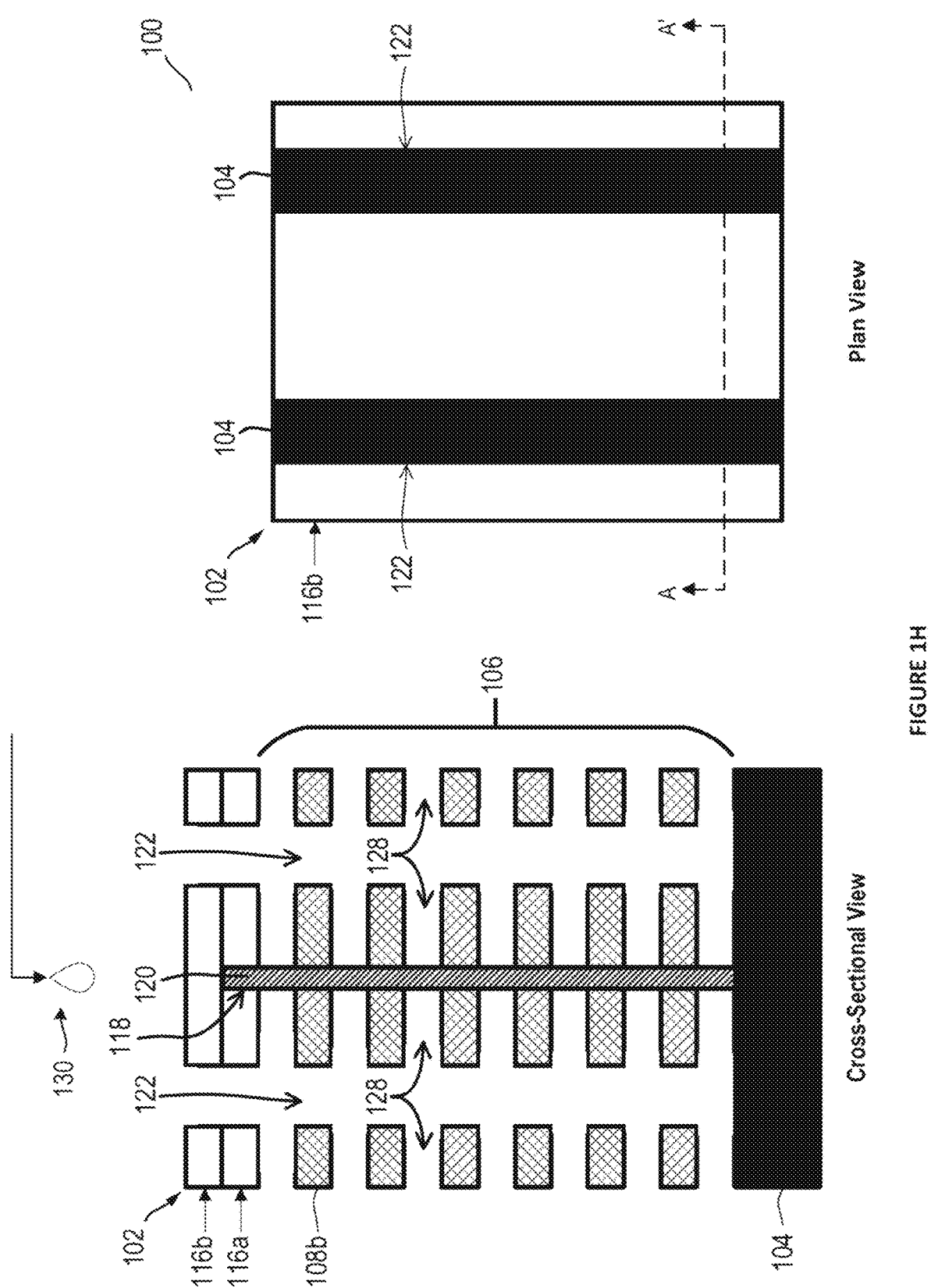

As shown in FIG. 1H, layers 108 of a particular type of material are selectively removed from layer stack 106. In the illustrated example, layers 108a are selectively removed from layer stack 106. As described above, in one example layers 108a include a first carbon-containing material (e.g., photoresist, DBARC, etc.) that has now been modified to be soluble for development due to generation of solubility-changing agent 126, and layers 108b include a second carbon-containing material (e.g., SOC, epoxy, etc.). In one example, layers 108a may be removed. In addition to voids created by openings 122, removing layers 108a leaves voids 128 within layer stack 106 where layers 108a were previously located.

Layers 108a may be removed (e.g., developed) using a suitable development process to remove layers 108a, which have been modified to be soluble in the developer. During the developing phase, soluble portions of layer stack (e.g., layers 108a) may be removed using a suitable dry etch or wet etch process. This disclosure contemplates using any suitable etch process to remove the set of layers 108 (e.g., layers 108a in this example). A suitable etch process may include an etch process that is selective to etching the layers being removed (e.g., layers 108a in this example) relative to the layers not being removed (e.g., layers 108b in this example). Given that layers 108a have been modified to be soluble for development in a given developer, layers 108a may be removed from layer stack 106 by exposing layers 108a to the developer.

For example, development of layers 108a (e.g., to remove soluble portions of layers 108a) may be performed using a wet process by treating semiconductor structure 102 with a developer solution 130 to dissolve layers 108a. The appropriate developer solution 130 may depend in part on the material of layers 108a and 108b, so that layers 108a are soluble in the developer solution 130 while selectivity is maintained relative to layers 108b. In certain embodiments, developer solution 130 may include an aqueous alkaline solution that includes a water-soluble organic base. As particular examples, developer solution 130 may include tetramethylammonium hydroxide (TMAH).

Alternatively, a dry process may be used in other embodiments, a dry process may introduce additional complexities and time. The dry process may include, for example, a selective plasma etch process or a thermal process, which may eliminate the use of a developing solution. In certain embodiments, the dry process may be performed using reactive ion etching (RIE) process or atomic layer etching (ALE).

Figure 1I:
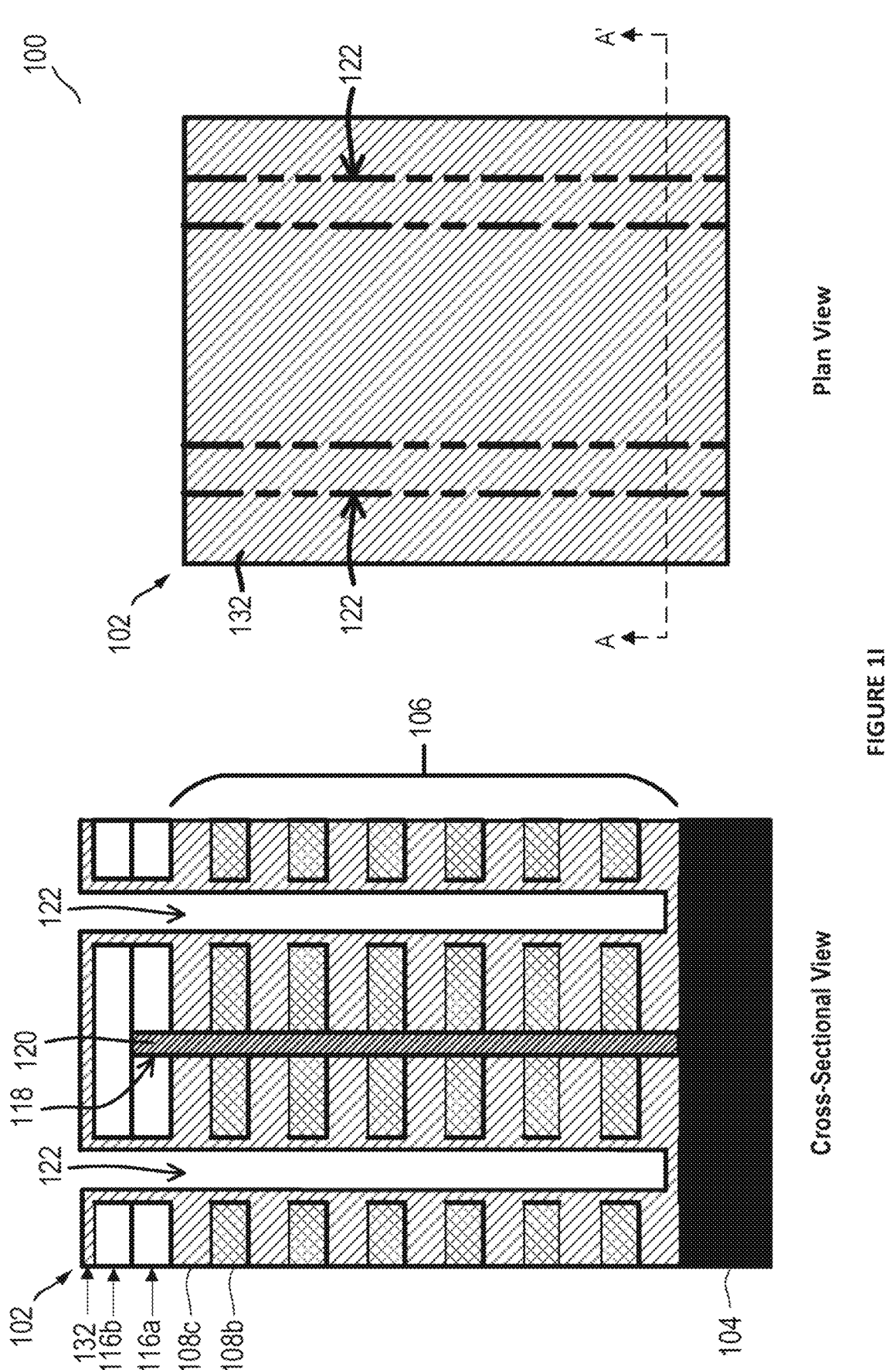

As illustrated in FIG. 1I, removed layers 108a may be replaced with another material (shown as layers 108c). Layers 108c may be formed in any suitable manner. Layers 108c may include any suitable material, such as $SiO_2$, SiN, SiON, SiC, SiOC, and/or metal oxides. As just one example, the material of layers 108c could be oxide (e.g., $SiO_2$) or nitride (e.g., SiN). In certain embodiments, the material of layers 108c is an insulating material.

In certain embodiments, to replace removed layers 108b with the material of layers 108c, open spaces in layer stack 106 may be partially or entirely filled with the material that will be layer 108c. For example, voids 128 of layer stack 106 may be filled with the material of layers 108c and openings 122 of layer stack 106 may be partially or entirely filled with the material of layers 108c. For example, the material of layers 108c may be deposited in and fill voids 128 and may extend into openings 122, partially or entirely filling openings 122 as well. In other words, an initial deposition of the material of layers 108c may be executed to fill voids 128 and extending into openings 122. In the illustrated example, excess material 132 (of the material used to form layers 108c) may be deposited as part of this initial deposition. Although excess material 132 is shown to only partially fill openings 122, this disclosure contemplates excess material 132 filling less or more (and potentially all) of openings 122). In certain embodiments, the material of layers 108c (e.g., oxide or nitride), including excess material 132, can be deposited below 20 nm. The material of layers 108c may be deposited using any suitable deposition technique or combination of techniques, such as by an ALD or other CVD process.

Figure 1J:
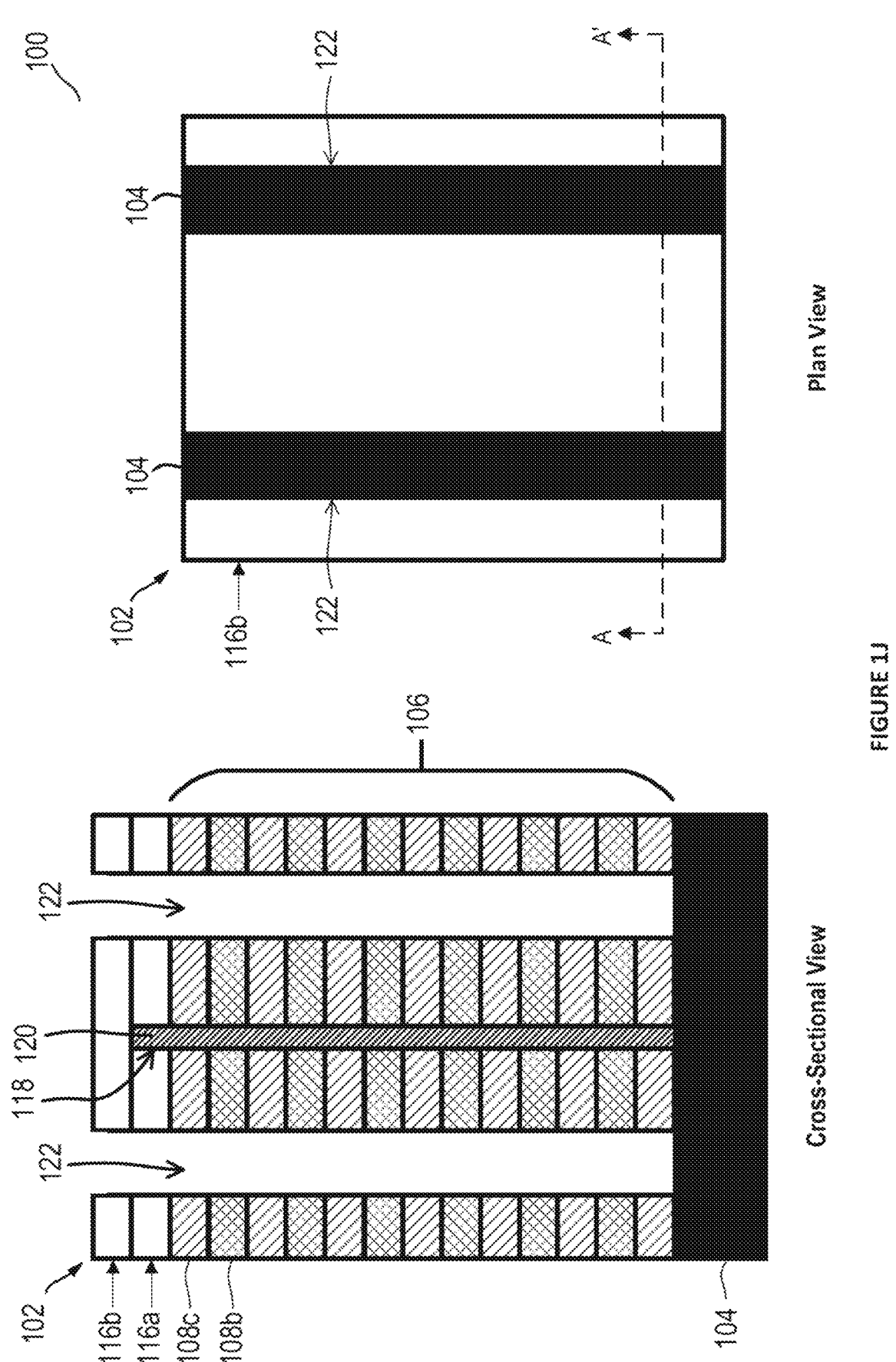

As illustrated in FIG. 1J, excess material 132 may be recessed, essentially re-forming openings 122, to expose the materials of layers 108b within openings 122 and forming layers 108c (with excess material 132 removed). A suitable etch process may be used to remove the deposited material (of layers 108c) within the area of openings 122 (excess material 132), exposing the material of layers 108b and 108c in openings 122. For example, the deposited material (of layers 108c) within the area of openings 122 (excess material 132) may be recessed using a DHF acid, a vapor phase, a plasma etch, or the like. Appropriate etch processes will depend on the materials of layer stack 106. If appropriate, as suitable masking process (e.g., potentially using a new etch mask, such as a new masking layer 116) may be used to facilitate this etch process.

Figure 1K:
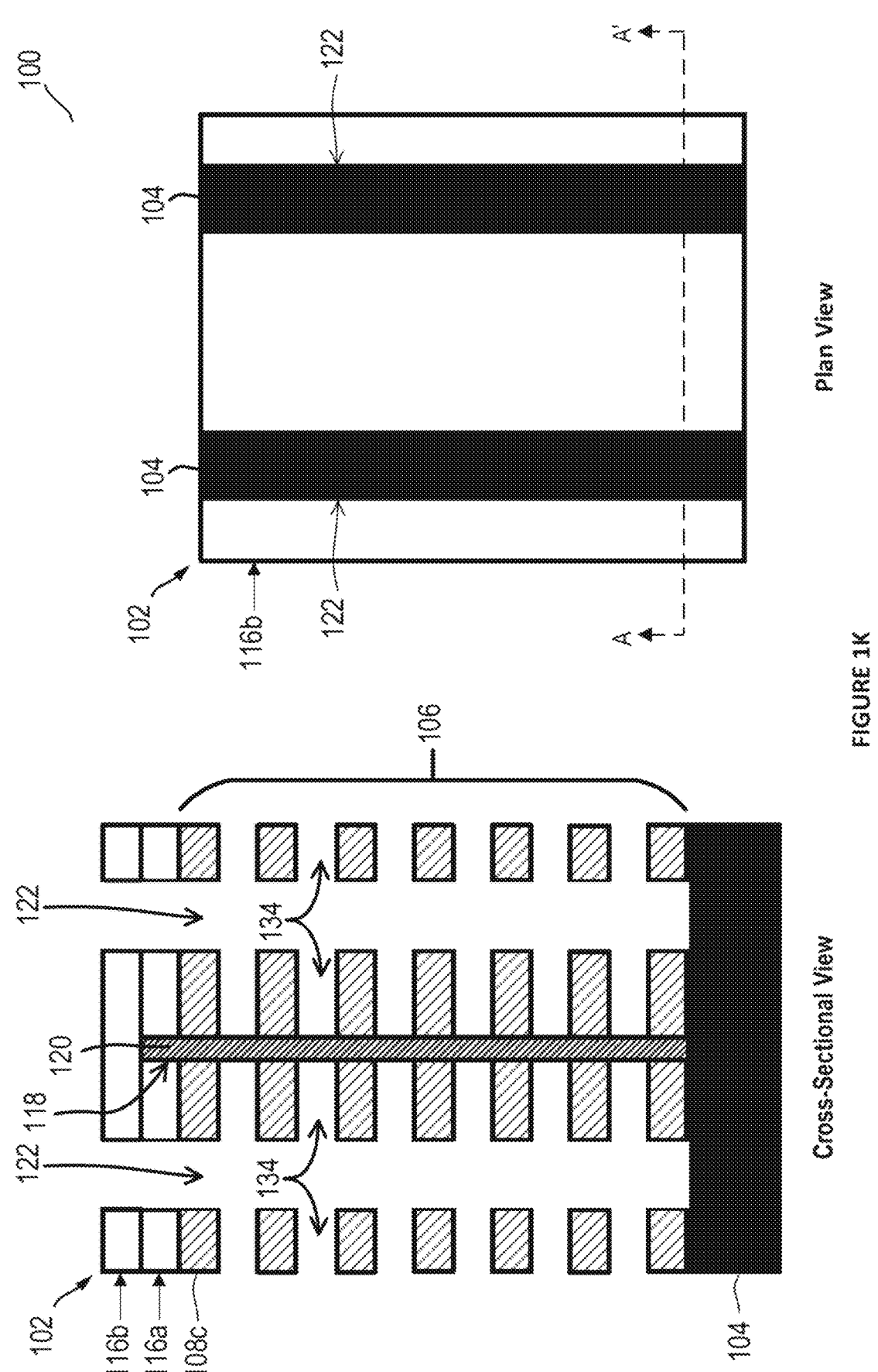

As illustrated in FIG. 1K, layers 108b are removed from layer stack 106. As described above, in one example layers 108b are SOC. Thus, in one example, the SOC (layers 108b) may be removed. In addition to voids created by openings 122, removing layers 108b leaves voids 134 within layer stack 106 where layers 108b were previously located.

This disclosure contemplates using any suitable etch process to remove layers 108b. The etch processes for removing layers 108b can include one or more wet etch processes, plasma etch processes, RIE processes, and/or other etch processes or combinations of etch processes. A suitable etch process may include an etch process that is selective to etching layers 108b relative to layers 108c. Again referring to an example in which layers 108b are SOC and layers 108c are oxide or nitride, with layers 108b (SOC) being removed, a suitable etch process might include DHF acid or vapor phase or plasma etch. In certain embodiments, the etch process for removing layers 108b is an oxygen etch process, such as an oxygen RIE process. The etch process may remove all layers 108b from layer stack 106.

Figure 1L:
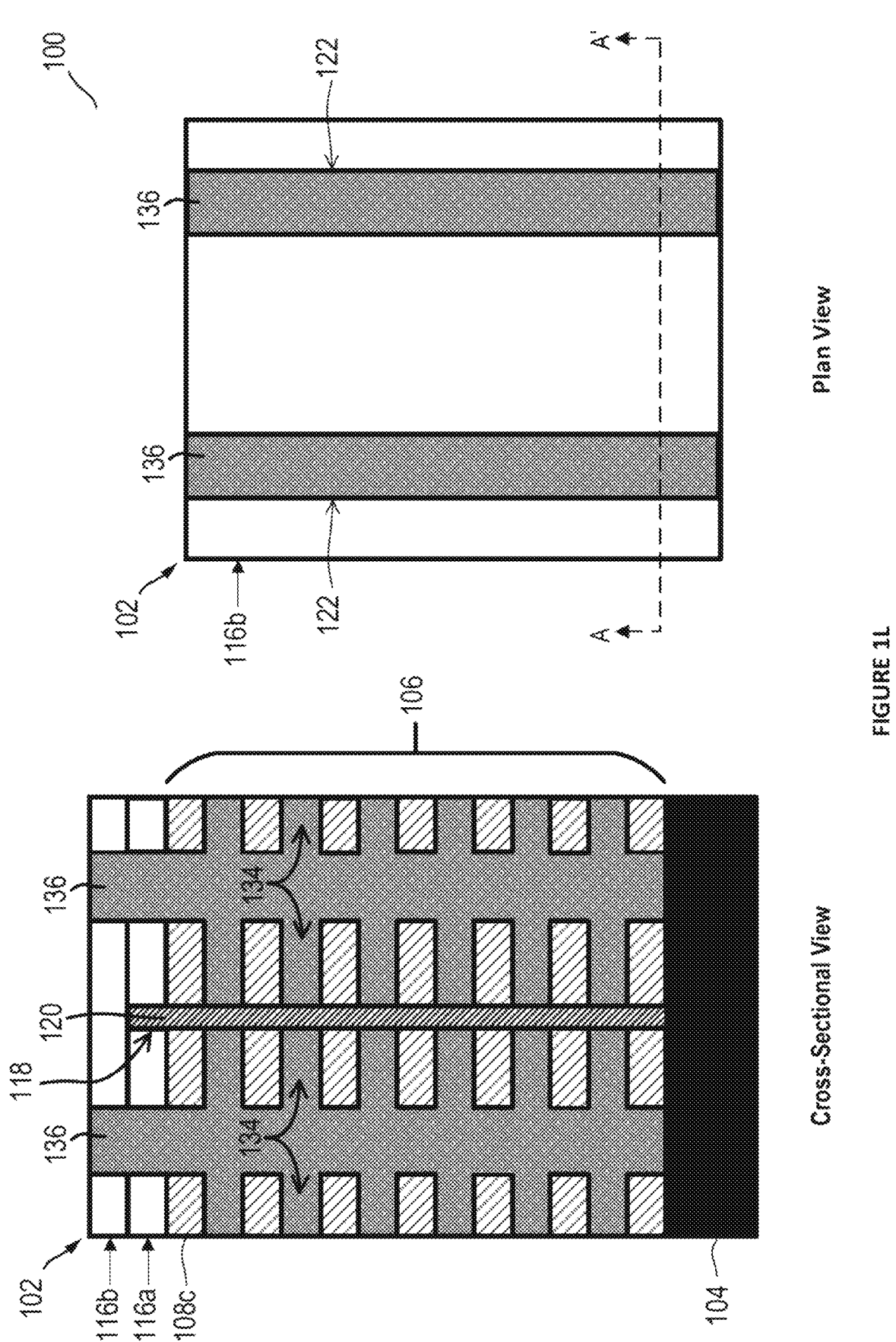

As illustrated in FIG. 1L, open spaces of layer stack 106 may be filled with a material 136. For example, voids 134 (previously occupied by layers 108b) may be filled with material 136 and openings 122 also may be filled with material 136. Material 136 may be a metal-containing material appropriate for the corresponding fabrication process, such as for forming a 3D semiconductor structure (e.g., a 3D VNAND device). In certain embodiments, material 136 may be a metal-containing material suitable for use as a gate in the 3D semiconductor structure being formed. As just one particular example, fill material 120 may include a combination of $AlO_x$, TiN, and W. Although primarily described as a metal-containing material, material 136 may be any suitable conductive material, such as any material that is suitable for acting as a gate in a transistor (e.g., a gate in a transistor of a 3D NAND memory device). Thus, in certain embodiments, in the state illustrated in FIG. 1L, layer stack 106 includes alternating oxide layers and nitride layers, making layer stack 106 an ONON stack. Other stack types are possible, such as an OPOP stack for example.

Figure 1M:
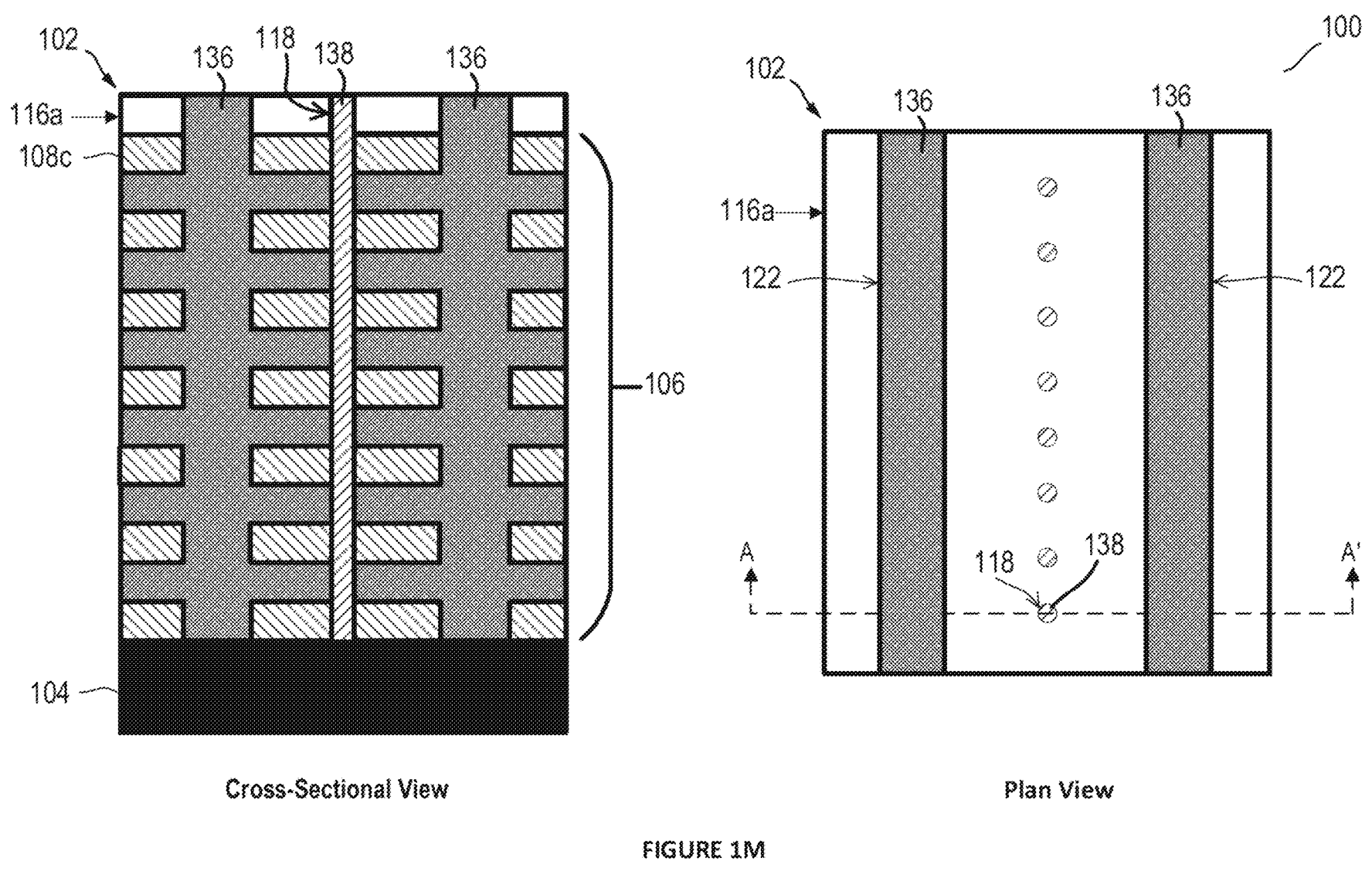

As shown in FIG. 1M, fill material 120 in openings 118 may be removed and replaced with another material (e.g., channel material 138). Fill material 120 may be removed from the area of openings 118 to re-form openings 118 (to be subsequently re-filled with channel material 138). For example, fill material 120 may be removed using any suitable etch process, such as one or more wet etch processes, plasma etch processes, RIE processes, or combinations of these or other etch processes. If appropriate, masking layer 116a may be patterned (e.g., potentially using the same etch mask used to form openings 118 in a prior step) to facilitate the etch process.

In the example illustrated in FIG. 1M, masking layer 116b and a top portion of material 136 in openings 122 may be removed, exposing fill material 120 at the top of structure 102 for replacement of fill material 120 with channel material 138. This disclosure contemplates other implementations. For example, masking layer 116b in FIG. 1L may be patterned to expose fill material 120 in opening 118, such that fill material 120 can be removed and replaced with channel material 138.

In the case of a 3D memory device, channel material 138 may include any material(s) suitable for use as a channel (or portion of a channel) of the 3D memory device. In certain embodiments, channel material 138 may include multiple material layers that include silicon, oxide, SiN, oxide, and silicon (e.g., SONOS structures). In certain embodiments, channel material 138 may include an oxide-nitride-oxide (ONO) memory stack and polysilicon material to form the polysilicon channel. In certain embodiments, openings 118 may be filled with any of $SiO_2$, SiN, $SiO_2$ and polysilicon.

For example, depositing channel material 138 may include depositing a layer of oxide (e.g., $SiO_2$), a layer of nitride (e.g., SiN), and another layer of oxide (e.g., $SiO_2$), with a remaining portion of openings 118 being filled with poly-silicon. Channel material 138 may be deposited using any suitable type of deposition process or combination of deposition processes. For example, channel material 138 may be deposited using one or more of a CVD process (including, potentially, an ALD process), a PECVD process, a PVD process, a PEPVD process.

In certain embodiments, channel material 138 is deposited in such a way (with a suitable combination of etch and/or deposition processes) so that contact can be made between a layer of channel material 138 that acts as the channel region and a conductive material at a bottom of openings 118, and ultimately to a source or drain line. In certain embodiments, at least a portion of channel material 138 includes a material that acts as a gate dielectric.

Although throughout FIGS. 1A-1M, layer stack 106 has been described as including particular alternating layers 108, layer stack 106 may include other alternating layers of suitable materials.

As can be appreciated from FIGS. 1A-1M and the associated description of process 100, at the state illustrated in FIG. 1B, layer stack 106 initially included alternating layers 108*a* and 108*b* that were deposited using spin-on deposition techniques and served as sacrificial layers that are removed and replaced with layers that form layer stack 106 in the state illustrated in FIG. 1M. Furthermore, layers 108*a* each may be removed and replaced with the material ultimately that will make up layer stack 106 (in the state illustrated in FIG. 1M), with each replacement material potentially being deposited in a single etch step (e.g., using an ALD or other CVD process). Forming layers 108*a* and 108*b* of layer stack 106 using spin-on techniques, and subsequent removal and replacement of those sacrificial layers 108*a* and 108*b*, potentially saves time and money, and also may reduce stress, and the defects cause by that stress, in semiconductor structure 102 relative to processes that repeatedly perform expensive and harsh deposition process to obtain the desired layer stack 106 shown in FIG. 1M.

Although in the example of FIGS. 1A-1M, bake 124 for changing the solubility of layers 108*a* (e.g., deprotecting layers 108*a*) is described as being performed following formation of layer stack 106 and prior to forming openings 118, bake 124 may be performed at any suitable time. As just one example, bake 124 may be performed during formation of layer stack 106. In one example, bake 112*a* and bake 124 may be the same bake, with bake 112 being of sufficient temperature to both cause crosslinking in layers 108*a* and cause agent-generating ingredient 110 in layers 108*a* to generate solubility-changing agent 126 in layers 108*a*. In another example, bakes 112*a* and 124 may be performed during formation of layer stack 106 but remain separate bakes, with bake 112*a* being performed following deposition of layers 108*a* and bake 124 being performed following bake 112*a*. In another example, bake 124 may be performed following formation of openings 122 in layer stack 106.

To the extent a nitride material (e.g., SiN) is used for layers 108*c* (see, e.g., FIGS. 1I-1J) in place of an oxide layer, in certain embodiments, the order of layers 108*a* and 108*b*, as initially deposited, may be reversed, including which is the first to be removed and replaced. Other differences to the executed deposition and etch processes may be applicable to accommodate the modified arrangement and materials.

FIGS. 2A-2F illustrate cross-sectional views of an example semiconductor structure 202 during an example process 200 for forming a 3D semiconductor structure, according to certain embodiments. In this example, an agent-generating ingredient of certain layers of a layer stack are a PAG.

In this example, certain aspects of structure 202 and process 200 may correspond to aspects of structure 102 and process 100, respectively, described above with reference to FIGS. 1A-1M and are not repeated. For brevity and clarity, this description adopts a convention in which elements adhering to the pattern [x02] may be related implementations of a process and/or semiconductor workpiece in certain embodiments. For example, except as otherwise stated or readily apparent, semiconductor structure 202 may be similar to semiconductor structure 102, substrate 204 may be similar to substrate 104, and the like. An analogous convention has also been adopted for other elements as made clear by the use of similar terms in conjunction with the described three-digit numbering system. Through this convention, where applicable, features that have already been described are incorporated by reference without being repeated.

Figure 2A:
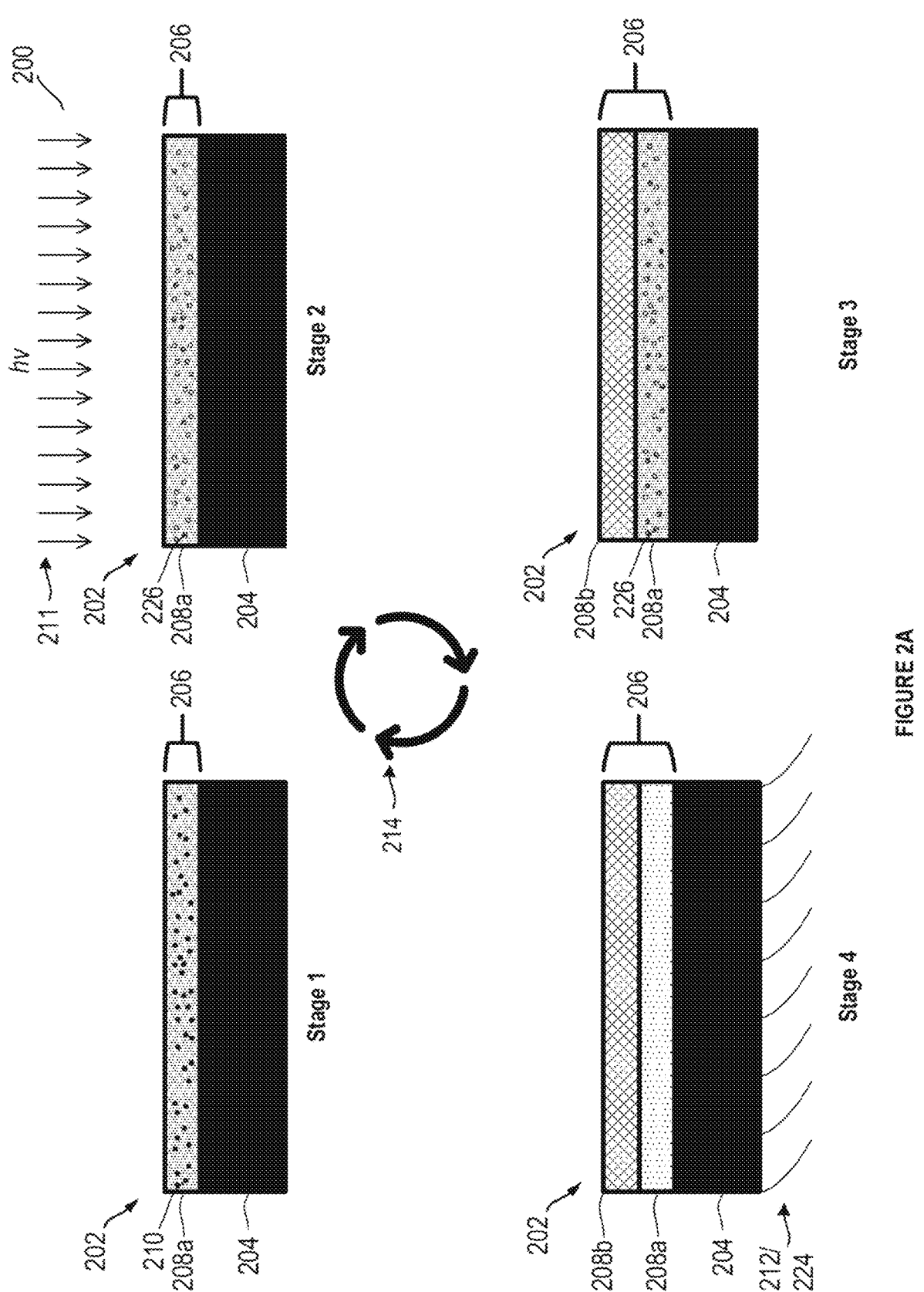
FIGS. 2A-2F illustrate cross-sectional views of an example semiconductor structure during an example process for forming a 3D semiconductor structure, according to certain embodiments.

FIG. 2A illustrates cross-sectional views of an example process for forming a layer stack 206 on a substrate 204. The layer stack 206 being formed may include alternating layers 208*a* and 208*b*, which may be referred to generally as layers 208. Layer stack 206 also may be referred to as a wafer stack or a multilayer stack.

At stage 1, and particularly in a first pass of stage 1, a layer 208*a* may be deposited over substrate 204. Substrate 204 may include any substrate material(s) suitable for use in forming a 3D semiconductor structure, such as a 3D memory device. For example, substrate 204 may be or include silicon.

Layer 208*a* may be a layer to undergo a solubility change when exposed to a solubility-changing agent (e.g., acid) for subsequent removal in a development step. Layer 208*a* may be a carbon-containing layer, the solubility of which can be modified for development, at a later portion of process 200, in a developer. Layer 208*a* may be a multicomponent material that, as deposited, includes two or more components. Layer 208*a* may include a carbon-containing component and an agent-generating ingredient 210 for generating a solubility-changing agent in response to an activation trigger. In certain embodiments, layer 208*a* includes a solvent to facilitate deposition (e.g., using a spin-coating deposition technique). For example, the solvent may allow the material of layer 208*a* to be spun to form a thin layer on an underlying layer.

A carbon-containing component of layer 208*a* may include a polymer or another suitable type of carbon-containing material of which the solubility can be modified using a solubility-changing agent (e.g., acid) generated from an agent-generating ingredient 210 of layer 208*a*. The carbon-containing component (e.g., the polymer) is designed to change its structure when exposed to the solubility-changing agent (e.g., acid).

In the example of process 200, agent-generating ingredient 210 may include any suitable material that, in response to radiation, generates a solubility-changing agent (e.g., an acid). In certain embodiments, agent-generating ingredient 210 is a PAG that is configured to generate or otherwise release acid in response to UV light exposure, such as actinic radiation. The generated solubility-changing agent (e.g., acid) may induce further chemical reactions in layer 208*a* that modify layer 208*a* to be soluble in a developer. For example, the generated agent may be a substance that is configured to change the solubility of a material in which the agent is disposed in response to a suitable trigger (e.g., heat), and thus may be referred to as a solubility-changing agent.

For purposes of the example process 200 of FIGS. 2A-2F, agent-generating ingredient 210 will be described as a PAG.

In certain embodiments, layer 208a includes a photoresist material with an embedded agent-generating ingredient 210 (e.g., a PAG). For example, the photoresist material may be a CAR. The photoresist material of layer 208a may be appropriate for the type of solubility-changing agent and developer to be used, so that layer 208a can undergo a solubility change and be removed using a developer. The photoresist material of layer 208a may be a positive photoresist or a negative photoresist.

As another particular example, layer 208a may include a developable ARC, such as a DBARC having an agent-generating ingredient 210.

At stage 2, the activation trigger for causing agent-generating ingredient 210 to generate a solubility-changing agent may be executed. As described above, for purposes of the example process 200, agent-generating ingredient 210 is described as a PAG. Thus, in the example of FIGS. 2A-2F, the activation trigger for causing agent-generating ingredient 210 to generate a solubility-changing agent is exposing layer 208a to actinic radiation 211 (irradiating layer 208a) to cause agent-generating ingredient 210 to generate a solubility-changing agent 226 in layer 208a. For example, actinic radiation 211 may be directed toward semiconductor structure 202, and particularly to a surface of layer 208a to cause agent-generating ingredient 210 to generate a solubility-changing agent 226 in layer 208a. As illustrated at stage 2 of FIG. 2A, in response to exposure to actinic radiation 211, agent-generating ingredient 210 may generate or otherwise release solubility-changing agent 226 in layers 208a, which may be referred to as activating solubility-changing agent 226.

The lithography technology used for the exposing layer 208a to actinic radiation 211 may include any suitable type of lithography technologies. In certain embodiments, the exposure suitable for causing the PAG to generate solubility-changing agent 226 may be a flood exposure. In the case of a flood exposure, it may be possible to perform the exposure in an on-track module of a track-based lithography system without moving semiconductor structure 202 to a stepper for more complex exposure. In the case of a more complex exposure, semiconductor structure 202 may be transferred from a track system to an exposure module (which also may be referred to as a stepper module or scanner module) for exposing layer 208a to actinic radiation 211. An example lithography system that includes a projection scanner is described in greater detail below with reference to FIGS. 6-7. This disclosure contemplates performing the exposure step in any suitable manner.

Of course, this disclosure contemplates including other suitable types of agent-generating ingredients that generate solubility-changing agent 226 in response to a suitable activation trigger (e.g., heat, radiation, or another suitable trigger), if appropriate.

At stage 3, a layer 208b may be deposited over layer 208a. Layer 208b may be a carbon-containing layer. Layer 208b may be a multicomponent material that, as deposited, includes two or more components. For example, layer 208b may include a carbon-containing component. A carbon-containing component of layer 208b may include a polymer or another suitable type of carbon-containing material. As another example, layer 208b may include a solvent to facilitate deposition (e.g., using a spin-coating deposition technique). For example, the solvent may allow the material of layer 208b to be spun to form a thin layer on an underlying layer.

In certain embodiments, the materials used for layer 208b may include SOC, SiOC, ODL, OPL, SiOCN, SiC, photoresist, ARC, BARC, epoxy, among others. Some of these examples may overlap in type.

At stage 4, one or more bakes 212/224 of semiconductor structure 202 may be performed. Heating semiconductor structure 202 via bakes 212/224 may serve one or more purposes.

As a first example purpose, bake 212 of semiconductor structure 202 may be performed to cause a crosslinking reaction (e.g., a polymer crosslinking reaction) to occur in layers 208a and/or 208b. For example, polymer chains of layers 208a and/or 208b may be crosslinked via bond formation induced by heat. In certain embodiments, the crosslinking may include C—C bond formation or S—S bond formation among others. As just one particular example, layers 208a and/or 208b may include hydroxystyrene that may undergo crosslinking in response to adequate heat.

This crosslinking reaction may cause layers 208a and/or 208b to harden or otherwise strengthen, which may render layers 208a and/or 208b more able to handle the stress of additional layers 208 as layer stack 206 increases in height. In certain embodiments, the crosslinking reaction may render layers 208b insoluble in a developer that will be used to remove layers 208a in a subsequent processing step; however, in certain embodiments, layers 208b already may be insoluble in such a developer.

In certain embodiments, bake 212 may be performed by heating semiconductor structure 202 in a process chamber at a temperature between 50° C. to 250° C., for example between 140° C. to 150° C. in certain embodiments, in vacuum or under a gas flow. In certain embodiments, for causing the crosslinking reaction, bake 212 is first performed at a lower temperature than a bake (e.g., bake 224) that may be performed to cause agent-generating ingredient 210 of layers 208a to generate a solubility-changing agent and modify a solubility of layers 208a, such as at an approximately 20° C.-40° C. lower temperature. In a particular example, semiconductor structure 202 is baked for 1 to 3 minutes. The bake conditions of bake 212 may be selected to promote the crosslinking of layers 208a and/or 208b. This disclosure contemplates executing bake 212 in any suitable manner.

As another example purpose, bake 224 of semiconductor structure 202 may be performed to modify layer 208a to become soluble in a developer. In response to bake 224, solubility-changing agent 226 may modify layer 208a (e.g., the carbon-containing material of layers 208a) to be soluble for development (e.g., removal) in a developer. That is, solubility-changing agent 226 may induce further chemical reactions in layers 208a that modify layers 208a to be soluble in a developer. For example, solubility-changing agent 226 may be a substance that is configured to change the solubility of a material in which solubility-changing agent 226 is disposed in response to a suitable trigger (e.g., heat). In certain embodiments, solubility-changing agent 226 is an acid.

For example, bake 224 may cause solubility-changing agent 226 to react with other substances (e.g., a polymer) of layers 208a to modify layers 208a to become soluble for development. For example, bake 224 may cause a solubility-changing agent to convert one or more of the pendant groups of another substance (e.g., a polymer) of the exposed regions to cause the exposed regions to become soluble for development. This process also may be referred to as a deprotection reaction that causes the exposed regions to become deprotected (e.g., soluble) in a given developer.

In certain embodiments, bake 224 may be performed by heating semiconductor structure 202 in a process chamber at a temperature between 50° C. to 250° C., for example between 180° C. to 200° C. in certain embodiments, in vacuum or under a gas flow. In a particular example, semiconductor structure 202 is baked for 1 to 3 minutes. The bake conditions of bake 224 may be selected to promote modification of the solubility of layers 208a. This disclosure contemplates executing bake 224 in any suitable manner.

Bakes 212/224 could be a single bake or could be multiple bakes performed at the same or different temperatures. For example, a first bake 212 at a first temperature could be performed to cause the crosslinking reaction to occur in layers 208a and/or 208b, and a second bake 224 at a second temperature could be performed to cause the deprotection reaction to occur in layers 208a. In certain embodiments, the second temperature is greater than the first temperature. In certain embodiments, the first bake 212 is performed prior to the second bake 224. To the extent bake 212/224 is instead a single bake, bake 212/224 may be performed at the temperature for causing solubility-changing agent 226 to modify layers 208a to become soluble for development, which may be a higher temperature than a temperature for causing the crosslinking reaction in layers 208a and/or 208b but still able to cause the crosslinking reaction in layers 208a and/or 208b.

In certain embodiments, bake a first bake 212 (e.g., analogous to bake 112a) for causing crosslinking in layer 208a may be performed between stages 1 and 2, a bake 224 may be performed between stages 2 and 3 to cause the generated solubility-changing agent 226 to modify a solubility of layer 208a in a developer, and a second bake 212 (e.g., analogous to bake 112b) for causing crosslinking in layer 208b may be performed as the bake 212 shown at stage 4.

Stages 1-4 may be performed to build a layer stack 206 of alternating layers 208a and 208b. For example, stages 1-4 may be repeated a suitable number of times, as illustrated by circular arrows 214, to build a layer stack 206 having a target number of layers 208. An example layer stack 206 that may include multiple alternating layers 208a and 208 is illustrated and described in connection with FIG. 2B.

Although stages 1-4 are illustrated, additional stages may be performed or stages 1-4 may be combined in any suitable manner. In certain embodiments, bake 212 could be performed after each layer 208 is deposited, or after more than two layers 208 are deposited. Furthermore, to the extent multiple bakes 212 are performed, temperatures of the multiple bakes 212 may be the same or different, as may be appropriate for a given implementation. Furthermore, although a first instance of layer 208a is described as being deposited prior to a first instance of layer 208b, a first instance of layer 208b could be deposited prior to a first instance of layer 208a.

Although a bake 212 sufficient to cause solubility-changing agent 226 to modify a solubility of layers 208a at stage 4 is described, this disclosure contemplates the bake for causing solubility-changing agent 226 to modify a solubility of layers 208a being performed at another time, such as following formation of openings 222 as described below with reference to FIG. 2E (e.g., similar to bake 124 described above with reference to FIG. 1G).

In certain embodiments, a layer 208b could be deposited over layer 208a prior to exposure of layer 208a to actinic radiation 211, or multiple layers 208a and 208b could be deposited prior to exposure to actinic radiation 211; however, doing so may present certain challenges to ensuring that layers 208a are exposed to adequate actinic radiation 211 to ensure that a sufficient amount of agent-generating ingredient 210 in layers 208a are activated for modification of layers 208a during a deprotection step.

In certain embodiments, during the stack-formation process of FIG. 2A, layers 208a and 208b may be deposited on semiconductor structure 202 in any suitable manner. For example, a layer 208 may be deposited by spin-coating, spray-coating, dip-coating, or roll-coating. As a particular example, a layer 208 may be deposited on semiconductor structure 202 using a spin-on deposition technique, which also may be referred to as spin-coating, such as in the manner described above with reference to FIG. 1A.

Layers 208 of layer stack 206 may be deposited using a spin-coating system, for example, a particular example of which is described below with reference to FIG. 8. In certain embodiments, forming a layer 208 using a spin-on coating deposition process includes depositing the layer 208 using a spin-coating process and potentially baking and/or curing the deposited layer 208 following deposition. In certain embodiments, layers 208 may be deposited in a deposition module (e.g., a spin-coating module) of a larger track system. An example track system is described in greater detail below with reference to FIGS. 6-7.

In certain embodiments, a same tool may be used to perform the deposition, bake, and cure; however, this disclosure contemplates using multiple tools. The bake may be a low-temperature bake step.

Figures 2B, 2C:
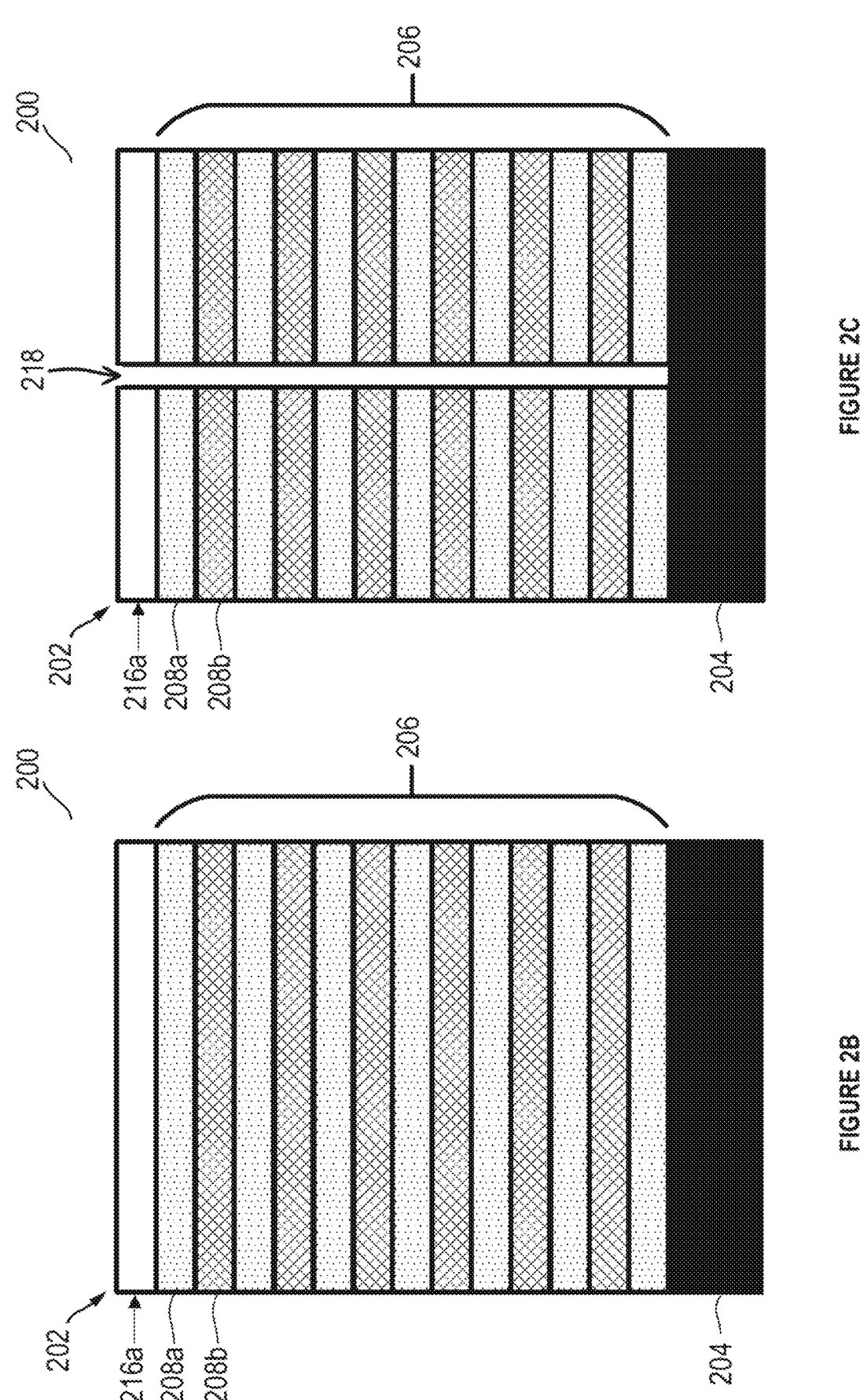

As shown in FIG. 2B, in general structure 202 may correspond to structure 102 in the state shown in FIG. 1B, with structure 202 including layers 208a being deposited with a PAG as an agent-generating ingredient 210 rather than the TAG described above for structure 102, and with a solubility of layers 208a having been previously modified during formation of layer stack 206. Thus, layer stack 206 of layers 208a and layers 208b may be formed in a similar manner to layer stack 106 of FIG. 1A, with layers 208a and layers 208b being deposited using spin-on coating techniques in a similar manner to that described above with reference to layers 108a and layers 108b of structure 102 in FIG. 1A. Although this disclosure contemplates layers 208a and layers 208b including any of the spin-on materials described herein, in one example, layers 208a include a photoresist or DBARC material and layers 208b include SOC. Furthermore, structure 202 includes substrate 204 and masking layer 216a, which may be similar to substrate 104 and masking layer 116a, respectively, of structure 102 in FIGS. 1A-1M. In certain embodiments, masking layer 216a is a hardmask, and may include silicon, nitride, metal oxide, or metal.

As shown in FIG. 2C, openings 218 may be formed in layer stack 206 through layers 208. Openings 218 may be formed in a manner similar and may be similar to openings 118 described above with reference to FIG. 1C, with appropriate masking and etch processes being used according to the materials of layers 208a and 208b.

Figures 2D, 2E:
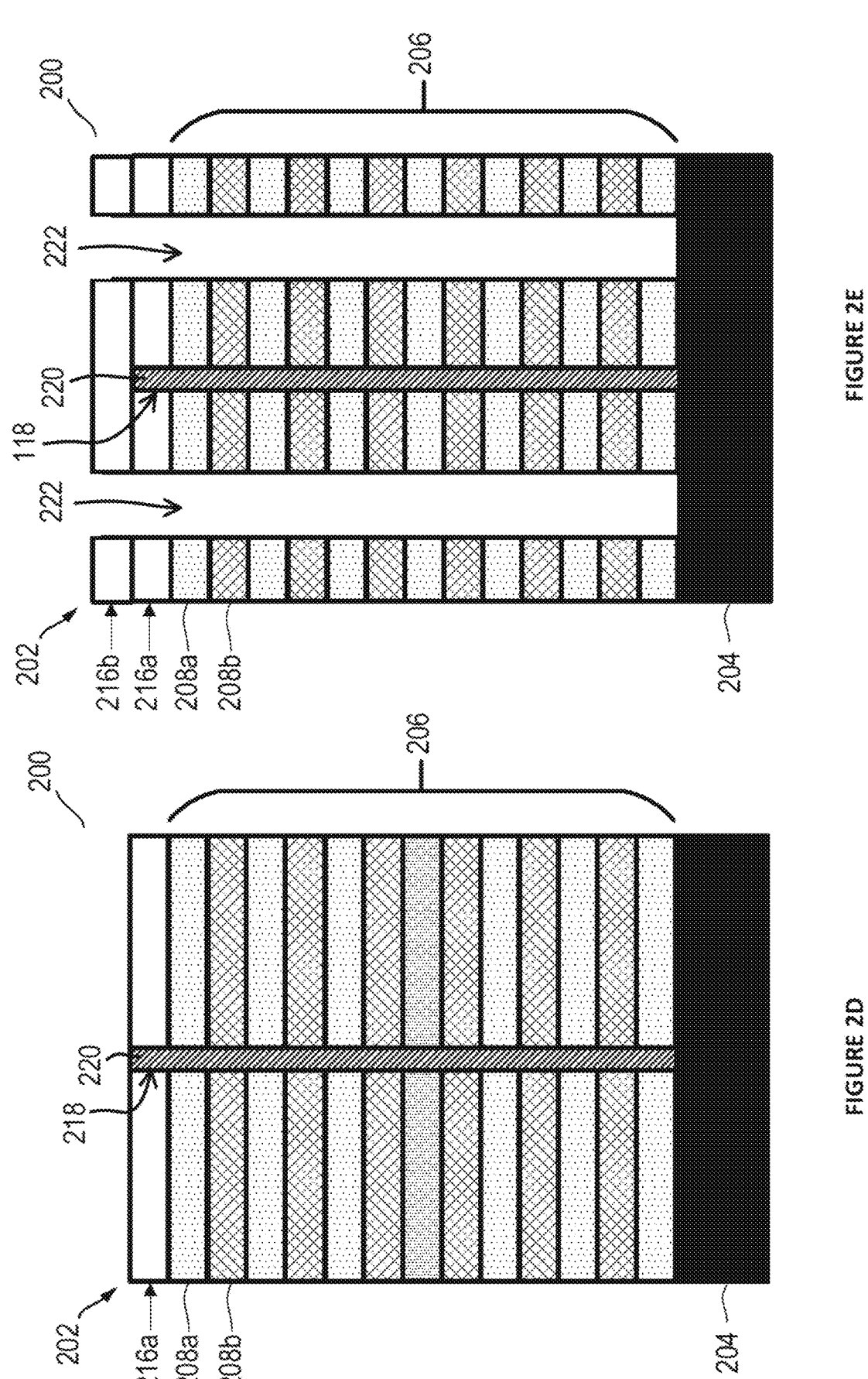

As shown in FIG. 2D, openings 218 may be filled with a fill material 220. Fill material 220 may be similar to fill material 120 described above with reference to FIG. 1D. Furthermore, fill material 220 may be deposited in a manner similar to fill material 120 described above with reference to FIG. 1D. Fill material 220 may be a sacrificial material that is replaced at a later stage of process 200. Although fill material 220 may include any material suitable to serve as a sacrificial material (or dummy material), in certain embodiments, fill material 220 is a metal oxide fill material.

As shown in FIG. 2E, openings 222 are formed in layer stack 206 through layers 208. Openings 222 may be formed in a similar manner and may be similar to openings 122 described above with reference to FIG. 1E, with appropriate masking and etch processes being used according to the materials of layers 208a and 208b and fill material 220. Openings 222 may be formed in any suitable manner. In certain embodiments, another masking layer 216b may be deposited on top of layer stack 206 (e.g., on top of masking layer 216a). Masking layer 216b may be used as an etch mask for subsequent etch steps. In certain embodiments, masking layer 216b is resistant to etching in a subsequent etching process for forming openings 222 in layer stack 206. Masking layer 216b may include a material suitable for use in the etch process to be performed, considering selectivity of the etch process being performed. In certain embodiments, masking layer 216b is silicon, SiN (e.g., $Si_3N_4$), or a metal hardmask, but masking layer 216b may include any suitable material for use as an etch mask layer. In certain embodiments, masking layer 216b is deposited using an ALD or other CVD deposition process. Masking layer 216b may protect fill material 220 from being etched during formation of openings 222. In certain embodiments, rather than depositing a new masking layer 216b on top of masking layer 216a, masking layer 216a may be removed and masking layer 216b may replace masking layer 216a.

Figure 2F:
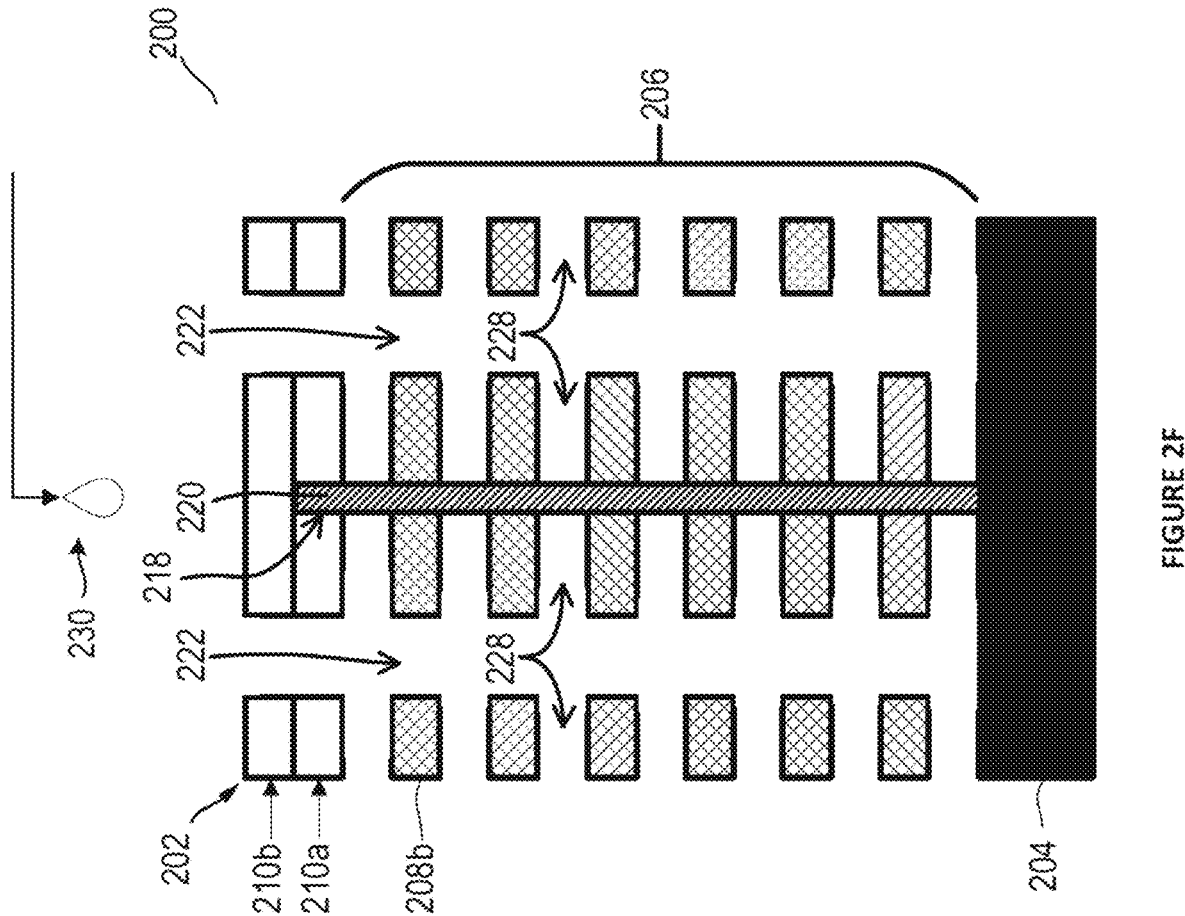

As shown in FIG. 2F, layers 208 of a particular type of material are selectively removed from layer stack 206. In the illustrated example, layers 208a are selectively removed from layer stack 206. As described above, in one example layers 208a include a first carbon-containing material (e.g., photoresist, DBARC, etc.) that has now been modified to be soluble for development due to generation of solubility-changing agent 226, and layers 208b include a second carbon-containing material (e.g., SOC). In one example, layers 208a may be removed. In addition to voids created by openings 222, removing layers 208a leaves voids 228 within layer stack 206 where layers 208a were previously located.

Layers 208a may be removed (e.g., developed) using a suitable development process to remove layers 208a, which have been modified to be soluble in the developer. During the developing phase, soluble portions of layer stack (e.g., layers 208a) may be removed using a suitable dry etch or wet etch process. This disclosure contemplates using any suitable etch process to remove the set of layers 208 (e.g., layers 208a in this example). A suitable etch process may include an etch process that is selective to etching the layers being removed (e.g., layers 208a in this example) relative to the layers not being removed (e.g., layers 208b in this example). Given that layers 208a have been modified to be soluble for development in a given developer, layers 208a may be removed from layer stack 206 by exposing layers 208a to the developer.

For example, development of layer 208a (e.g., to remove soluble portions of the layer 208a) may be performed using a suitable solvent wash 230, such as an organic solvent. Potential example organic solvents may include propylene glycol methyl ether acetate (PGMEA), 2-Heptanone, isopropyl alcohol (IPA), 2-Pentanone, or another suitable organic solvent. In one example, the solvent dispense volume may be between 5 ml to 500 ml, for example 10 ml to 100 ml. The substrate (e.g., structure 202) may be secured to a rotating chuck that supports the substrate. The rotating speed during liquid dispense can be between 50 rpm to 3000 rpm, for example 1000 rpm to 2000 rpm. Although organic solvents are primarily described, this disclosure contemplates using any suitable solvent.

As another example, development of layer 208a (e.g., to remove soluble portions of layers 208a) may be performed in a gas phase with or without plasma. Example gases for such a gas phase may include HBr, BCL3, or another suitable gas/gas combination.

Subsequent processing of semiconductor structure 202 using process 200 may proceed in a similar manner to that described above with reference to FIGS. 1I-1M, the details of which, for conciseness, are not repeated.

FIG. 3A-3B illustrates a flow diagram of an example method 300 for forming 3D semiconductor structures, according to certain embodiments. At step 302, a layer stack of alternating layers of first carbon-containing material and second carbon-containing material may be formed. The first carbon-containing material layers and the second carbon-containing material layers may be formed by spin-on deposition. For example, the layer stack may correspond to an initial state of layers stacks 106 or 206 of structures 102 or 202, respectively. In certain embodiments, the first carbon-containing material includes a photoresist or DBARC material, and the second carbon-containing material includes SOC, SiOC, ODL, OPL, SiOCN, SiC, BARC, or epoxy. The first carbon-containing material and the second carbon-containing material may be different materials such that at least one of the first carbon-containing material or the second carbon-containing material can be selectively etched relative to the other of the first carbon-containing material or the second carbon-containing material, or relative to another material of the structure being processed.

As described above, the first carbon-containing layers (e.g., layers 108a or 208a) may be a layer to undergo a solubility change when exposed to a solubility-changing agent (e.g., acid) for subsequent removal in a development step, and to that end may include an agent-generating ingredient 110/210 for generating a solubility-changing agent 126/226 in response to an activation trigger (e.g., heat or radiation). The agent-generating ingredient 110/210 may include any suitable material that, in response to a suitable agent-activation trigger (e.g., heat or radiation), generates a solubility-changing agent (e.g., an acid). For example, the agent-generating ingredient 110/210 may be a TAG or a PAG, and the generated solubility-changing agent 126/226 may be an acid.

At step 304, the activation trigger for causing the agent-generating ingredient 110/210 of the first layers 108/208a to generate a solubility-changing agent 126/226 may be executed. As described above, in certain embodiments, the agent-generating ingredient of the first layers of the layer stack is a TAG that is activated in response to adequate heat. In such an example, the activation trigger for causing agent-generating ingredient 110 to generate a solubility-changing agent is executing a bake 124 of semiconductor structure 102. In response to bake 124, agent-generating ingredient 110 may generate or otherwise release solubility-changing agent 126 in layers 108a, which may be referred to as activating solubility-changing agent 126.

With a TAG, in response to bake 124, solubility-changing agent 126 may induce further chemical reactions in layers 108a that modify layers 108a to be soluble in a developer. For example, solubility-changing agent 126 may be a substance that is configured to change the solubility of a material in which solubility-changing agent 126 is disposed in response to a suitable trigger (e.g., heat). In certain embodiments, solubility-changing agent 126 is an acid. In a particular example, solubility-changing agent 126 may modify layer 108a (e.g., the carbon-containing material of layers 108a) to be soluble for development (e.g., removal) in a developer, as described above.

Alternatively, as described above, in certain embodiments, the agent-generating ingredient of the first layers of the layer stack is a PAG that is activated in response to suitable actinic radiation. In such an example, the activation trigger for causing agent-generating ingredient to generate solubility-changing agent 226 is exposing layers 208a to actinic radiation 211 (irradiating layers 208a) to cause agent-generating ingredient 210 to generate a solubility-changing agent 226 in layer 208a. In certain embodiments, the exposure suitable for causing the PAG to generate solubility-changing agent 226 may be a flood exposure.

With a PAG, a post-exposure bake (e.g., bake 212) may be performed to modify layers 208a to become soluble in a developer. In response to bake 212, solubility-changing agent 226 may modify layers 208a (e.g., the carbon-containing material of layers 208a) to be soluble for development (e.g., removal) in a developer. That is, solubility-changing agent 226 may induce further chemical reactions in layers 208a that modify layers 208a to be soluble in a developer, as described above.

Of course, this disclosure contemplates including other suitable types of agent-generating ingredients 110/210 that generate solubility-changing agent 126/226 in response to a suitable activation trigger (e.g., heat, radiation, or another suitable trigger), if appropriate.

At step 306, first openings may be etched through the layer stack. For example, the first openings may correspond to openings 118 or 218 of structures 102 or 202, respectively. The first openings may be channel openings.

At step 308, the first openings may be filled with a third material. In certain embodiments, the third material may be a fill material to be later replaced by a channel material (e.g., at step 322). For example, the fill material may be fill material 120 or 220 of structures 102 or 202, respectively. Alternatively, the third material may be a material or combination of materials suitable for use in a channel of a 3D memory device or other 3D semiconductor device. For example, the third material may be a channel material, such as channel material 138 of structure 102 (or what would be channel material 238 of structure 202 if additional steps of process 200 had been described with reference to FIGS. 2A-2F). As a particular example of a channel material, the channel material may include one or more of SiO$_2$, SiN, and polysilicon.

At step 310, second openings may be etched through the layer stack. For example, the second openings may correspond to openings 122 or 222 of structures 102 or 202, respectively. The second openings may expose the alternating layers of the layer stack. For example, the second openings may be openings through which a conductive gate material may be deposited at a later step (e.g., step 318), and also may be used to remove selected sacrificial layers of the layer stack and/or deposit and remove additional fill materials.

At step 312, the layers of the first carbon-containing material may be removed from the layer stack. For example, the layers of the first carbon-containing may be removed from the layer stack by exposing the layers of the first carbon-containing material to a first etch chemistry. The first spin-on material may correspond to layers 108a or 208a of structures 102 or 202, respectively. The layers of the first carbon-containing material may be removed using any suitable etch process, including, for example, exposing the layers of the first carbon-containing material to a suitable developer in which the first carbon-containing material is soluble. For example, development of layers 108a (e.g., to remove soluble portions of layers 108a) may be performed using a wet process by treating semiconductor structure 102 with a developer solution 130 to dissolve layers 108a. As a particular example, developer solution 130 may include TMAH.

At step 314, the layers of the first carbon-containing material may be replaced with a fourth material. The fourth material may correspond to the material of layers 108c of structure 102 (or what would be layers 208c of structure 202 if additional steps of process 200 had been described with reference to FIGS. 2A-2F). In certain embodiments, the fourth material may be an insulating material, such as a nitride (e.g., SiN) or an oxide (e.g., SiO$_2$). The fourth material may be deposited using any suitable deposition technique, including, for example, an ALD or other CVD process.

At step 316, the layers of the second carbon-containing material may be removed from the layer stack. For example, the layers of the second carbon-containing material may be removed from the layer stack by exposing the layers of the second carbon-containing material to a second etch chemistry. The second carbon-containing material may correspond to layers 108b or 208b of structures 102 or 202, respectively. The layers of the second carbon-containing material may be removed using any suitable etch process, including, for example, a wet etch process or a plasma process.

At step 318, the layers of the second carbon-containing material may be replaced with a fifth material. In certain embodiments, the fifth material may include a conductive material, such as a metal containing material or combination of materials suitable for use as a conductive gate/wordline (e.g., of a 3D memory device). The fifth material may be deposited using any suitable deposition technique, including, for example, an ALD or other CVD process.

In certain embodiments, replacing the layers of the second carbon-containing material with a fifth material includes replacing the layers of the second carbon-containing material (as removed at step 316) with a fill material (e.g., an oxide material), removing the fill material (using a suitable etch chemistry), and replacing the fill material with the fifth material. In certain embodiments, a portion of the fill material (e.g., in the second openings) may be removed (using a suitable etch chemistry) and replaced with yet another fill material (e.g., a metal oxide), and both the fill materials may be removed (using a suitable etch chemistry) and replaced with the fifth material.

At step 320, the third material in the first openings may be removed from the layer stack. For example, the third material, which may be a fill material as described above with reference to step 306, may be removed from the layer stack by exposing the third material to an etch chemistry. The third material may correspond to fill material 120 or 220 of structures 102 or 202, respectively. The third material may be removed using any suitable etch process, including, for example, a wet etch process or a plasma process.

At step 322, the third material in the first openings may be replaced with a sixth material. The sixth material may be a material or combination of materials suitable for use in a channel of a 3D memory device or other 3D semiconductor device. For example, the sixth material may be a channel material, such as channel material 138 of structure 102 (or what would be channel material 238 of structure 202 if additional steps of process 200 had been described with reference to FIGS. 2A-2F). As a particular example of a channel material, the channel material may include one or more of SiO$_2$, SiN, and polysilicon. The sixth material may be deposited using any suitable deposition technique, including, for example, an ALD or other CVD process.

As described above with reference to step 308, in certain embodiments, rather than being a fill material to be later replaced with a sixth material (e.g., a channel material), the third material may already be the sixth material. In such an example, steps 320 and 322 may be omitted.

Figure 4:
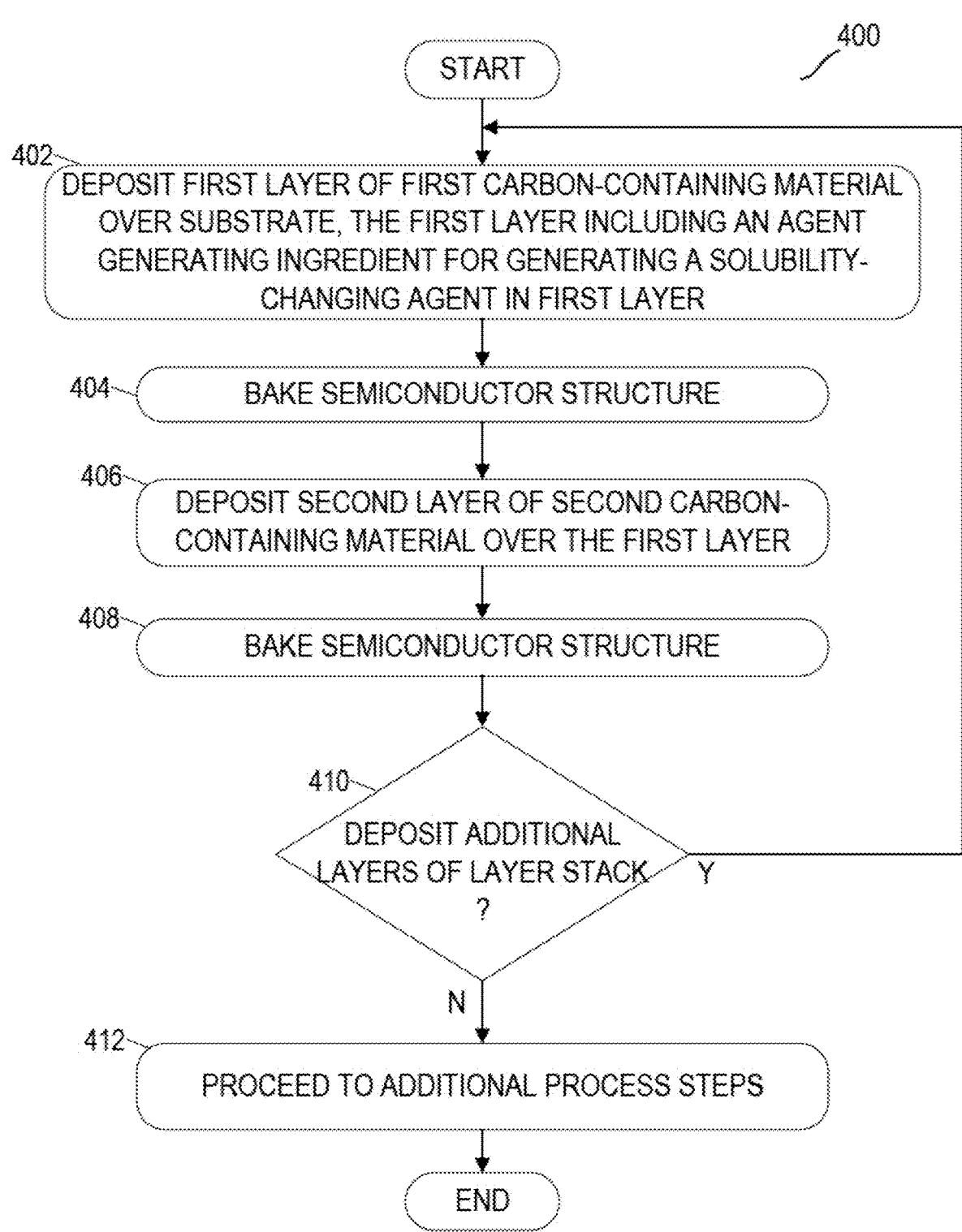
FIG. 4 illustrates a flow diagram of an example method for forming 3D semiconductor structures, according to certain embodiments.

FIG. 4 illustrates a flow diagram of an example method 400 for forming a layer stack, according to certain embodiments. In certain embodiments, method 400 may be used to form a layer stack of alternating layers in which certain layers include a TAG as an agent-generating ingredient. For example, method 400 may be used to form layer stack 106. Method 400 may be combined with other techniques described throughout this disclosure, such as with method 300 as just one example. In certain embodiments, method 400 is an example technique for performing step 302 of method 300 of FIGS. 3A-3B.

At step 402, a layer of a first carbon-containing material may be deposited over a substrate. In certain embodiments, the layer of the first carbon-containing material may be deposited over the substrate using a spin-on deposition technique. The layer of the first carbon-containing material may correspond to layer 108*a* deposited over substrate 104, as described above with reference to FIGS. 1A-1M. As described above, the layer of the first carbon-containing material (e.g., a layer 108*a*) may be a layer to undergo a solubility change when exposed to a solubility-changing agent (e.g., acid) for subsequent removal in a development step, and to that end may include an agent-generating ingredient for generating a solubility-changing agent in response to an activation trigger. For purposes of example method 400, it will be assumed that the agent-generating ingredient 110 is a TAG, the solubility-changing agent 126 is acid, and the activation trigger is heat.

In certain embodiments, layer 108*a* includes a photoresist material with an embedded agent-generating ingredient 110 (e.g., a TAG). For example, the photoresist material may be a CAR. As another particular example, layer 108*a* may include a developable ARC, such as a DBARC having an agent-generating ingredient 110.

At step 404, the semiconductor structure that includes the deposited layer of the first carbon-containing material (e.g., layer 108*a*) may be baked. This bake may correspond to bake 112*a* described above with reference to FIG. 1A. Bake 112*a* of semiconductor structure 102 may cause a crosslinking reaction (e.g., a polymer crosslinking reaction) to occur in layer 108*a*. For example, polymer chains of layer 108*a* may be crosslinked via bond formation induced by heat. This crosslinking reaction may cause layer 108*a* to harden or otherwise strengthen, which may render layer 108*a* more able to handle the stress of additional layers 108 as layer stack 106 increases in height.

At step 406, a layer of a second carbon-containing material may be deposited over the layer of the first carbon-containing material. In certain embodiments, the layer of the second carbon-containing material may be deposited over the layer of the first carbon-containing material using a spin-on deposition technique. The layer of the second carbon-containing material may correspond to layer 108*b* deposited over layer 108*a*, as described above with reference to FIGS. 1A-1M. In certain embodiments, the material used for layer 108*b* may include SOC, SiOC, ODL, OPL, SiOCN, SiC, photoresist, ARC, BARC, epoxy, among others. Some of these examples may overlap in type.

At step 408, the semiconductor structure that includes the deposited layer of the second carbon-containing material may be baked. This bake may correspond to bake 112*b* described above with reference to FIG. 1A. Bake 112*b* of semiconductor structure 102 may cause a crosslinking reaction (e.g., a polymer crosslinking reaction) to occur in layer 108*b*. For example, polymer chains of layer 108*b* may be crosslinked via bond formation induced by heat. This crosslinking reaction may cause layer 108*b* to harden or otherwise strengthen, which may render layer 108*b* more able to handle the stress of additional layers 108 as layer stack 106 increases in height.

At step 410, a determination may be made regarding whether additional layers of the first and/or second carbon-containing materials are to be added to the layer stack being formed. If a determination is made that additional layers of the first and/or second carbon-containing materials are to be added, then method 400 may return to step 402 to deposit additional layers. If a determination is made that addition layers of the first and/or second carbon-containing materials are not to be added, then method 400 may proceed to step 410 to perform additional processing. In certain embodiments, the additional process may include forming a hard-mask layer (e.g., masking layer 116*a*) over layer stack 106. In certain embodiments, additional processing may include proceeding to step 304 of method 300 of FIGS. 3A-3B. Although a first instance of layer 108*a* is described as being deposited prior to a first instance of layer 108*b*, a first instance of layer 108*b* could be deposited prior to a first instance of layer 108*a*.

Figure 5:
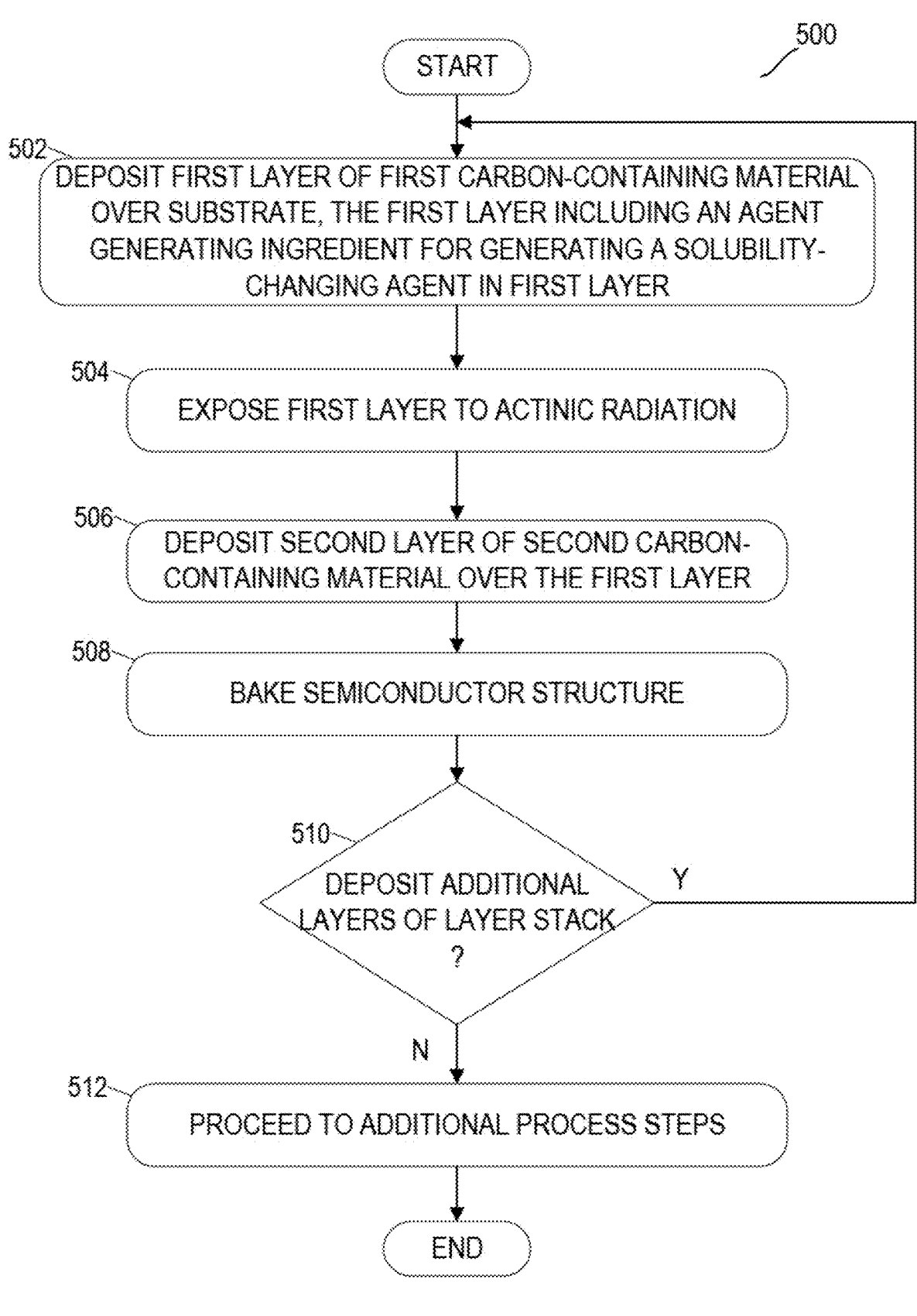
FIG. 5 illustrates a flow diagram of an example method for forming 3D semiconductor structures, according to certain embodiments.

FIG. 5 illustrates a flow diagram of an example method 500 for forming a layer stack, according to certain embodiments. In certain embodiments, method 500 may be used to form a layer stack of alternating layers in which certain layers include a PAG as an agent-generating ingredient. For example, method 500 may be used to form layer stack 206. Method 500 may be combined with other techniques described throughout this disclosure, such as with method 300 as just one example. In certain embodiments, method 500 is an example technique for performing step 302 of method 300 of FIGS. 3A-3B.

At step 502, a first layer of a first carbon-containing material may be deposited over a substrate. In certain embodiments, the first layer of the first carbon-containing material may be deposited over the substrate using a spin-on deposition technique. The first layer of the first carbon-containing material may correspond to layer 208*a* deposited over substrate 204, as described above with reference to FIGS. 2A-2F. As described above, the first layer of the first carbon-containing material (e.g., a layer 208*a*) may be a layer to undergo a solubility change when exposed to a solubility-changing agent (e.g., acid) for subsequent removal in a development step, and to that end may include an agent-generating ingredient for generating a solubility-changing agent in response to an activation trigger. For purposes of example method 500, it will be assumed that the agent-generating ingredient 210 is a PAG, the solubility-changing agent 226 is acid, and the activation trigger is radiation.

In certain embodiments, layer 208*a* includes a photoresist material with an embedded agent-generating ingredient 210 (e.g., a PAG). For example, the photoresist material may be a CAR. As another particular example, layer 208*a* may include a developable ARC, such as a DBARC having an agent-generating ingredient 210.

At step 504, first layer 208a of first carbon-containing material may be exposed to actinic radiation 211 to cause agent-generating ingredient 210 (a PAG) to generate a solubility-changing agent 226 (e.g., acid). For example, actinic radiation 211 may be directed toward semiconductor structure 202, and particularly to a surface of layer 208a to cause agent-generating ingredient 210 to generate a solubility-changing agent 226 in layer 208a. The lithography technology used for the exposing layer 208a to actinic radiation 211 may include any suitable type of lithography technologies. In certain embodiments, the exposure suitable for causing the PAG to generate solubility-changing agent 226 may be a flood exposure.

At step 506, a second layer of a second carbon-containing material may be deposited over the first layer of the first carbon-containing material. In certain embodiments, the second layer of the second carbon-containing material may be deposited over the first layer of the first carbon-containing material using a spin-on deposition technique. The second layer of the second carbon-containing material may correspond to layer 208b deposited over layer 208a, as described above with reference to FIGS. 2A-2F. In certain embodiments, the material used for layer 208b may include SOC, SiOC, ODL, OPL, SiOCN, SiC, photoresist, ARC, BARC, epoxy, among others. Some of these examples may overlap in type.

At step 508, the semiconductor structure that includes the deposited first and second layers may be baked. This bake may correspond to bake 212/224 of semiconductor structure 202 described above with reference to FIG. 2A. Bake 212/224 could be a single bake or could be multiple bakes performed at the same or different temperatures, as described above.

In certain embodiments, bake 212/224 may be performed to modify layer 208a to become soluble in a developer. In response to bake 212/224, solubility-changing agent 226 may modify layer 208a (e.g., the carbon-containing material of layers 208a) to be soluble for development (e.g., removal) in a developer. Additionally or alternatively, bake 212/224 of semiconductor structure 202 may cause a crosslinking reaction (e.g., a polymer crosslinking reaction) to occur in layers 208a and/or 208b. For example, polymer chains of layers 208a and/or 208b may be crosslinked via bond formation induced by heat. This crosslinking reaction may cause layers 208a and/or 208b to harden or otherwise strengthen, which may render layers 208a and/or 208b more able to handle the stress of additional layers 208 as layer stack 206 increases in height.

In certain embodiments, step 508 could be performed after each layer 208 is deposited, or after more than two layers 208 are deposited. Furthermore, to the extent multiple bakes 212/224 are performed, temperatures of the multiple bakes 212/224 may be the same or different, as may be appropriate for a given implementation. Furthermore, although a first instance of layer 208a is described as being deposited prior to a first instance of layer 208b, a first instance of layer 208b could be deposited prior to a first instance of layer 208a.

Although a bake 212/224 sufficient to cause solubility-changing agent 226 to modify a solubility of layers 208a at step 508 is described, this disclosure contemplates the bake for causing solubility-changing agent 226 to modify a solubility of layers 208a being performed at another time, such as following formation of openings 222 as described above with reference to FIG. 2E.

At step 510, a determination may be made regarding whether additional layers of the first and/or second carbon-containing materials are to be added to the layer stack being formed. If a determination is made that additional layers of the first and/or second carbon-containing materials are to be added, then method 500 may return to step 502 to deposit additional layers. If a determination is made that addition layers of the first and/or second carbon-containing materials are not to be added, then method 500 may proceed to step 512 to perform additional processing. In certain embodiments, the additional process may include forming a hardmask layer (e.g., masking layer 216a) over layer stack 206. In certain embodiments, additional processing may include proceeding to step 304 of method 300 of FIGS. 3A-3B.

FIGS. 6-9 illustrate example processing tools that may be used, alone or in combination, to implement certain embodiments of this disclosure.

Figure 6:
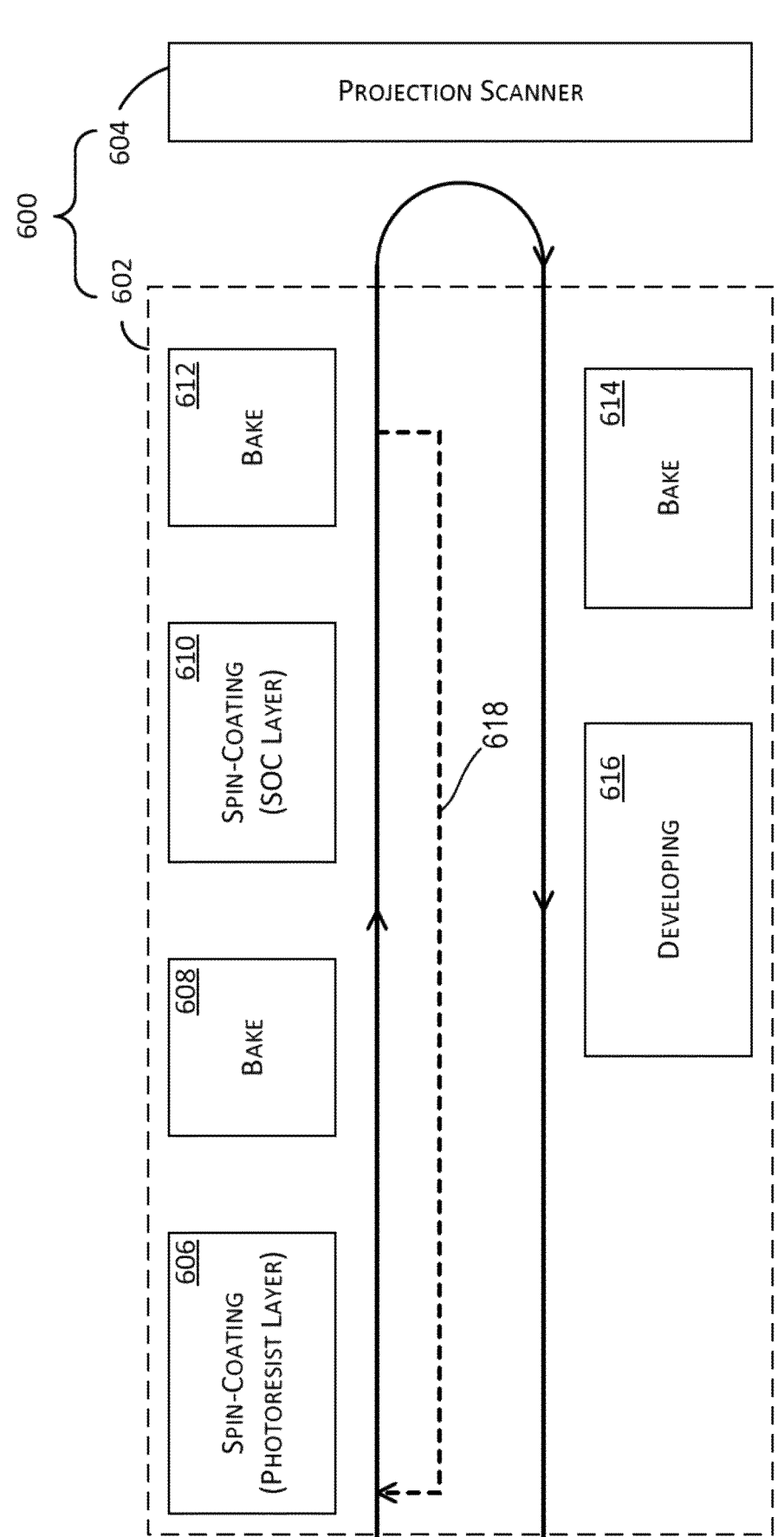
FIG. 6 illustrates a block diagram of an example coater-developer system, according to certain embodiments.

FIG. 6 illustrates a block diagram of an example coater-developer system 600, according to certain embodiments. Coater-developer system 600 is just one example of a coater-developer system that may be used with certain embodiments of this disclosure. In the illustrated example, coater-developer system 600 includes a track system 602 and a projection scanner 604. In certain embodiments, coater-developer system 600 is generally configured for performing portions of process 100, method 300, and/or method 400.

Track system 602 includes a series of process modules assembled to allow potentially sequential execution of processes for the process being performed using coater-developer system 600. Track system 602 provides the material processes such as coating the wafer with the carbon-containing material (e.g., photoresist or SOC), baking the photoresist (potentially more than once), and developing the photoresist.

In the illustrated example, the process modules of track system 602 include a spin-coating module 606 (e.g., for depositing the carbon-containing material of layers 108a, such as photoresist or DBARC, having an agent-generating ingredient 110, such as a TAG), a bake module 608 (e.g., for promoting crosslinking in layers 108a), a spin-coating module 610 (e.g., for depositing the carbon-containing material of layers 108b, such as SOC), a bake module 612 (e.g., for promoting crosslinking in layers 108b), a bake module 614 (e.g., for causing agent-generating ingredient 110 to generate solubility-changing agent 126 and/or causing solubility-changing agent 126 to modify a solubility of layers 108a), and a developing module 616 for developing the deprotected layers 108a.

Spin-coating modules 606 and 610 include a spin-coater, an example of which is described below with reference to FIG. 8. The carbon-containing materials of layers 108a and 108b, solvents, and the like are connected from a liquid supply system to suitable processing modules (e.g., spin-coating modules 606 and 610, developing module 616, etc.) via pipelines, filters, valves, and pumps.

Coater-developer system 600 may include a transfer system to move a wafer (e.g., a semiconductor structure 102) from module-to-module of track system 602, as well as from track system 602 to projection scanner 604 (which may be considered "off track") and from projection scanner back 604 to track system 602. As illustrated by dashed line 618, in certain embodiments, a wafer under processing may be cycled through modules 606, 608, 610, and 612 a sufficient number of times for a layer stack to reach a target number of layers.

To the extent used, scanner 604 may be configured to perform an exposure phase. Scanner 604 may be a combination of an optical and mechanical system to scan an optical image of a pattern printed on a photomask onto the surface of a wafer coated with resist. After scanning the pattern once, scanner 604 may be operated to step to an adjacent location on the same wafer where the scan is repeated to form another copy of the pattern. In this manner, the photoresist layer is exposed to multiple copies of the pattern arranged in a rectangular matrix on the surface of the wafer. In certain embodiments, at least for purposes of depositing, deprotecting, and removing certain layers 108 of layer stack 106 (e.g., in certain implementations of agent-generating ingredient 110 being a TAG), projection scanner is not used.

Figure 7:
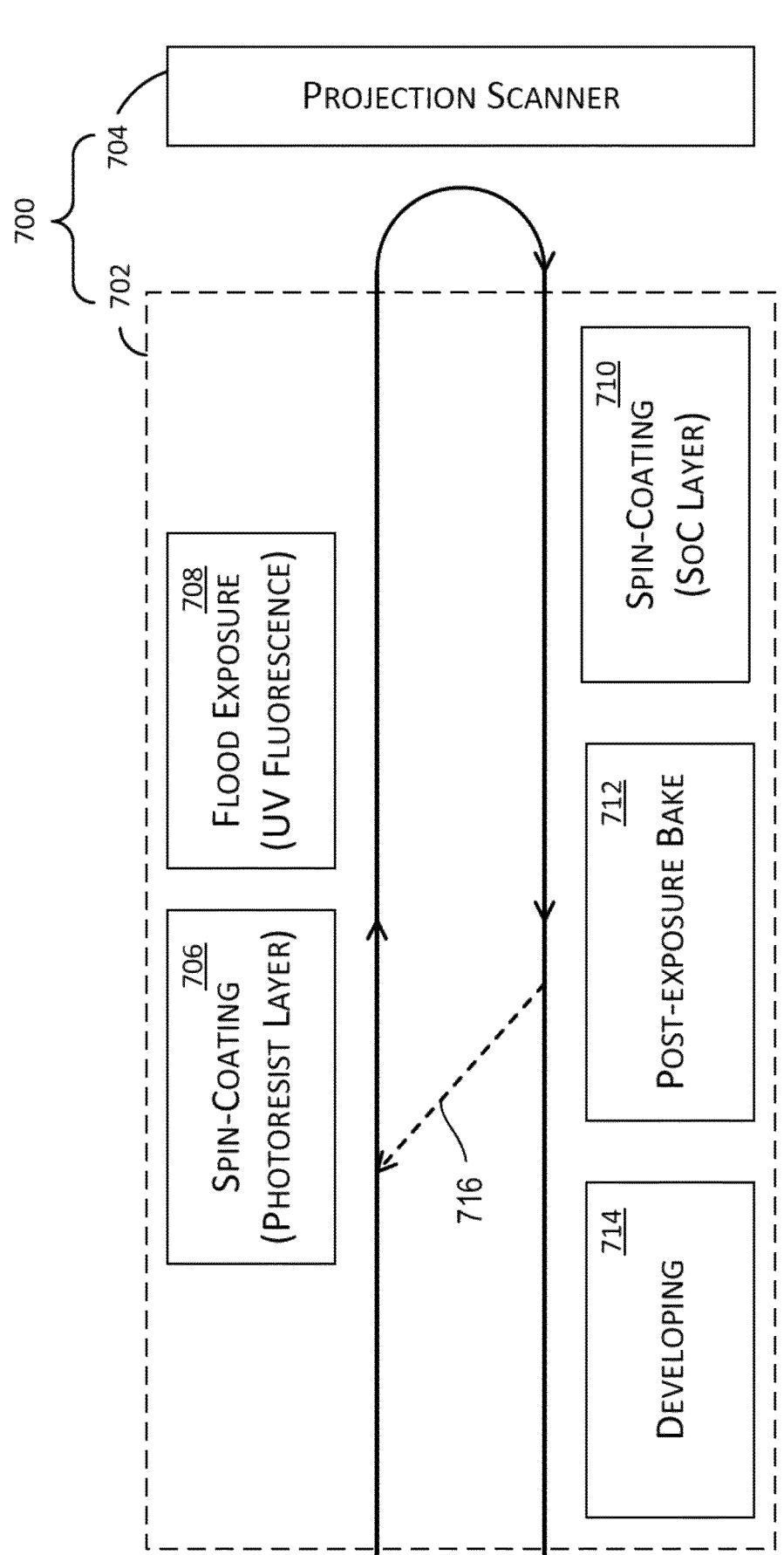
FIG. 7 illustrates a block diagram of an example coater-developer system, according to certain embodiments.

FIG. 7 illustrates a block diagram of an example coater-developer system 700, according to certain embodiments. Coater-developer system 700 is just one example of a coater-developer system that may be used with certain embodiments. In the illustrated example, coater-developer system 700 includes a track system 702 and a projection scanner 704. In certain embodiments, coater-developer system 700 is generally configured for performing portions of process 200, method 300, and/or method 500. In general, coater-developer system 600 is similar to coater-developer system 700, except that coater-developer system 700 has been configured for performing patterning process 200. The description of coater-developer system 700 is incorporated by reference.

Track system 702 includes a series of process modules assembled to allow potentially sequential execution of processes for the process being performed by coater-developer system 700. Track system 702 provides the material processes such as coating the wafer with the carbon-containing material (e.g., photoresist or SOC), exposing certain layers of the wafer to actinic radiation, baking the photoresist (potentially more than once), and developing the photoresist.

In the illustrated example, the process modules of track system 702 include a spin-coating module 706 (e.g., for depositing the carbon-containing material of layers 208a, such as photoresist or DBARC, having an agent-generating ingredient 210, such as a PAG), a flood exposure module 708 (e.g., for exposing layers 208a to actinic radiation and thereby cause agent-generating ingredient 210 to generate solubility-changing agent 226 in layers 208a), a spin-coating module 710 (e.g., for depositing the carbon-containing material of layers 208b, such as SOC), a bake module 712 (e.g., for promoting crosslinking in one or more of layers 208a/208b) and for causing causing solubility-changing agent 226 to modify a solubility of layers 208a), and a developing module 714 for developing the deprotected layers 208a.

Spin-coating modules 706 and 710 include a spin-coater, an example of which is described below with reference to FIG. 8. The carbon-containing materials of layers 208a and 208b, solvents, and the like are connected from a liquid supply system to suitable processing modules (e.g., spin-coating modules 706 and 710, developing module 714, etc.) via pipelines, filters, valves, and pumps.

Coater-developer system 700 may include a transfer system to move a wafer (e.g., a semiconductor structure 202) from module-to-module of track system 702, as well as from track system 702 to projection scanner 704 (which may be considered "off track") and from projection scanner back 704 to track system 702. As illustrated by dashed line 716, in certain embodiments, a wafer under processing may be cycled through modules 706, 708, 710, and 712 a sufficient number of times for a layer stack to reach a target number of layers.

To the extent used, scanner 704 may be configured to perform an exposure phase in a similar manner to that described above with reference to scanner 704 of FIG. 7. In certain embodiments, at least for purposes of depositing, deprotecting, and removing certain layers 208 of layer stack 206, projection scanner is not used. For example, rather than transferring a wafer to projection scanner 704 for exposure (related to activating the PAG of layers 208a), track system 702 may include flood exposure module 708 configured to expose layers 208a to actinic radiation.

Regarding both example coater-developer systems 600 and 700 of FIGS. 6 and 7, respectively, each coater-developer system 600 and 700 might include additional modules and/or a wafer may be moved from the coater-developer system 600/700 to another tool for selected processing throughout processes 100/200 and/or methods 300/400/500. For example, for forming openings 118/218 and/or openings 122/222, including associated patterning of masking layers 116, coater-developer system 600/700 may include additional modules for performing some or all of those steps and/or a wafer may be moved to one or more other tools for performing some or all of those processes, potentially being returned to coater-developer system 600/700 for one or more process steps (e.g., development), and then potentially again being moved to one or more other tools for further processing.

Figure 8:
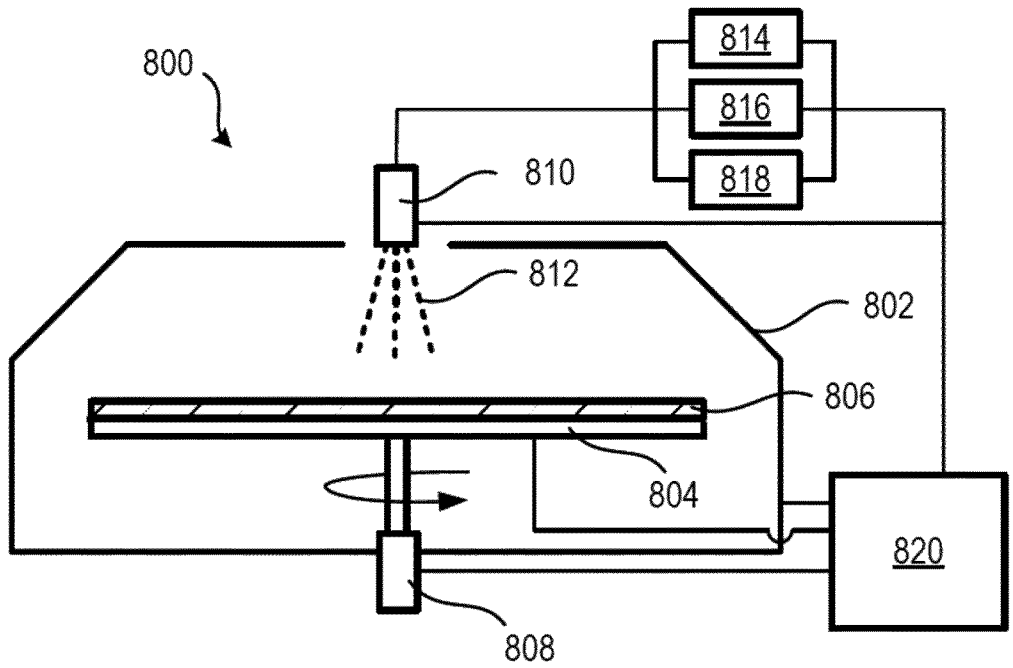
FIG. 8 illustrates an example liquid-based spin-on deposition system, according to certain embodiments.

FIG. 8 illustrates an example liquid-based spin-on deposition system 800, according to certain embodiments. For example, liquid-based spin-on deposition system 800 may be used to process any of the described semiconductor structures to deposit any of the layers 108/208 or other suitable materials described in this disclosure. In certain embodiments, spin-on deposition system 800 may be a semi-closed spin-on deposition system used for coating substrates (wafers) with a desired layer. The semi-closed configuration may allow fume control and minimize exhaust volume.

In the illustrated example, spin-on deposition system 800 includes a process chamber 802 that includes a substrate holder 804 for supporting, heating, and rotating (spinning) a substrate 806 (which may include any of the semiconductor structures described in this disclosure at appropriate stages of processing), a rotating apparatus 808 (e.g., a motor), and a liquid delivery nozzle 810 configured for providing a processing liquid 812 to an upper surface of the substrate 806. Liquid supply systems 814, 816, and 818 supply different processing liquids to the liquid delivery nozzle 810. For depositing a photoresist, the different processing liquids can include, for example, a first reactant in a first liquid, a second reactant in a second liquid, and a rinsing liquid. In certain embodiments, spin-on deposition system 800 includes additional liquid delivery nozzles for providing different liquids to substrate 806. Example rotating speeds can be between about 500 rpm and about 1500 rpm, for example 1000 rpm, during exposure of an upper surface of substrate 806 to processing liquid 812.

Spin-on deposition system 800 may include a controller 820 that can be coupled to and control process chamber 802; liquid supply systems 814, 816, and 818; liquid delivery nozzle 810; rotating apparatus 808, mechanism for heating substrate holder 804. Substrate 806 may be under an inert atmosphere during film deposition. Spin-on deposition system 800 may be configured to process substrates 806 of any suitable size.

Figure 9:
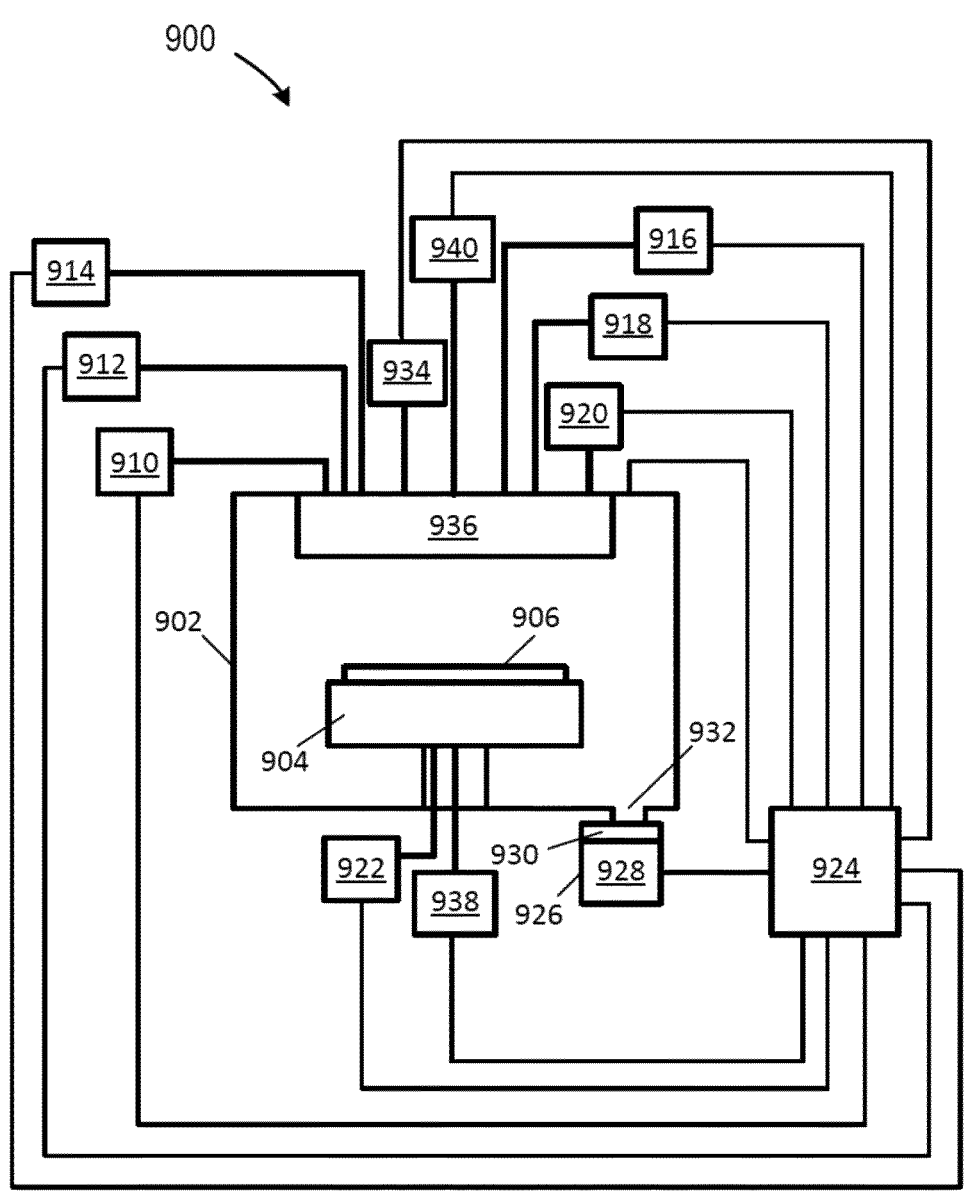
FIG. 9 illustrates an example processing system for a chemical vapor deposition (CVD), an atomic layer deposition (ALD), a plasma-enhanced CVD (PECVD), or a plasma-enhanced ALD (PEALD), a gas phase etch, or a plasma etch process, according to certain embodiments.

FIG. 9 illustrates an example processing system 900 for a CVD, an ALD, a PECVD, a plasma-enhanced ALD (PEALD), a gas phase etch, or a plasma etch process, according to certain embodiments. In the illustrated example, processing system 900 includes a process chamber

902 having a substrate holder 904 configured to support a substrate 906 (analogous to substrate 806 of FIG. 8) (e.g., upon which a layer stack 106/206 has been deposited).

Process chamber 902 may include an upper assembly 908 (e.g., a showerhead) coupled to a first precursor supply system 910 configured to supply one or more first precursor gases. A second precursor supply system 912 is configured for supplying a second precursor gas (e.g., alkenol, alcohol, diol, phenol, carboxylic acid, or combination thereof). Processing system 900 may include a purge gas supply system 914 and auxiliary gas supply systems 916, 918, and 920 (e.g., for supplying additional precursor gases to process chamber 902).

Processing system 900 includes a substrate temperature control system 922 coupled to substrate holder 904 and configured to control the temperature of substrate 906. Substrate temperature control system 922 contains temperature control elements, such as a cooling system including a re-circulating coolant flow that receives heat from substrate holder 904 and transfers heat to a heat exchanger system, or when heating, transfers heat from the heat exchanger system. Additionally, the temperature control elements can include heating/cooling elements, such as resistive heating elements, or thermo-electric heaters/coolers, that can be included in substrate holder 904, as well as the chamber wall of process chamber 902 and any other component within processing system 900. Substrate temperature control system 922 can be configured to, for example, control the substrate temperature from room temperature to approximately 350° C. to approximately 550° C. The temperature of substrate 906 may be selected based on the desired temperature for causing deposition of a particular layer on the surface of a given substrate 906.

Processing system 900 may include a controller 924 that can be coupled to process chamber 902; substrate holder 904; upper assembly 908 configured for introducing process gases into process chamber 902; precursor supply systems 910 and 912; purge gas supply system 914; auxiliary gas supply system 916, 918, and 920; and substrate temperature control system 922. Controller 924 may be coupled to one or more additional controllers/computers, and controller 924 can obtain setup and/or configuration information from an additional controller/computer.

In the illustrated example, although particular processing elements (902, 904, 908, 910, 912, 914, 916, 918, 920, and 922) are shown, processing system 900 may include any number of processing elements having any number of associated controllers. Controller 924 can be used to configure any number of processing elements, and can collect, provide, process, store, and display data from processing elements. Controller 924 can include a number of applications for controlling one or more of the processing elements. For example, controller 924 can include a graphic user interface (GUI) component that can provide easy-to-use interfaces that allow a user to monitor and/or control one or more processing elements.

Processing system 900 may be configured to process substrates 906 of any suitable size. Furthermore, a batch processing system implementation may be capable of processing multiple substrates 906 simultaneously.

In certain embodiments, various techniques may be used for introducing precursor gases to process chamber 902. One technique includes vaporizing precursors through the use of separate bubblers or direct liquid injection (DLI) systems, or a combination thereof, and then mixing in the gas phase within or prior to introduction into process chamber 902. Another technique includes separately controlling two or more different liquid sources (neat precursors or precursor solutions), which are then mixed prior to entering a common vaporizer. This technique may be used when the precursors are compatible in solution or in liquid form and have similar vaporization characteristics. Another technique includes controlling the flow of a liquid precursor mixture (neat precursors or precursor solutions) to a common vaporizer. Other techniques include using compatible mixed solid or liquid precursors within a bubbler. Liquid source precursors may include neat liquid precursors, or solid or liquid precursors that are dissolved in a compatible solvent. Possible compatible solvents include, but are not limited to, ionic liquids, hydrocarbons (aliphatic, olefins, and aromatic), amines, esters, glymes, crown ethers, ethers and polyethers. In certain embodiments, it may be possible to dissolve one or more compatible solid precursors in one or more compatible liquid precursors. By controlling relative concentration levels of the first and second precursors within a gas pulse, it is possible to deposit films with desired stoichiometries.

Purge gas supply system 914 may be configured to introduce a purge gas to process chamber 902. For example, a purge gas may be introduced between introduction of pulses of a first precursor and a second precursor gas to process chamber 902. The purge gas can contain an inert gas, such as a noble gas (i.e., He, Ne, Ar, Kr, Xe), nitrogen ($N_2$), or hydrogen ($H_2$).

To improve the thermal transfer between substrate 906 and substrate holder 904, substrate holder 904 may include a mechanical clamping system, or an electrical clamping system, such as an electrostatic clamping system, to affix substrate 906 to an upper surface of substrate holder 904. Substrate holder 904 may include a substrate backside gas delivery system to introduce gas to the back-side of substrate 906 to improve the gas-gap thermal conductance between substrate 906 and substrate holder 904. Such a system can be used when temperature control of substrate 906 is desired at elevated or reduced temperatures.

Process chamber 902 may be coupled to a pressure control system 926, including a vacuum pumping system 928 and a valve 930, through a duct 932. Pressure control system 926 may be configured to controllably evacuate process chamber 902 to a pressure suitable for forming a desired film on substrate 906, and suitable for use of the precursors. Vacuum pumping system 928 may include a turbo-molecular vacuum pump (TMP) or a cryogenic pump capable of a pumping speed up to about 5000 liters per second (and greater), and valve 930 may include a gate valve for throttling the chamber pressure. Moreover, a device for monitoring chamber pressure may be coupled to process chamber 902. As an example, pressure control system 926 may be configured to control the process chamber pressure between about 0.1 Torr and about 100 Torr during deposition of a film.

Precursor supply systems 910 and 912; purge gas supply system 914; and auxiliary gas supply system 916, 918, and 920 may include one or more pressure control devices, one or more flow control devices, one or more filters, one or more valves, and/or one or more flow sensors. The flow control devices may include pneumatic driven valves, electro-mechanical (solenoidal) valves, and/or high-rate pulsed gas injection valves. The gases may be sequentially and alternately pulsed into process chamber 902, where the length of each gas pulse can be between, for example, about 0.1 sec and about 100 sec (e.g., between about 1 sec and about 10 sec). Exemplary gas pulse lengths for precursor gases can be between 0.3 and 3 sec, for example 1 sec. Exemplary purge gas pulses can be between 1 and 20 sec, for example 3 sec.

Controller 924 may include a microprocessor, memory, and digital I/O port capable of generating control voltages sufficient to communicate and activate inputs to processing system 900 as well as monitor outputs from processing system 900. Moreover, controller 924 may be coupled to and may exchange information with process chamber 902; substrate holder 904; upper assembly 908; precursor supply systems 910 and 912; purge gas supply system 914; auxiliary gas supply systems 916, 918, and 920; substrate temperature control system 922; substrate temperature control system 922; and pressure control system 926. For example, a program stored in the memory may be utilized to activate the inputs to these components of processing system 900 according to a recipe to perform a deposition process.

Plasma processing system 900 further includes a plasma generation system configured to generate a plasma during at least a portion of the gas exposures in process chamber 902. The plasma generation system includes a first power source 934 coupled to process chamber 902, and configured to couple power to gases introduced into process chamber 902. First power source 934 may be a variable power source and may include a radio frequency (RF) generator and an impedance match network, and may include an electrode through which RF power is coupled to the plasma in process chamber 902. The electrode can be formed in an upper assembly 936, and can be configured to oppose substrate holder 904. The impedance match network can be configured to optimize the transfer of RF power from the RF generator to the plasma by matching the output impedance of the match network with the input impedance of process chamber 902, including the electrode, and plasma. For example, the impedance match network serves to improve the transfer of RF power to plasma in process chamber 902 by reducing the reflected power.

Alternatively, first power source 934 may include a RF generator and an impedance match network, and may further include an antenna, such as an inductive coil, through which RF power is coupled to plasma in process chamber 902. The antenna can, for example, include a helical or solenoidal coil, such as in an inductively coupled plasma source or helicon source, or it can, for example, include a flat coil as in a transformer coupled plasma source. Alternatively, first power source 934 may include a microwave frequency generator, and a microwave antenna and microwave window through which microwave power is coupled to plasma in process chamber 902. Electron cyclotron resonance (ECR) technology or surface wave plasma technology may be used to accomplish coupling of microwave power.

In certain embodiments, plasma processing system 900 includes a substrate bias generation system configured to generate or assist in generating a plasma (through substrate holder biasing) during at least a portion of the alternating introduction of the gases to process chamber 902. The substrate bias system can include a substrate power source 938 coupled to process chamber 902 and configured to couple power to substrate 906. Substrate power source 938 may include a RF generator and an impedance match network, and may further include an electrode (e.g., formed in substrate holder 904) through which RF power is coupled to substrate 906. For example, substrate holder 904 can be electrically biased at an RF voltage via transmission of RF power from an RF generator through an impedance match network to substrate holder 904. A typical frequency for the RF bias can range from about 0.1 MHz to about 100 MHz, and can be 13.56 MHz. Alternatively, RF power may be applied to the substrate holder electrode at multiple frequencies. Although the plasma generation system and the substrate bias system are illustrated in FIG. 9 as separate entities, they may include one or more power sources coupled to substrate holder 904.

In certain embodiments, plasma processing system 900 includes a remote plasma system 940 for providing and remotely plasma-exciting gases, prior to flowing the plasma-excited gas into process chamber 902 where it is exposed to substrate 906. Remote plasma system 940 may include a microwave frequency generator. The process chamber pressure can be between about 0.1 Torr and about 10 Torr, or between about 0.2 Torr and about 3 Torr.

Figure 10A:
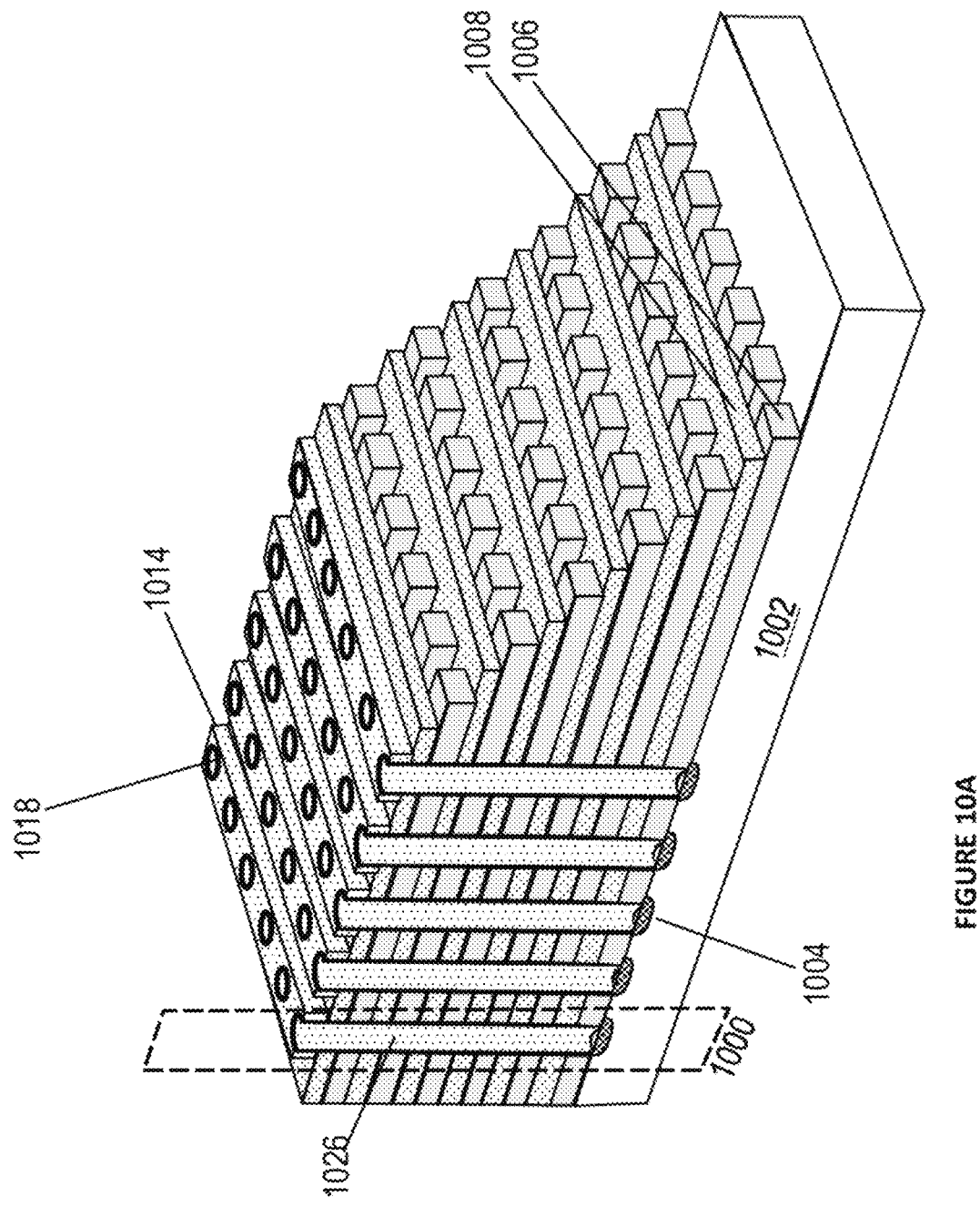
FIGS. 10A-10B illustrate example aspects of a 3D NAND memory array, according to certain embodiments.
Figure 10B:
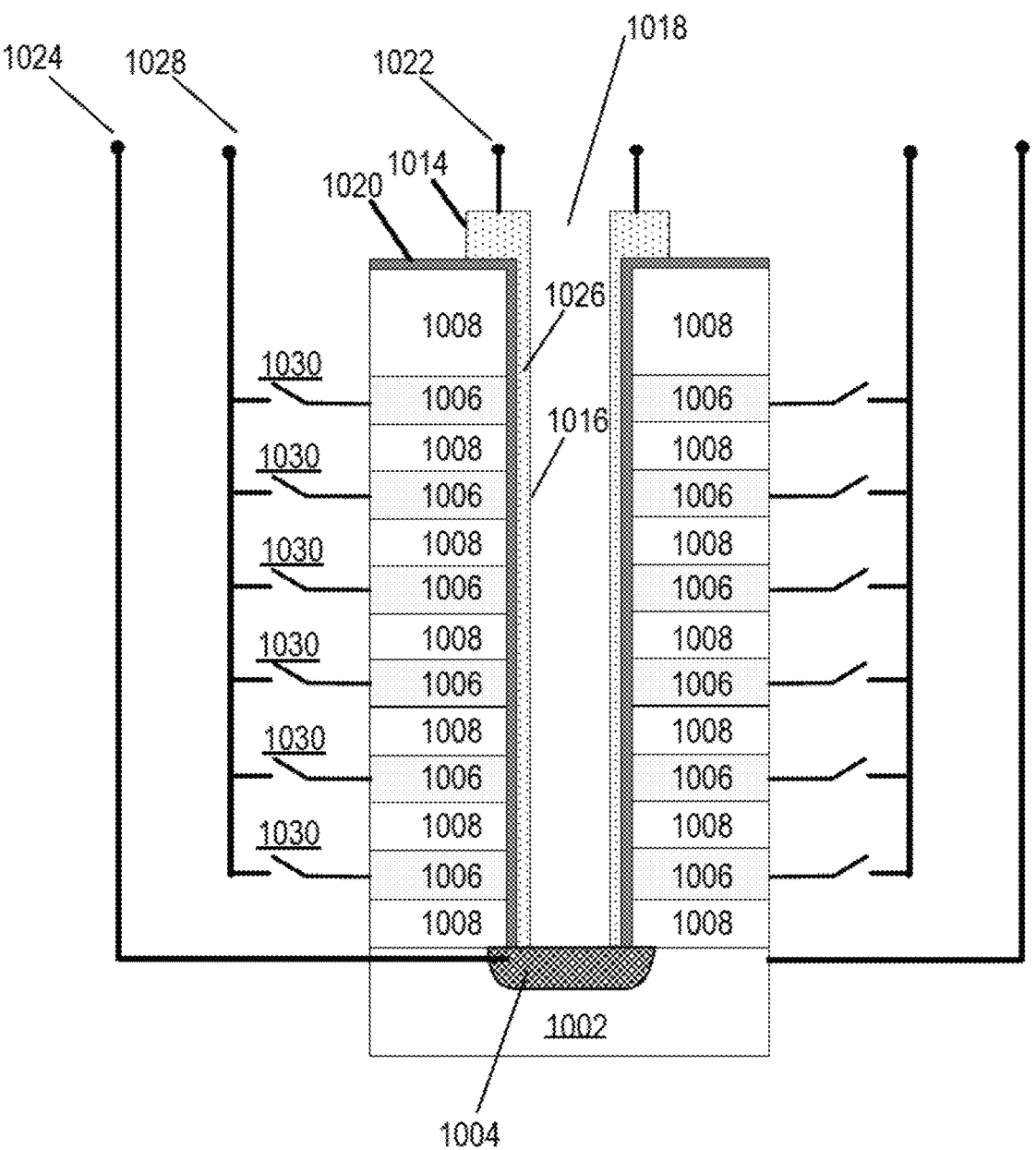

FIGS. 10A-10B illustrate example aspects of a 3D NAND memory array, according to certain embodiments. FIG. 10A illustrates a projection view of a cross-section through a 3D-NAND memory array formed according to certain embodiments. FIG. 10B illustrates a cross-sectional view through a stack (e.g., which could be layer stack 106 or 206 after processes 100 or 200, respectively) of memory transistors in a 3D-NAND memory array formed according to certain embodiments. In particular, FIG. 10B illustrates a cross sectional view of an example 3D NAND wordline stack (e.g., which could be layer stack 106 or 206 after processes 100 or 200, respectively) of alternating gates (wordlines) and insulating layers formed in accordance with certain embodiments.

FIG. 10A illustrates a semiconductor substrate 1002 with a common drain bitline 1004 formed therein. The cross section shows alternating layers of dielectric material 1008 that electrically isolate layers of wordlines 1006. Wordlines 1006 are the alternating metal gates of stacked memory transistors in the 3D NAND array. In certain embodiments, dielectric material 1008 corresponds to the remaining oxide or nitride material of the layer stacks formed from processes 100 or 200 described above. Wordlines 1006 may correspond to at least portions of material 136 (or what would be material 236 if process 200 were described beyond FIG. 2F) in the layer stacks formed from process 100 (or 200) described above.

Common source bitlines 1014 (e.g., potentially including polysilicon), cross the top surface of the 3D NAND memory array perpendicular to the wordlines 1006. The drain and source bitlines 1004 and 1014 are connected to thin transistor channels 1016 (shown in FIG. 10B), made of silicon for example, on the sidewalls of channels 1018, which may correspond to at least a portion of the channel materials that fill openings 118 or 218 described above (e.g., material 138 for process 100 or what would be material 238 if process 200 were described beyond FIG. 2F). The memory transistors in a layer of wordlines 1006 share the common source bitlines 1014 and common drain bitlines 1004.

The cross sectional view illustrated in FIG. 10B through a stack of nonvolatile transistors in a 3D NAND memory array is depicted by the dashed box 1000 in FIG. 10A.

Each transistor includes a gate (wordline 1006) that is isolated from the transistor channel 1016 by gate dielectric 1020. Gate dielectric 1020 may correspond to a portion of the channel materials described above. During programming, electrons can be trapped in gate dielectric 1020. The trapped electrons raise the turn ON voltage of the nonvolatile transistor. Transistors with electrons trapped in gate dielectric 1020 store logic state "1" whereas transistors without trapped electrons store logic state "0". These logic states are retained for 10 years or more even when the 3D NAND memory is not connected to a power supply. In certain embodiments, the transistors may be SONOS transistors. In other embodiments, the transistors may be TANOS transistors. Other types of transistors also are contemplated.

Multiple transistors are stacked one on top of another in the word line stack. The metal gate (wordline 1006) of one transistor is isolated from other nonvolatile transistors stacked above and below by layers of dielectric material 1008. The transistors of the stack share a common source terminal 1022 and also share a common drain terminal 1024. A thin layer of lightly doped silicon layer 1026, e.g., doped between $10^{14}$ cm$^{-3}$ to $10^{17}$ cm$^{-3}$, forms the channels 1016 for the stacked transistors in the 3D NAND memory array. The thin layer of lightly doped silicon layer 1026 may be in-situ doped with an n-type dopant to form an n-channel transistor. One end of the thin layer of lightly doped silicon layer 1026 is shorted to common source bitline 1014 that is while the opposite end of the thin layer of lightly doped silicon layer 1026 is shorted to common drain bitline 1004.

During operation a voltage can be applied to common drain bitline 1004 (drain terminal 1024) with common source bitline 1014 (source terminal 1022) held at ground. Voltage on a gate terminal 1028 can be connected to one of the gates (wordline 1006) by turning one of gate select transistors 1030 ON. If the transistor is programmed with a zero (no trapped electrons), channel 1016 will turn ON and additional current flows through the channel 1016 of the transistor. If, however, the transistor is programmed with a one (trapped electrons), channel 1016 will remain OFF and no additional current flows.

Embodiments of this disclosure may provide some, none, or all of the following technical advantages. Furthermore, these and other technical advantages may be readily apparent to one of ordinary skill in the art based on this description.

In certain embodiments, using spin-on layers and sacrificial layers to initially build a layer stack of alternating layers for a 3D semiconductor structure reduces stress on the semiconductor structure during formation of a layer stack. This reduction in stress may reduce or eliminate defects, such as bowing (so-called wafer bowing) or other defects, in the semiconductor structure. For example, the stress on the semiconductor structure may be measured using calipers or other tools to measure wafer bowing. In certain embodiments, relative to repeatedly performing a CVD deposition process to deposit each layer of a layer stack, depositing the layers of the layer stack as sacrificial layers using spin-on processing techniques and then replacing the sacrificial layers with the desired layers for the layer stack may reduce stress by half, by two-thirds, or more in the resulting semiconductor structure.

In certain embodiments, relative to repeatedly performing a CVD deposition process to deposit each layer of a layer stack, depositing the layers of the layer stack as sacrificial layers using spin-on processing techniques and then replacing the sacrificial layers with the desired layers for the layer stack may reduce costs, both in terms of processing time and expense. For example, repeatedly performing a CVD deposition process to deposit each layer of a layer stack may be both time consuming and expensive. In contrast, spin-on coating techniques are relatively fast and inexpensive. Furthermore, these sacrificial layers of the layer stack (the layers deposited by spin-coating), may be removed and replaced with the desired materials for the layer stack using potentially as few as one deposition step (per layer type of the layer stack), such as using an ALD or other CVD process.

In certain embodiments, forming a layer stack of alternating layers of carbon-containing materials may reduce or eliminate complexity in etching various openings in the layer stack for forming elements of a semiconductor structure. That is, forming a layer stack in which both layer types of the alternating layers of the layer stack are carbon-containing layers may allow openings, such as for forming channels and/or gates of a 3D semiconductor structure, to be etched using a relatively straightforward etch process.

As just one particular example, a first set of layers of the layer stack may be formed of a photoresist or DBARC material that includes an agent-generating ingredient (e.g., a TAG or PAG) for generating a solubility-changing agent (e.g., acid) in response to an activation trigger and that can modify a solubility of the first set of layers for development in a developer. A second set of layers can be a carbon-containing material, such as SOC, that is not soluble in the developer. This arrangement may allow both layers to be carbon-containing layers, providing an ability to more easily form openings in the layers, while still allowing the layers to be removed selectively for replacement with other layers. In certain embodiments, relative to a solution that may use carbon-containing layers (or even non-carbon-containing layers) for one type of layer in a layer stack and a non-carbon-containing layer (e.g., spin-on glass, or SOG) as another type of layer in the layer stack, processing time for forming openings in the layer stack may be reduced by up to a third or more.

Furthermore, relative to a solution that may use carbon-containing layers (or even non-carbon-containing layers) for one type of layer in a layer stack and a non-carbon-containing layer (e.g., spin-on glass, or SOG) as another type of layer in the layer stack, processing time for removing the first and second layers may be reduced. For example, removing the carbon-containing layers that are modified to be soluble in a developer may be faster relative to an etch process for removing a non-carbon-containing layer (e.g., SOG).

In certain embodiments, due to the relatively easier ability to etch a layer stack in which both types of alternating layers are carbon-containing layers, a thickness of a masking layer (e.g., a hardmask) for forming openings in the layer stack may be reduced, which may reduce processing time for depositing the masking layer, material usage/expense for depositing the masking layer, and stress on the layer stack (e.g., due to the thinner masking layer). If a layer stack includes layers (e.g., SOG layers) for which harsher and more time-consuming etch processes were used to form openings in the layer stack, then a masking layer may be thicker to withstand those etch processes.

Embodiments of this disclosure may be used to fabricate 3D semiconductor structures, such as 3D VNAND structures; however, 3D memory structures are just one example of 3D semiconductor structures that can take advantage of the techniques described herein. The techniques described herein can be used with other structures, including other 3D structures in addition to 3D memory cell structures that may include layer stacks.

Example embodiments of this disclosure are summarized here. Other embodiments can also be understood from the entirety of the specification as well as the claims filed herein.

Example 1. A method includes forming, on a substrate by spin-on deposition, a layer stack of alternating layers of first and second carbon-containing materials. The layers of the first carbon-containing material include an agent-generating ingredient for generating a solubility-changing agent in response to an activation trigger. The method includes executing the activation trigger in response to which the solubility-changing agent is generated from the agent-generating ingredient in the layers of the first carbon-containing material and modifies the layers of the first carbon-containing material to be soluble in a developer. The method includes etching first openings through the layer stack, filling the first openings with a third material, etching second openings through the layer stack, removing the layers of the first carbon-containing material from the layer stack by exposing those to the developer, and replacing the layers of the first carbon-containing material with a fourth material.

Example 2. The method of Example 1, where the agent-generating ingredient includes a thermal-acid generator, the solubility-changing agent includes acid, the activation trigger includes heat, and executing the activation trigger includes baking the substrate.

Example 3. The method of any one of Examples 1-2, where executing the activation trigger is performed subsequent to etching the second openings through the layer stack and prior to replacing the first carbon-containing material with the fourth material.

Example 4. The method of any one of Examples 1, where the agent-generating ingredient includes a photoacid generator, the solubility-changing agent includes acid, the activation trigger includes actinic radiation, and executing the activation trigger includes exposing the layers of the first carbon-containing material that includes the agent-generating ingredient to actinic radiation.

Example 5. The method of any one of Examples 1 and 4, where executing the activation trigger is performed subsequent to forming each layer of the first carbon-containing material such that each layer of the first carbon containing material is exposed to actinic radiation as the layer stack is formed.

Example 6. The method of any one of Examples 1-5, further including removing the layers of the second carbon-containing material from the layer stack and replacing the layers of the second carbon-containing material with a fifth material that is a metal-containing material.

Example 7. The method of any one of Examples 1-6, further including removing the third material from the first openings and replacing, after replacing the layers of the first carbon-containing material with the fourth material, the third material with a sixth material.

Example 8. The method of any one of Examples 1-7, where the third material includes a metal oxide material and the sixth material includes one or more of silicon dioxide, silicon nitride, and polysilicon.

Example 9. The method of any one of Examples 1-8, where the fourth material includes an oxide material or a nitride material.

Example 10. The method of any one of Examples 1-9, wherein: the first carbon-containing material includes SOC, SiOC, ODL, OPL, organic SOH, SiOCN, SiC, photoresist, BARC, or DBARC; and the second carbon-containing material includes SOC, SiOC, ODL, OPL, organic SOH, SiOCN, SiC, photoresist, BARC, or epoxy.

Example 11. A method for fabricating a 3D NAND device includes forming, on a substrate, a layer stack of alternating first layers of a first carbon-containing material and second layers of a second carbon-containing material. The first layers and the second layers are deposited by spin-on deposition. The first layers include a photoresist material or a developable anti-reflective coating, and include an agent-generating ingredient for generating a solubility-changing agent in response to an activation trigger. The method includes executing the activation trigger, the solubility-changing agent being generated from the agent-generating ingredient in the first layers in response to the activation trigger, the solubility-changing agent modifying the first layers to be soluble in a developer. The method includes etching channel holes through the layer stack, filling the channel holes with a third material, and etching slits through the layer stack, the slits exposing the alternating first layers and second layers of the layer stack. The method includes removing the first layers from the layer stack by exposing the first layers to the developer and replacing the first layers with a fourth material that includes an oxide or a nitride. The method includes removing the second layers from the layer stack by exposing the second layers to an etch chemistry and replacing the second layers with a fifth material that is a metal-containing material.

Example 12. The method of Example 11, further including executing, during forming the layer stack, one or more second bakes of the substrate to cause a cross-linking reaction to occur in the first carbon-containing material and the second carbon-containing material.

Example 13. The method of any one of Examples 11-12, where the first bake is executed at a temperature of 180° C. to 200° C. and the one or more second bakes are executed at a temperature of 140° C. to 150° C.

Example 14. The method of any one of Examples 11-13, where etching the first openings through the layer stack includes etching the first openings using an oxygen etch process and etching the second openings through the layer stack includes etching the second openings using an oxygen etch process.

Example 15. The method of any one of Examples 11-14, where the fourth material includes a metal-containing material.

Example 16. A method for fabricating a 3D NAND device includes forming, on a substrate, a layer stack of alternating first layers of a first carbon-containing material and second layers of a second carbon-containing material. The first layers and the second layers are deposited by spin-on deposition. The first layers include a photoresist material or a developable anti-reflective coating, and include an agent-generating ingredient for generating a solubility-changing agent in response to an activation trigger. The method includes executing the activation trigger, the solubility-changing agent being generated from the agent-generating ingredient in the first layers in response to the activation trigger, the solubility-changing agent modifying the first layers to be soluble in a developer. The method includes etching channel holes through the layer stack, filling the channel holes with a third material, and etching slits through the layer stack, the slits exposing the alternating first layers and second layers of the layer stack. The method includes removing the first layers from the layer stack by exposing the first layers to the developer and replacing the first layers with a fourth material that includes an oxide or a nitride. The method includes removing the second layers from the layer stack by exposing the second layers to an etch chemistry and replacing the second layers with a fifth material that is a metal-containing material.

Example 17. The method of Example 16, where the agent-generating ingredient includes a thermal-acid generator, the solubility-changing agent includes acid, the activation trigger includes heat, executing the activation trigger is performed prior to etching the first openings through the layer stack, and executing the activation trigger includes baking the substrate.

Example 18. The method of Example 16, where the agent-generating ingredient includes a photoacid generator, the solubility-changing agent includes acid, the activation trigger includes actinic radiation, executing the activation trigger is performed subsequent to forming each first layer of the first carbon-containing material such that each first layer of the first carbon containing material is exposed to actinic radiation as the layer stack is formed, and executing the activation trigger includes exposing the first layers that include the agent-generating ingredient to actinic radiation.

Example 19. The method of any one of Examples 16-18, where removing the second layers from the layer stack by exposing the second layers to an etch chemistry includes removing the second layers from the layer stack using a wet etching process.

Example 20. The method of any one of Examples 16-19, where the third material includes a metal oxide material and the method includes, after replacing the second layers with the fifth material, removing the third material from the channel holes and replacing the third material with a sixth material that includes one or more of silicon dioxide, silicon nitride, and polysilicon.

It should be understood that the particular materials, etch processes, and deposition processes described herein are provided as examples only. The particular spin-on materials and combinations of spin-on materials used for the layer stacks described herein are provided as examples only. Additionally, the particular content of the final layer stack (with the sacrificial spun-on materials replaced with the target content of the layer stacks) described herein are provided as examples only. Additionally, the particular fill materials used as intermediate sacrificial materials (e.g., as fill materials for channel openings or within open areas of the layer stack at intermediate stages) described herein are provided as examples only. The particular materials, deposition processes (and associated process conditions), and etch processes (and associated process conditions) may be determined based on process integration goals, etch selectivity, the desired content of the layer stack (and possibly the channel holes, where applicable) in the semiconductor structure being formed, and other factors.

One or more deposition processes can be used to form the material layers described herein. For example, one or more depositions can be implemented using spin-coating, CVD, PECVD, PVD, ALD, and/or other deposition processes. The type of deposition process used, the chosen chemicals/gases used for that deposition process, and the process conditions used for that deposition process may be chosen to achieve a desired deposition material and rate for the materials being deposited, or according to other applicable factors.

Similarly, the etch processes can be implemented using wet etch processes, plasma etch processes, discharge etch processes, and/or other desired etch processes. The type of etch process used, the chosen chemicals/gases used for that etch process, and the process conditions used for that etch process may be chosen to achieve a desired etch rate and selectivity for the material(s) being etched relative to materials not being etched, or according to other applicable factors.

Reference throughout this specification to "one embodiment," "an embodiment," "certain embodiments," or the like means that a particular feature, structure, material, or characteristic described in connection with the embodiment is included in at least one embodiment of this disclosure, but do not denote that they are present in every embodiment. Thus, the appearances of the phrases "in one embodiment," "in an embodiment," "in certain embodiments," or the like in various places throughout this specification are not necessarily referring to the same embodiment of this disclosure. Furthermore, the particular features, structures, materials, or characteristics may be combined in any suitable manner in one or more embodiments. Various additional layers and/or structures may be included and/or described features may be omitted in other embodiments. It should be understood that references to "first," "second," "third," and the like in the specification do not necessarily correspond to uses of such terms in the claims, as uses in the claims may depend on the order of introduction.

"Substrate," "target substrate," "structure," or "device" as used herein generically refers to an object being processed in accordance with the invention, and may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate, structure, or device is not limited to any particular base structure, underlying layer or overlying layer, patterned or un-patterned, but rather, is contemplated to include any such layer or base structure, and any combination of layers and/or base structures. The description may reference particular types of substrates, structures, or devices, but this is for illustrative purposes only.

Systems and methods for fabricating a semiconductor structure are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of this disclosure. Similarly, for purposes of explanation, specific numbers, materials, and configurations are set forth in order to provide a thorough understanding of this disclosure. Nevertheless, this disclosure may be practiced without specific details. Furthermore, it is understood that the various embodiments shown in the figures are illustrative representations and are not necessarily drawn to scale.

Although this disclosure describes particular process/method steps as occurring in a particular order, this disclosure contemplates the process steps occurring in any suitable order. Further modifications and alternative embodiments of the described systems and methods will be apparent to those skilled in the art in view of this description. It will be recognized, therefore, that the described systems and methods are not limited by these example arrangements. Thus, although aspects of this disclosure are described with reference to specific embodiments, various modifications and changes can be made without departing from the scope of this disclosure. Accordingly, the specification and figures are to be regarded in an illustrative rather than a restrictive sense, and such modifications are intended to be included within the scope of this disclosure. Further, any benefits, advantages, or solutions to problems that are described herein with regard to specific embodiments are not intended to be construed as a critical, required, or essential feature or element of any or all the claims.

What is claimed is:

1. A method, comprising:

forming, on a substrate by spin-on deposition, a layer stack of alternating layers of a first carbon-containing material and a second carbon-containing material, the layers of the first carbon-containing material comprising an agent-generating ingredient for generating a solubility-changing agent in response to an activation trigger;

executing the activation trigger, the solubility-changing agent being generated from the agent-generating ingredient in the layers of the first carbon-containing material in response to the activation trigger, the solubility-changing agent modifying the layers of the first carbon-containing material to be soluble in a developer;

etching first openings through the layer stack;

filling the first openings with a third material;

etching second openings through the layer stack;

removing the layers of the first carbon-containing material from the layer stack by exposing the layers of the first carbon-containing material to the developer;

replacing the layers of the first carbon-containing material with a fourth material;

removing the layers of the second carbon-containing material from the layer stack; and replacing the layers of the second carbon-containing material with a fifth material.

2. The method of claim 1, wherein:

the agent-generating ingredient comprises a thermal-acid generator;

the solubility-changing agent comprises acid;

the activation trigger comprises heat; and executing the activation trigger comprises baking the substrate.

3. The method of claim 2, wherein executing the activation trigger is performed subsequent to etching the second openings through the layer stack and prior to replacing the first carbon-containing material with the fourth material.

4. The method of claim 1, wherein:

the agent-generating ingredient comprises a photoacid generator;

the solubility-changing agent comprises acid;

the activation trigger comprises actinic radiation; and executing the activation trigger comprises exposing the layers of the first carbon-containing material comprising the agent-generating ingredient to actinic radiation.

5. The method of claim 4, wherein executing the activation trigger is performed subsequent to forming each layer of the first carbon-containing material such that each layer of the first carbon-containing material is exposed to actinic radiation as the layer stack is formed.

6. The method of claim 1, wherein the fifth material is a metal-containing material.

7. The method of claim 1, further comprising:

removing the third material from the first openings; and replacing, after replacing the layers of the first carbon-containing material with the fourth material, the third material with a sixth material.

8. The method of claim 7, wherein:

the third material comprises a metal oxide material; and the sixth material comprises one or more of silicon dioxide, silicon nitride, and polysilicon.

9. The method of claim 1, wherein the fourth material comprises:

an oxide material; or a nitride material.

10. The method of claim 1, wherein:

the first carbon-containing material comprises spin-on-carbon (SOC), silicon oxycarbide (SiOC), organic dielectric layer (ODL), organic planarization layer (OPL), organic spin-on hardmask (SOH), silicon oxycarbonitride (SiOCN), silicon carbide (SiC), photoresist, bottom anti-reflective coating (BARC), or developable BARC (DBARC); and the second carbon-containing material comprises SOC, SiOC, ODL, OPL, organic SOH, SiOCN, SiC, photoresist, BARC, or epoxy.

11. A method, comprising:

forming, on a substrate, a layer stack of alternating first layers of a first carbon-containing material and second layers of a second carbon-containing material, the first layers and the second layers deposited by spin-on deposition, the first layers comprising:

a photoresist material or a developable anti-reflective coating; and a thermal acid generator (TAG);

executing a first bake of the substrate, the first bake causing the TAG to generate acid in the first layers, the acid modifying the first layers to be soluble in a developer;

etching first openings through the layer stack;

filling the first openings with a first fill material that comprises a metal oxide material;

etching second openings through the layer stack;

exposing the first layers to the developer to remove the first layers from the layer stack;

replacing the first layers with a third material, the third material being an oxide or a nitride;

removing the second layers from the layer stack;

replacing the second layers with a fourth material;

removing the first fill material from the first openings; and replacing the first fill material in the first openings with a second fill material that comprises one or more of silicon dioxide, silicon nitride, and polysilicon.

12. The method of claim 11, further comprising executing, during forming the layer stack, one or more second bakes of the substrate to cause a crosslinking reaction to occur in the first carbon-containing material and the second carbon-containing material.

13. The method of claim 12, wherein:

the first bake is executed at a temperature of 180° C. to 200° C.; and the one or more second bakes are executed at a temperature of 140° C. to 150° C.

14. The method of claim 11, wherein:

etching the first openings through the layer stack comprises etching the first openings using an oxygen etch process; and etching the second openings through the layer stack comprises etching the second openings using an oxygen etch process.

15. The method of claim 11, wherein the fourth material comprises a metal-containing material.

16. A method for fabricating a three-dimensional (3D) NAND device, comprising:

forming, on a substrate, a layer stack of alternating first layers of a first carbon-containing material and second layers of a second carbon-containing material, the first layers and the second layers deposited by spin-on deposition, the first layers comprising:

a photoresist material or a developable anti-reflective coating; and an agent-generating ingredient for generating a solubility-changing agent in response to an activation trigger;

executing the activation trigger, the solubility-changing agent being generated from the agent-generating ingredient in the first layers in response to the activation trigger, the solubility-changing agent modifying the first layers to be soluble in a developer;

etching channel holes through the layer stack;

filling the channel holes with a third material;

etching slits through the layer stack, the slits exposing the alternating first layers and second layers of the layer stack;

removing the first layers from the layer stack by exposing the first layers to the developer;

replacing the first layers with a fourth material, the fourth material being an insulating material, the insulating material comprising an oxide or a nitride;

removing the second layers from the layer stack by exposing the second layers to an etch chemistry; and replacing the second layers with a fifth material, the fifth material being a metal-containing material.

17. The method of claim 16, wherein:

the agent-generating ingredient comprises a thermal-acid generator;

the solubility-changing agent comprises acid;

the activation trigger comprises heat;

executing the activation trigger is performed prior to etching the channel holes through the layer stack; and executing the activation trigger comprises baking the substrate.

18. The method of claim 16, wherein:

the agent-generating ingredient comprises a photoacid generator;

the solubility-changing agent comprises acid;

the activation trigger comprises actinic radiation;

executing the activation trigger is performed subsequent to forming each first layer of the first carbon-containing material such that each first layer of the first carbon-containing material is exposed to actinic radiation as the layer stack is formed; and executing the activation trigger comprises exposing the first layers comprising the agent-generating ingredient to actinic radiation.

19. The method of claim 16, wherein removing the second layers from the layer stack by exposing the second layers to an etch chemistry comprises removing the second layers from the layer stack using a wet etching process.

20. The method of claim 16, wherein:

the third material comprises a metal oxide material; and the method comprises, after replacing the second layers with the fifth material, removing the third material from the channel holes and replacing the third material with a sixth material, the sixth material comprising one or more of silicon dioxide, silicon nitride, and polysilicon.

* * * * *